US007734990B2

(12) United States Patent
Maru

(10) Patent No.: US 7,734,990 B2
(45) Date of Patent: Jun. 8, 2010

(54) SPATIAL-MULTIPLEXED SIGNAL DETECTION METHOD AND SPATIAL AND TEMPORAL ITERATIVE DECODER THAT USES THIS METHOD

(75) Inventor: Tsuguo Maru, Minato-ku (JP)

(73) Assignee: NEC Corporation, Tokyo (JP)

( * ) Notice: Subject to any disclaimer, the term of this patent is extended or adjusted under 35 U.S.C. 154(b) by 847 days.

(21) Appl. No.: 11/569,674

(22) PCT Filed: May 25, 2005

(86) PCT No.: PCT/JP2005/009514

§ 371 (c)(1),
(2), (4) Date: Nov. 27, 2006

(87) PCT Pub. No.: WO2005/117273

PCT Pub. Date: Dec. 8, 2005

(65) Prior Publication Data

US 2007/0229329 A1    Oct. 4, 2007

(30) Foreign Application Priority Data

May 26, 2004    (JP) ............................. 2004-155538

(51) Int. Cl.
*H03M 13/00* (2006.01)

(52) U.S. Cl. ..................................... 714/780

(58) Field of Classification Search ................. 714/780, 714/786, 794, 800; 375/262, 265, 341
See application file for complete search history.

(56) References Cited

U.S. PATENT DOCUMENTS 6,161,209 A * 12/2000 Moher ......................... 714/780

(Continued)

FOREIGN PATENT DOCUMENTS

JP    2001-320282 A    11/2001

(Continued)

OTHER PUBLICATIONS

Zhang et al., Adaptive iterative SISO parallel decision feedback detectors for asynchronous coded DS-CDMA systems, Apr. 2005, EURASIP Journal on wireless communication and networking, pp. 155 to 162.*

(Continued)

*Primary Examiner*—Shelly A Chase
(74) *Attorney, Agent, or Firm*—Sughrue Mion, PLLC

(57) ABSTRACT

The present invention is directed to providing a spatial-multiplexed signal detection method that can improve the characteristics of spatial and temporal iterative decoding that is based on turbo principles. According to the method, when implementing factorization of conditional probability referred to as "likelihood" such that the conditional probability can be represented by the product of a plurality of conditional probabilities, the conditional probability being obtained for a received signal sequence in a spatial and temporal iterative decoding configuration based on turbo principles of soft-input soft-output detector 1 and soft-input soft-output decoder 2, the conditional probability for which factorization is possible is divided into a plurality of groups. When calculating this likelihood, the ordering among groups in which probabilities are calculated can be ordered such that groups that contain events that serve as the conditions of conditional probabilities in the groups are processed earlier. When calculating the probabilities in the groups, a metric operation method is used that uses semi-rings for estimating transmission sequences by means of the ratio of likelihoods of two exclusive events.

18 Claims, 12 Drawing Sheets

U.S. PATENT DOCUMENTS

| | | | |
|---|---|---|---|
| 6,862,316 B2 * | 3/2005 | Tomisato et al. | 375/232 |
| 6,891,897 B1 * | 5/2005 | Bevan et al. | 375/265 |
| 7,154,936 B2 * | 12/2006 | Bjerke et al. | 375/148 |

FOREIGN PATENT DOCUMENTS

| | | |
|---|---|---|
| JP | 2002-506316 A | 2/2002 |
| JP | 2002-247011 A | 8/2002 |
| JP | 2003-241103 A | 8/2003 |
| JP | 2003-273837 A | 9/2003 |

OTHER PUBLICATIONS

Choi et al., adaptive filtering based iterative channel estimation for MIMO woreless communications, 2005, IEEE, p. 4951 to 4954.*

Hiroyuki Seki et al., "OFCDM MIMO Taju ni Okeru Symbol Replica Koho Sakugengata QR Bunkai-MLD ni Tekishita Nanhantei Turbo Fukugo no Yudo Joho Seiseiho", The Institute of Electrics, Information and Communication Engineers Gijutsu Hokoku MoMuC2003-104, Mar. 2004, pp. 67 to 72.

Takumi Ito et al., "OFCDM MIMO Taju ni Okeru Symbol Replica Koho Sakugengata QR Bunkai- MLD no Throughput Oyobi Enzan Shoriryo no Hikaku Hyoka", Thye Institute of Electronics, Information and Communication Engineers Gijutsu Hokoku MoMuC 2003-103, Mar. 2004, pp. 61 to 66.

Tuguo Maru, A Turbo Decoder for High Speed Downlink Packet Access, Vehicular Technology Conference, 2003. VTC 2003-Fall. 2003 IEEE 58$^{th}$ vol. 1 Oct. 6, 2003, pp. 332 to 336.

R.E. Shaw et al., A Parallel QR Factorization Algorithm for Solving Toeplitz Tridiagonal Systems, Parallel and Distribution Processing Symposium, 2004, Proceedings. 18$^{th}$ International, Apr. 26, 2004.

Gerald J. Foschini Layered Space-Time Architecture for Wireless Communication in a Fading Environment When Using Multi-Element Antennas, Bell Labs Technical Journal, Autumn 1996, pp. 41 to 59.

Emre Telatar "Capacity of Multi-antenna Gaussian Channels" Lucent Technologies Bell Laboratories, vol. 10, No. 6, Nov.-Dec. 1999, pp. 585 to 595.

* cited by examiner

Fig. 2

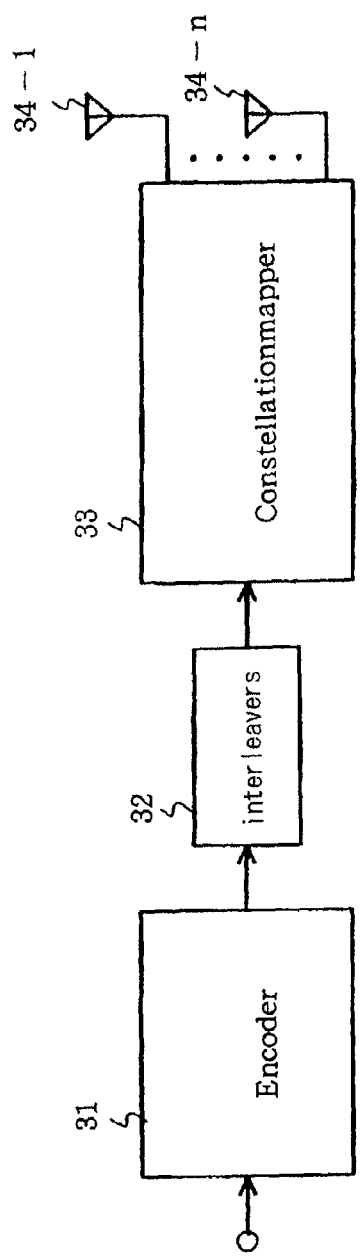

Fig. 3

$$Z = \begin{bmatrix} Z_1 \\ Z_2 \\ \vdots \\ Z_m \\ \vdots \\ Z_{n_T} \end{bmatrix} = \begin{bmatrix} r_{11} & r_{12} & \cdots & r_{1m} & \cdots & r_{1n_T} \\ 0 & r_{22} & \cdots & r_{2m} & \cdots & r_{2n_T} \\ \vdots & \vdots & & \vdots & & \vdots \\ 0 & 0 & \cdots & r_{mm} & \cdots & r_{mn_T} \\ \vdots & \vdots & & \vdots & & \vdots \\ 0 & 0 & \cdots & 0 & \cdots & r_{n_Tn_T} \end{bmatrix} \cdot \begin{bmatrix} x_1 \\ x_2 \\ \vdots \\ x_m \\ \vdots \\ x_{n_T} \end{bmatrix} + \begin{bmatrix} \hat{n}_1 \\ \hat{n}_2 \\ \vdots \\ \hat{n}_m \\ \vdots \\ \hat{n}_{n_T} \end{bmatrix} = R \cdot X + \hat{N}$$

Fig. 4

$$Z = \begin{bmatrix} Z_1 \\ Z_2 \\ Z_3 \\ \vdots \\ Z_m \\ \vdots \\ Z_{n_T-2} \\ Z_{n_T-1} \\ Z_{n_T} \end{bmatrix} = \begin{bmatrix} a_{11} & a_{12} & 0 & \cdots & 0 & \cdots & 0 & 0 & 0 \\ a_{21} & a_{22} & a_{23} & & & & & & \\ 0 & a_{32} & a_{33} & & & & & & \\ & 0 & & a_{43} & & & & & \\ \vdots & & & & a_{m-1,m} & & & & \\ & & & & a_{mm} & & & & \\ 0 & 0 & 0 & & a_{m+1,m} & & & 0 & \\ & & & & & & a_{n_T-3,n_T-2} & & 0 \\ \vdots & & \vdots & & \vdots & & a_{n_T-2,n_T-2} & a_{n_T-2,n_T-1} & 0 \\ & & & & & & a_{n_T-1,n_T-2} & a_{n_T-1,n_T-1} & a_{n_T-1,n_T} \\ 0 & 0 & 0 & \cdots & 0 & \cdots & 0 & a_{n_T,n_T-1} & a_{n_T,n_T} \end{bmatrix} \cdot \begin{bmatrix} x_1 \\ x_2 \\ x_3 \\ \vdots \\ x_m \\ \vdots \\ x_{n_T-2} \\ x_{n_T-1} \\ x_{n_T} \end{bmatrix} + \begin{bmatrix} \hat{n}_1 \\ \hat{n}_2 \\ \hat{n}_3 \\ \vdots \\ \hat{n}_m \\ \vdots \\ \hat{n}_{n_T-2} \\ \hat{n}_{n_T-1} \\ \hat{n}_{n_T} \end{bmatrix} = A \cdot X + \hat{N}$$

Fig. 5

$$Z = \begin{bmatrix} Z_1 \\ Z_2 \\ Z_3 \\ \vdots \\ Z_m \\ \vdots \\ Z_{n_T-2} \\ Z_{n_T-1} \\ Z_{n_T} \end{bmatrix} = \begin{bmatrix} a_{11} & a_{12} & a_{13} & & a_{1,m} & \cdots & a_{1,n_T-2} & a_{1,n_T-1} & a_{1,n_T} \\ a_{21} & a_{22} & a_{23} & & \vdots & & a_{2,n_T-2} & a_{2,n_T-1} & a_{2,n_T} \\ a_{31} & a_{32} & a_{33} & & \vdots & & a_{3,n_T-2} & a_{3,n_T-1} & a_{3,n_T} \\ 0 & 0 & 0 & & a_{m-1,m} & & & & \\ \vdots & & & & a_{mm} & & & & \\ 0 & 0 & 0 & & a_{m+1,m} & & & & \\ & & & & 0 & & a_{n_T-2,n_T-2} & a_{n_T-2,n_T-1} & a_{n_T-2,n_T} \\ \vdots & & \vdots & & \vdots & & a_{n_T-1,n_T-2} & a_{n_T-1,n_T-1} & a_{n_T-1,n_T} \\ 0 & 0 & 0 & \cdots & 0 & \cdots & a_{n_T,n_T-2} & a_{n_T,n_T-1} & a_{n_T,n_T} \end{bmatrix} \cdot \begin{bmatrix} x_1 \\ x_2 \\ x_3 \\ \vdots \\ x_m \\ \vdots \\ x_{n_T-2} \\ x_{n_T-1} \\ x_{n_T} \end{bmatrix} + \begin{bmatrix} \hat{n}_1 \\ \hat{n}_2 \\ \hat{n}_3 \\ \vdots \\ \hat{n}_m \\ \vdots \\ \hat{n}_{n_T-2} \\ \hat{n}_{n_T-1} \\ \hat{n}_{n_T} \end{bmatrix} = A \cdot X + \hat{N}$$

Fig. 6

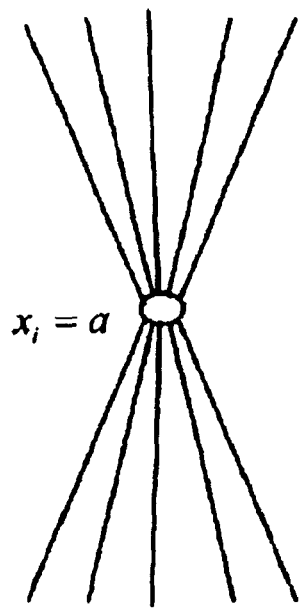

Marginalization

Fig. 7

$$Z = \begin{bmatrix} Z_1 \\ Z_n \\ \vdots \\ Z_m \\ \vdots \\ Z_{n_T} \end{bmatrix} = \begin{bmatrix} r_{11} & r_{12} & \cdots & r_{1m} & \cdots & r_{1n_T} \\ 0 & r_{n2} & \cdots & r_{nm} & \cdots & r_{nn_T} \\ \vdots & \vdots & & \vdots & & \vdots \\ 0 & 0 & \cdots & r_{mm} & \cdots & r_{mn_T} \\ \vdots & \vdots & & \vdots & & \vdots \\ 0 & 0 & \cdots & 0 & \cdots & r_{n_T n_T} \end{bmatrix} \cdot \begin{bmatrix} x_1 \\ x_n \\ \vdots \\ x_m \\ \vdots \\ x_{n_T} \end{bmatrix} + \begin{bmatrix} \hat{n}_1 \\ \hat{n}_n \\ \vdots \\ \hat{n}_m \\ \vdots \\ \hat{n}_{n_T} \end{bmatrix} = R \cdot X + \hat{N}$$

Fig. 8

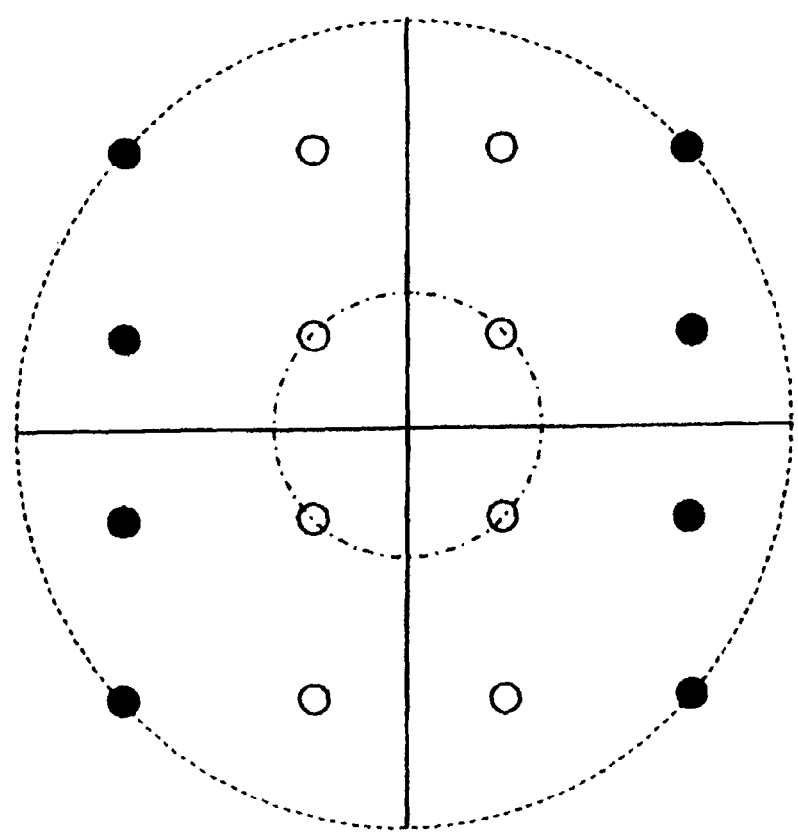

the final maximum number of samples is
$\begin{cases} \text{Number of sample} \\ n_T \cdot 2 \cdot \log_2|\mathscr{A}| - n_T + 1; \\ \text{where; } n_T = 4, 16QAM; |\mathscr{A}| = 16 \\ 4 \cdot 2 \cdot \log_2 16 - 4 + 1 = 29 \end{cases}$ due to degeneracy, the number of samples is a number less than in the above the final maximum number of samples is $\begin{cases} \text{Number of sample} \\ n_T \cdot 2 \cdot \log_2|\mathscr{A}| - n_T + 2; \\ \text{where}; n_T = 4, 16QAM; |\mathscr{A}| = 16 \\ 4 \cdot 2 \cdot \log_2 16 - 4 + 2 = 30 \end{cases}$ due to degeneracy, the number of samples is a number less than in the above calculation process of LLR for information sequence calculation process of LLR for parity sequence

SPATIAL-MULTIPLEXED SIGNAL DETECTION METHOD AND SPATIAL AND TEMPORAL ITERATIVE DECODER THAT USES THIS METHOD

This application claims priority from PCT Application No. PCT/JP2005/009514 filed May 25, 2005, and from Japanese Patent Application No. 2004-155538 filed May 26, 2004, which applications are incorporated herein by reference.

TECHNICAL FIELD

The present invention relates to a spatial-multiplexed signal detection method and to a spatial and temporal iterative decoder that uses such a method, and more particularly to a spatial-multiplexed signal detection method in mobile communication and to a spatial and temporal iterative decoder that uses an iterative sequential process.

BACKGROUND ART

Radio waves arriving from a transmitting antenna on radio wave propagation paths in mobile communication are reflected and scattered by the surrounding geographical features and arrive at the receiver as the assemblage of a group of element waves. As a result, the phenomenon of fading produced as a result of these factors has always been an obstacle to achieving mobile communication with high quality. The control of the degraded radio wave propagation environment resulting from this fading has been the long-standing goal of researchers in the field of mobile communication, and a wide variety of measures have been put to practical use.

In recent years, there is an active trend toward viewing the phenomenon of fading not as an enemy, but rather as an environmental resource with a hidden potential inherent in radio wave propagation in mobile communication (for example, refer to Non-Patent Documents 1 and 2).

There has further been an active move in recent years for using the dependence on spatial position in fading fluctuation referred to as Multi-USER Diversity to utilize environmental resources inherent in radio wave propagation paths, and this can also be considered a similar trend.

The above-mentioned Non-Patent Documents 1 and 2 disclose a space transmission process called BLAST (Bell Labs Layered Spatial and Temporal) for effectively utilizing signals that have undergone space-multiplex processing as a means of applying the inherent propagation resources. A means referred to as V-BLAST has been disclosed in which linear filtering and an interference canceller are combined as the architecture for realizing the space multiplex separation of this BLAST with a low level of complexity.

ZF (Zero-Forcing) standards for suppressing (nulling) the interference component or a minimum mean square error (MMSE) standard are typically used as the linear filtering.

An MP (Moore-Penrose) typical inverse matrix is known as a linear transformation for realizing nulling according to the ZF standard, and in order to improve the characteristics of the interference canceller, an ordering process is carried out by simplified estimation for realizing detection in the order of higher SNR (Signal-to-Noise Ratio) after detection. As an operation for carrying out this ordering of symbols, one known method involves the preferential use of column vectors having the smallest norm corresponding to weighting vectors of the MP typical inverse matrix.

Alternatively, a method by means of QR decomposition provides a still lower level of complexity. More specifically, QR decomposition of communication path matrix H yields $H = Q \cdot R$, following which the relation:

$$Q^H \cdot Y = R \cdot X + Q^H \cdot v$$

is realized between the transmitting antenna signal vector of the $n_T$ dimension:

$$X \in C^{n_T \times 1}$$

and the receiving antenna signal vector of the $n_R$ dimension:

$$Y \in C^{n_R \times 1}$$

In this case:

$$Q \in C^{n_R \times n_R}$$

is a unitary matrix;

$$R \in C^{n_R \times n_T}$$

is an upper triangular matrix; and noise component vector:

$$v \in C^{n_R \times 1}$$

is subjected to unitary transformation, whereby transformation is realized while maintaining the separation between signals without intensifying noise.

A step process can be realized by which vectors in a matrix can be reordered to allow processing in the order of higher SNR in the QR decomposition process for detecting in an order in which the SNR has been maximized. This type of method corresponds to a nulling process by means of the ZF standard and assumes that the number $n_R$ of receiving antennas is the same as or greater than the number of transmitting antennas $n_T$.

However, the defect of these methods is that $n_T-1$-order null generation is carried out in linear processing by nulling in the initial step, whereby the diversity gain can only obtain the order of:

$$n_R - n_T + 1.$$

Accordingly, detection errors tend to occur in the initial step, and the effect of these errors results in the occurrence of the propagation of error that causes detection errors in later stages.

However, optimized detection calls for MLD (Maximum Likelihood Decoding) in the equation:

$$X_{MLD} = \arg \min_{X \in |A|^{n_T}} \| Y - H \cdot X \|^2$$

As a result, the number of antennas and the size A of the modulated signal points:

$$A = |A|$$

produces an exponential increase in the level of complexity, and when encoding is taken into consideration, MLD becomes impossible in actuality.

Methods based on the turbo principle are therefore being investigated as methods of lowered complexity. The above-described equation is the MLD for only a detector, and the application of a decoding method known as "SD (Sphere Decoding)" is being proposed for the purpose of avoiding this degree of complexity and obtaining diversity gain in the degradation of characteristics caused by the propagation of errors from an initial stage to later stages in the above-described V-BLAST, in other words, in a fading environment.

As the basic concept of SD, a likelihood calculation is carried out for signal points that are contained in a sphere of appropriate radius r that centers on the received signal points, whereby MLD is carried out within a limited range, and as a result, efficiency is determined by the method of selecting radius r. Alternatively, a method also exists in which a degree of complexity is avoided by limiting the number of signal points according to the size of likelihood.

Non-Patent Document 1: "Layered spatial and temporal architecture for wireless communications in a fading environment when using multiple antennas" (1996, Bell Labs Technical Journal, Volume 6, Number 2, pp. 41-59).

Non-Patent Document 2: "Capacity of multi-antenna Gaussian channels" (November/December 1999, European Transactions on Telecommunication, pp. 585-595)

DISCLOSURE OF THE INVENTION

Problem to be Solved by the Invention

In order to realize system throughput in a new-generation mobile communication system, high-performance signal separation must be realized with high performance, and moreover, with a low degree of complexity in spatial and temporal signal multiplexing, which is a measure for enlarging the communication path capacity.

In the above-described V-BLAST, however, the error propagation inherent to the method itself, while capable of realization at a low level of complexity, also leads to the degradation of characteristics. On the other hand, MLD, i.e., Maximum Likelihood Decoding, which is optimal detection, while capable of realizing a higher level of performance, also entails a higher level of complexity, and therefore cannot be adopted.

In SD, i.e., sphere decoding, the degree of complexity varies according to the number of signal points within radius r, and SD is therefore not suitable for realization as a device. Alternatively, even if the number of signal points to be taken as objects is limited by likelihood, realizing a high level of performance entails an increase in the degree of complexity, and the exchange of likelihood with decoders that follow in later stages is not considered. In the end, optimal reception must be considered that includes codes such as turbo code or LDPC (Low Density Parity Check).

Because performance is determined by the decoder output, likelihood information that is transferred to the turbo decoder or LDPC must be information that is accurate according to Log Likelihood Algebra, and maximum likelihood decoding that takes encoding into consideration is realized with a low level of complexity by performing spatial and temporal iterative decoding by means of this likelihood information and extrinsic information of a soft-input soft-output decoder. However, the problem exists that a configuration was not realized in which accurate likelihood information for this purpose could be realized.

Achieving necessary system throughput necessitates increasing the number of antennas. Based on the foregoing explanation, the degree of complexity increases as the number of antennas increases, and it is therefore desirable to suppress this increase, but this increase is difficult to suppress in the method of the prior art.

When the combining of a soft-input soft-output spatial multiplexing signal detector for realizing spatial multiplexing signal separation and a soft-input soft-output decoder such as a turbo decoder or LDPC is realized by means of iterative decoding based on turbo principles, extrinsic information is exchanged between the detector and decoder.

However, in the method carried out in the prior art, due to the difficulty of extracting extrinsic information in a soft-input soft-output decoder that corresponds to the decoder for outside code, either information that still contains intrinsic information was used as the extrinsic information, or only a portion of extrinsic information was used. The problem therefore occurred that improvement of characteristics through a number of iterations based on turbo principles was saturated by the number of repetitions.

When an already manufactured soft-input soft-output decoder is used, logarithmic likelihood ratios are generally supplied as output for information bit sequences, and log likelihood ratios for code words (symbol strings) are generally not supplied.

However, a soft-input soft-output detector functions as much as possible as MLD detection for code words, and extrinsic information from the soft-input soft-output decoder to the soft-input soft-output detector must correspond to code words. The problem therefore occurs that the location of operations upon the transition probability propagation on a trellis in the soft-input soft-output decoder changes, resulting in the unavoidable alteration of already fabricated core blocks.

It is therefore an object of the present invention to provide a space-multiplexed signal detection method that can solve the above-described problems and improve the characteristics of spatial and temporal iterative decoding based on turbo principles, and further, to provide a spatial and temporal iterative decoder that uses this method.

Means for Solving the Problem

In a spatial-multiplexed signal detection method according to the present invention, in a soft-input soft-output detection method in spatial and temporal multiplexed signal separation, a process (factorization) is included for factorization of conditional probability referred to as "likelihood" that is obtained for a signal sequence that is received when a spatial-multiplexed transmission sequence is assumed to have been transmitted such that the conditional probability can be represented as the product of a plurality of conditional probabilities; the conditional probabilities for which factorization is possible are divided into a plurality of groups; when calculating the likelihoods, an order can be established among the groups for which probabilities are calculated such that the groups that include events that are the conditions of the conditional probabilities in the groups are processed earlier; and when calculating probabilities in the groups, a metric operation method is used that uses semi-rings for estimating transmission sequences by means of the ratio of the likelihoods of two exclusive events.

In another spatial-multiplexed signal detection method according to the present invention, in a soft-input soft-output detection method in spatial and temporal multiplexed signal separation, a process (factorization) is included for the factorization of a conditional probability referred to as "likelihood" that is obtained for a signal sequence that is received when a spatial-multiplexed transmission sequence is assumed to have been transmitted such that the conditional probability can be represented as the product of a plurality of conditional probabilities; the conditional probabilities for which factorization is possible are divided into a plurality of groups; when calculating the likelihoods, an order can be established among the groups for which probabilities are calculated such that the groups that include events that are the conditions of the conditional probabilities in the groups are processed earlier; when calculating conditional probabilities in each group: either a transmission sequence that indicates the maximum conditional probability in the group that contains an event that is the condition of the conditional probability in its own group is calculated as the condition of the conditional probability, or a plurality of calculations are carried out of a plurality of events (transmission sequence) as conditions that are estimated in advance by a simplified estimation; and a process is included for calculating, based on a transmission sequence that indicates the maximum conditional probability of the preceding stage, the conditional probability in each group in accordance with the order among the groups;

wherein the bit likelihood of the transmission sequence, which is the soft determination output, is calculated using semi-rings according to claim 6 using processes of:

(1) in groups in which bits that are targets exist as targets of estimation: detecting, in metric base, target bits and the maximum probability events up to the preceding stage, or a plurality of conditional probabilities that take as conditions the plurality of events (transmission sequence) that have been estimated in advance by simplified estimation; and detecting, in a metric base, exclusive events for the target bits and the maximum probability events up to the preceding stage, or a plurality of conditional probabilities that take as conditions the plurality of events (transmission sequence) that have been estimated in advance by simplified estimation;

(2) in groups of succeeding stages: detecting, in metric base, the maximum probability events of the preceding stage that contains target bits or the plurality of conditional probabilities that take as conditions the plurality of events (transmission sequence) that have been estimated in advance by simplified estimation; and detecting, in metric base, the maximum probability event of the preceding stage that contains exclusive events for the target bits, or the plurality of conditional probabilities that take as conditions the plurality of events (transmission sequence) that have been estimated in advance by simplified estimation;

(3) similarly, in groups in stages that follow groups in which bits exist that are targets: detecting, in metric base, the maximum probability events up to the preceding stage, or the plurality of conditional probabilities that take as conditions the plurality of events (transmission sequence) that have been estimated in advance by simplified estimation; and detecting, in metric base, the maximum probability events of (1) that contain exclusive events for target bits, or the plurality of events (transmission sequence) that have been estimated in advance by simplified estimation and the maximum probability events up the preceding stage that are detected together with this plurality of events, or the plurality of maximum conditional probabilities that take as conditions the plurality of events (transmission sequence) that have been estimated in advance by simplified estimation;

(4) repeating (3) until the groups of the succeeding final stage; and (5) after completing (4), subjecting to metric-base subtraction: target bits and the maximum probability events up to the preceding stage in said (1); or the plurality of conditional probabilities that take as conditions the plurality of events (transmission sequence) that have been estimated in advance by simplified estimation, the exclusive events for the target bits, and the maximum probability events up to the preceding stage; or the plurality of conditional probabilities that take as conditions the plurality of events (transmission sequence) that have been estimated in advance by simplified estimation; in groups of stages following groups in which bits exist that are the targets of (2) to (4), subjecting to metric-base subtraction: the maximum probability events up to the preceding stage; or the plurality of conditional probabilities that take as conditions the plurality of events (transmission sequence) that have been estimated in advance by simplified estimation and the maximum probability events up to the preceding stage that contains exclusive events for the target bits, or the plurality of conditional probabilities that take as conditions the plurality of events (transmission sequence) that have been estimated in advance by simplified estimation; and taking the sum totals of these subtractions, detecting the logarithmic likelihood ratio of the target bits as the logarithmic likelihood ratio that is the soft determination output of the target bits.

In another spatial-multiplexed signal detection method according to the present invention, in a soft-input soft-output detection method in spatial and temporal multiplexed signal separation, a process (factorization) is included for implementing factorization of conditional probability referred to as "likelihood" that is obtained for a signal sequence that is received when a spatial-multiplexed transmission sequence is assumed to have been transmitted such that the conditional probability can be represented as the product of a plurality of conditional probabilities; the conditional probabilities for which factorization is possible are divided into a plurality of groups; when calculating the likelihoods, an order can be established among the groups for which probabilities are calculated such that the groups that include events that are the conditions of the conditional probabilities in the groups are processed earlier; when calculating conditional probability in each group, a process is included for calculating, as the condition of the conditional probability, a transmission sequence that indicates the maximum conditional probability in the group that contains an event that is the condition of the conditional probability in its own group, and for calculating, based on a transmission sequence that indicates the maximum conditional probability of the preceding stage, the conditional probability in each group in accordance with the ordering among the groups; and a metric operation method is used that uses semi-rings for estimating a transmission sequence that maximizes the likelihood;

and further, as resampling after completion of processing in the final stage, processes are included for selecting the metric-base maximum likelihood from a set of combinations of the conditional probabilities in which bits that are targets have been calculated as targets of estimation, and moreover, selecting the metric-base maximum likelihood from the set of combinations of the conditional probabilities in which exclusive events for the target bits have been calculated as the targets of estimation; and a process is included for taking the difference between the two metrics as the soft determination output of the target bits.

A spatial and temporal iterative decoder in spatial and temporal multiplexed signal separation according to the present invention includes a soft-input soft-output detector and a soft-input soft-output decoder; wherein the soft-input soft-output decoder: supplies as output logarithmic likelihood ratios (hereinbelow abbreviated as "LLR") for information bit sequences before encoding, includes a soft-input soft-output encoder that takes these logarithmic likelihood ratios as input and supplies as output logarithmic likelihood ratios for code word sequences after encoding, and produces a priori input of the soft-input soft-output detector based on the output of the soft-input soft-output encoder.

Another spatial and temporal iterative decoder according to the present invention includes, in spatial and temporal multiplexed signal separation, a soft-input soft-output detector and a soft-input soft-output decoder; wherein the soft-input soft-output decoder: supplies as output logarithmic likelihood ratios (hereinbelow abbreviated as "LLR") for an information bit sequence before encoding, includes a soft-input soft-output encoder that takes these logarithmic likelihood ratios as input and supplies as output logarithmic likelihood ratios for codeword sequences after encoding, and produces soft replica input of the soft-input soft-output detector based on the output of the soft-input soft-output encoder.

Another spatial and temporal iterative decoder in spatial and temporal multiplexed signal separation according to the present invention includes a soft-input soft-output detector and a soft-input soft-output decoder; wherein the soft-input soft-output detector is a spatial-multiplexed detector that uses semi-rings in the Max-log domain of claim 6, carries out weighting of the logarithmic likelihood ratios that correspond to the soft output of the soft-input soft-output detector, and uses the result as a priori input of the next stage.

In other words, the spatial-multiplexed signal detection method of the present invention was realized in view of the above-described problems, and, by using a metric operation method that uses semi-rings in the estimation of transmission sequences that maximizes likelihood in a soft-input soft-output detector in spatial-multiplexed signal separation, realizes higher performance that approaches MLD (Maximum Likelihood Decoding), i.e., optimum detection, with a lower degree of complexity.

In addition, in the spatial-multiplexed signal detection method of the present invention, the likelihood information that is transferred to a soft-input soft-output decoder such as a turbo decoder or LDPC (Low-Density Parity Check) of a later stage that follows the detector is accurate information that accords with log likelihood algebra, whereby intrinsic decoder performance can be obtained without degradation of the error rate characteristic of the decoder output, which in the end is the performance.

In addition, in the spatial-multiplexed signal detection method of the present invention, the metric operation method that uses semi-rings that are used for estimating transmission sequences that maximize likelihood uses semi-rings in the Max-log region, whereby the soft determination output of the target bits can be represented as the sum total of: among groups of the conditional probability that has been divided into a plurality of groups, the metric-base difference of the maximum conditional probability events of the preceding stage or the maximum conditional probabilities that contain target bits for a plurality of events (transmission sequence) that have been estimated in advance by simplified estimation and maximum conditional probabilities that contain exclusive events for the target bits; and the difference of maximum conditional probabilities that follow; whereby the degree of complexity can be suppressed even when the number of antennas is increased to cope with the required system throughput.

In the spatial-multiplexed signal detection method of the present invention, despite the adoption of a spatial and temporal iterative decoding configuration based on the turbo principles of the soft-input soft-output detector and soft-input soft-output decoder, the accurate extraction of extrinsic information in the soft-input soft-output decoder prevents the improvement in characteristics resulting from the number of iterations based on turbo principles from being saturated by the number of iterations.

In addition, in the spatial-multiplexed signal detection method of the present invention, even when using an already manufactured soft-input soft-output decoder that does not hold, as soft output, logarithmic likelihood ratios for code words (symbol sequence), the configuration is such that extrinsic information can be generated that corresponds to code words and that is to be supplied as a priori to the soft-input soft-output detector of the preceding stage.

In other words, the spatial-multiplexed signal detection method according to the present invention is a soft-input soft-output detection method in spatial and temporal multiplexed signal separation, and includes a means (factorization) for implementing factorization of conditional probability referred to as "likelihood" that is obtained for a signal sequence that is received when a spatial-multiplexed transmission sequence is assumed to have been transmitted such that the conditional probability can be represented as the product of a plurality of conditional probabilities; divides the conditional probabilities for which factorization is possible into a plurality of groups; when calculating the likelihoods, can establish an order among the groups for which probabilities are calculated such that groups that include events that are the conditions of conditional probabilities in the groups are processed earlier; and uses a metric operation method that, when calculating probabilities in the groups, uses semi-rings for estimating transmission sequences by means of the ratio of the likelihoods of two exclusive events.

In addition, the spatial-multiplexed signal detection method of the present invention includes a simplified estimation means (ordering) for implementing a simplified estimation of the conditional probabilities of groups that contain events that are the conditions of the conditional probability of each group in the means (factorization) for factorization that allows representation as the product of the above-described plurality of conditional probabilities and in the means for dividing the conditional probabilities for which factorization is possible into a plurality of groups, and by means of the simplified estimation means, implements division of the ordering among the groups to enable processing in the order of higher conditional probabilities that are estimated by simplified estimation.

In the spatial-multiplexed signal detection method of the present invention, QR decomposition is used as the means (factorization) for implementing factorization that allows representation as the product of the above-described plurality of conditional probabilities.

Alternatively, in the spatial-multiplexed signal detection method of the present invention, block triangularization factorization is used as the means (factorization) for implementing factorization that allows representation as the product of the above-described plurality of conditional probabilities.

Alternatively, in the spatial-multiplexed signal detection method of the present invention, a tridiagonal method is used as the means (factorization) for implementing factorization that allows representation as the product of the above-described plurality of conditional probabilities.

On the other hand, in the spatial-multiplexed signal detection method of the present invention, the metric operation method that uses semi-rings and that is used for estimating transmission sequences by means of the ratio of the likelihoods of the above-described two exclusive events is carried out as a maximum value operation (MAX) of sums and normal addition of products, as follows:

$$a \oplus b = \max\{a, b\}$$

$$a \otimes b = a + b$$

In addition, in the spatial-multiplexed signal detection method of the present invention, the metric operation method that uses semi-rings and that is used for estimating a transmission sequence by means of the ratio of the likelihoods of the above-described two exclusive events is carried out as an operation based on Jacobian logarithm of sums and the normal addition of products, as follows:

$$\begin{cases} a \oplus b \equiv \ln(e^a + e^b) \\ a \otimes b \equiv a + b \end{cases}$$

where:

$$\begin{cases} a \oplus b \equiv \ln(e^a + e^b) = \max\{a, b\} + \ln(1 + e^{-|a-b|}) \\ \qquad\qquad\qquad\qquad = \max\{a, b\} + f(|a - b|) \end{cases}$$

In the spatial-multiplexed signal detection method of the present invention, in a soft-input soft-output detection method in spatial and temporal multiplexed signal separation, a means (factorization) is included for implementing factorization of conditional probability referred to as "likelihood" that is obtained for a signal sequence that is received when a spatial-multiplexed transmission sequence is assumed to have been transmitted such that the conditional probability can be represented as the product of a plurality of conditional probabilities;

a means is included:

for dividing the conditional probabilities for which factorization is possible into a plurality of groups;

that, when calculating likelihoods, can establish an order among the groups for which probabilities are calculated such that groups that include events that are the conditions of the conditional probabilities in the groups are processed earlier;

that, when calculating conditional probabilities in each group, either calculates, as the condition of the conditional probability, an event (transmission sequence) that indicates the maximum conditional probability in the group that contains an event that is the condition of the conditional probability in that its own group, or carries out a plurality of calculations of a plurality of events (transmission sequence) as conditions, the plurality of events having been estimated in advance by simplified estimation; and that calculates the conditional probability in each group in accordance with the ordering among the groups;

and a means is further included for using the above-described semi-rings that realize a maximum value operation (MAX) of sums and the normal addition of products to calculate the bit likelihood of the transmission sequence, which is the soft determination output, using:

(1) in groups in which bits that are targets exist as targets of estimation, both a means for detecting, in metric base, target bits and the maximum probability event up to the preceding stage, or a plurality of conditional probabilities that take as conditions the plurality of events (transmission sequence) that have been estimated in advance by simplified estimation; and a means for detecting, in metric base, exclusive events for the target bits and the maximum probability event up to the preceding stage, or a plurality of conditional probabilities that take as conditions the plurality of events (transmission sequence) that have been estimated in advance by simplified estimation (groups in which there are bits that are targets);

(2) in groups of succeeding stages, both a means for detecting, in metric base, either the maximum probability event of the preceding stage that contains target bits or the plurality of conditional probabilities that take as conditions the plurality of events (transmission sequence) that have been estimated in advance by simplified estimation; and a means for detecting, in metric base, the maximum probability event of the preceding stage that contains exclusive events for the target bits, or the plurality of conditional probabilities that take as conditions the plurality of events (transmission sequence) that have been estimated in advance by simplified estimation (group of succeeding stages);

(3) similarly, in groups in stages that follow groups in which bits that are targets exist, both a means for detecting, in metric base, either the maximum probability event up to the preceding stage, or the plurality of conditional probabilities that take as conditions the plurality of events (transmission sequence) that have been estimated by simplified estimation in advance; and a means for detecting, in metric base, the maximum probability event of (1) that contains exclusive events for target bits and the maximum probability event up to the preceding stage that is detected together with this maximum probability event of (1), or the plurality of maximum conditional probabilities that take as conditions the plurality of events (transmission sequence) that have been estimated in advance by simplified estimation;

(4) means for repeating (3) until the group of the succeeding final stage; and (5) means for: after completing (4), subjecting to metric-base subtraction: in (1), target bits and the maximum probability event up to the preceding stage, or the plurality of conditional probabilities that take as conditions the plurality of events (transmission sequence) that have been estimated in advance by simplified estimation; and exclusive events for the target bits and the maximum probability events up to the preceding stage, or the plurality of conditional probabilities that take as conditions the plurality of events (transmission sequence) that have been estimated in advance by simplified estimation; and in groups of stages following groups in which bits exist that are the targets of (2) to (4), subjecting to metric-base subtraction: the maximum conditional probabilities that take as conditions the maximum probability events up to the preceding stage and the maximum probability events up to the preceding stage that includes exclusive events for the target bits, or the plurality of conditional probabilities that take as conditions the plurality of events (transmission sequence) that have been estimated in advance by simplified estimation; and using each of these sum totals, detecting the logarithmic likelihood ratio of the target bits as the logarithmic likelihood ratios that are the soft determination output of the target bits.

In the spatial-multiplexed signal detection method of the present invention, in a soft-input soft-output detection method in spatial and temporal multiplexed signal separation, a means (factorization) is included for implementing factorization of conditional probability referred to as "likelihood" that is obtained for a signal sequence that is received when a spatial-multiplexed transmission sequence is assumed to have been transmitted such that the conditional probability can be represented as the product of a plurality of conditional probabilities;

a means is included:

for dividing the conditional probabilities for which factorization is possible into a plurality of groups;

that, when calculating the likelihoods, can establish an ordering among the groups for which probabilities are calculated such that groups that include events that are the conditions of the conditional probabilities in the groups are processed earlier;

that, when calculating conditional probabilities in each group, calculates, as the conditions of the conditional probabilities, events (transmission sequence) that indicate the maximum conditional probabilities in groups that contain events that are the conditions of the conditional probabilities in that its own group; and that calculates the conditional probability in each group in accordance with the ordering among groups based on events (transmission sequence) that indicate the maximum conditional probability of the preceding stage;

a means is included that uses a metric operation method that uses semi-rings for estimating the transmission sequence that maximizes likelihood, a means is included for selecting, as the resampling after completion of processing in the final stage, the maximum likelihood in metric base from the set of combinations of conditional probabilities that have been calculated with bits that are targets as the targets of estimation;

a means is included for selecting the maximum likelihood in metric base from the set of combinations of conditional probabilities that have been calculated with the exclusive events for the target bits as the targets of estimation; and a means is included for using the difference between the two metrics as the soft determination output of the target bits.

The spatial and temporal iterative decoder of the present invention includes a soft-input soft-output detector and a soft-input soft-output decoder in spatial and temporal multiplexed signal separation, wherein the soft-input soft-output decoder: supplies as output logarithmic likelihood ratios (LLR) for information bit sequences before encoding, includes a soft-input soft-output encoder that takes the logarithmic likelihood ratios as input and supplies as output logarithmic likelihood ratios for code word sequences after encoding, and creates a priori input of the soft-input soft-output detector based on the output of the soft-input soft-output encoder.

The spatial and temporal iterative decoder of the present invention, in a spatial and temporal multiplexed signal separation device that is of a configuration composed of a spatial and temporal detection unit and decoding unit, the spatial and temporal detection unit being of a configuration that includes a soft-input soft-output detector and a soft-input soft-output encoder and the decoding unit includes a soft-input soft-output decoder; and is of a configuration in which the a priori input to the soft-input soft-output decoder acts upon the output of the soft-input soft-output encoder in the form of subtraction to form the a priori input to the soft-input soft-output detector, and the a priori input to the soft-input soft-output detection unit acts upon the output of the soft-input soft-output detector in the form of subtraction to form the a priori input to the soft-input soft-output decoder.

The spatial and temporal iterative decoder of the present invention, in spatial and temporal multiplexed signal separation, includes a soft-input soft-output detector and a soft-input soft-output decoder, and is of a configuration in which the soft-input soft-output decoder supplies as output LLR for information bit sequences before encoding, includes a soft-input soft-output encoder that takes the logarithmic likelihood ratio as input and supplies as output logarithmic likelihood ratios for code word sequences after encoding, and produces soft replica input of the soft-input soft-output detector based on the output of the soft-input soft-output encoder.

The spatial and temporal iterative decoder of the present invention is a device in which the above-described soft-input soft-output encoder is of a configuration identical to that of the transmission-side encoder for handling soft determination data, and is of a configuration for supplying as output the LLR that holds in a posterior value the addition result [=a1+a2 (mod q)] that takes as modulo q for logarithmic likelihood ratio LLR1 for posterior value a1 and logarithmic likelihood ratio LLR2 for posterior value a2 in place of the addition that takes as modulo q, which is a constituent element.

The spatial and temporal iterative decoder of the present invention is a device in which the above-described soft-input soft-output encoder is of a configuration identical to that of the transmission-side encoder for handling soft determination data, and takes the form of a means for supplying as output, in place of addition that takes as modulo the constituent element 2, which is a constituent element:

$$LLR = 2 \cdot \tanh^{-1}\left[\tanh\left(\frac{LLR_1}{2}\right) \cdot \tanh\left(\frac{LLR_2}{2}\right)\right]$$

for logarithmic likelihood ratio $LLR_1$ for posterior value $a_1$ and logarithmic likelihood ratio $LLR_2$ for posterior value $a_2$, or takes the form of a means for supplying as output a value that approximates this value.

The spatial and temporal iterative decoder of the present invention is a device: in which the above-described soft-input soft-output encoder is of a configuration identical to that of the transmission-side encoder for handling soft determination data;

that includes means for carrying out, instead of addition that takes as modulo 2, which is a constituent element, a comparison of logarithmic likelihood ratio $LLR_1$ for posterior value $a_1$ and logarithmic likelihood ratio $LLR_2$ for posterior value $a_2$ with the absolute values of these values, and selecting the smaller value;

and that carries out the polarization of the result of this selection based on the result of addition that takes as modulo 2 for the MSB (Most Significant Bits) of logarithmic likelihood ratio $LLR_1$ and logarithmic likelihood ratio $LLR_2$.

The spatial and temporal iterative decoder of the present invention, in spatial and temporal multiplexed signal separation, includes a soft-input soft-output detector and a soft-input soft-output decoder; the soft-input soft-output detector is a spatial-multiplexed detector that uses semi-rings in the above-described Max-log domain and is of a configuration for carrying out weighting of the logarithmic likelihood ratio that corresponds to the soft output of this detector and using the result as a priori input for the succeeding stage.

In the spatial and temporal iterative decoder of the present invention, as 0.75 is used as the above-described weighting.

In the spatial and temporal iterative decoder of the present invention, the above-described weighting is realized by shift addition of 0.75.

As described hereinabove, by using a metric operation that uses semi-rings in the estimation of a transmission sequence by maximizing the likelihood of soft-input soft-output detection for spatial-multiplexed signal separation in a spatial and temporal iterative decoding method and a spatial-multiplexed signal detection method, the present invention provides a method that features not only performance that approaches MLD, which is optimal detection, but also a low degree of complexity, and further provides a method that enables the transfer of accurate likelihood information such that degradation of characteristics is not brought about in a soft-input soft-output decoder such as a turbo decoder or LDPC in a succeeding stage.

In addition, the present invention applies a maximum value operation for sums by a metric operation that employs semi-rings and applies semi-rings that realize products as normal addition and is thus able to represent the soft determination output of detected target bits as the sum total of: the metric-base difference of maximum conditional probabilities that contain target bits in a plurality of groups that have been divided and the maximum conditional probabilities that contain the exclusive events of these target bits, and the metric-base differences between similar maximum conditional probabilities in subsequent stages. As a result, the present invention is capable of coping with processing in groups that have been added by only a least minimal limited number of the maximum conditional probabilities even when the number of antennas has been increased to cope with required throughput and the number of processing stages consequently increased, and as a result, the present invention provides a method that can cope with processing resulting from the increase in the number of antennas while suppressing an increase in the degree of complexity.

In the spatial and temporal iterative decoder of the present invention, the ability to independently exchange a priori information between a soft-input soft-output detector and soft-input soft-output decoder facilitates the extraction of extrinsic information in the soft-input soft-output decoder, and the present invention thus circumvents the use of extrinsic information that still contains intrinsic information or the use of only a portion of extrinsic information that was compelled in the prior art by the difficulty of extracting extrinsic information. As a result, a spatial and temporal iterative decoder can be provided that is free of the degradation that occurs when the improvement in characteristics obtained by the number of iterations based on turbo principles is saturated by the number of iterations.

In addition, the spatial and temporal iterative decoder of the present invention is further capable of, from the outside, converting the logarithmic likelihood ratio for an information bit sequence, which is the output of an already produced soft-input soft-output decoder, to LLR for codewords (symbol sequence), and the present invention can therefore provide a spatial and temporal iterative decoder that can be realized without performing internal alterations of already produced core blocks.

Effect of the Present Invention

The present invention obtains the effect of enabling an improvement in the characteristics of a spatial and temporal iterative decoding based on turbo principles by means of the configuration and operation described hereinbelow.

BRIEF DESCRIPTION OF THE DRAWINGS

FIG. 2 is a block diagram showing the configuration of the transmission-side device according to the first working example of the present invention;

FIG. 3 shows an example of the group division means (factorization) used in QR decomposition according to the fifth working example of the present invention;

FIG. 4 shows an example of the group division means (factorization) that uses tridiagonal matrices factorization according to the sixth working example of the present invention;

FIG. 5 shows an example of the group division means (factorization) that uses block triangularization factorization according to the seventh working example of the present invention;

FIG. 6 is an image of the marginalization process in the Bayesian statistics;

FIG. 7 shows an example when group division is made the same as the division of the product of conditional probabilities;

FIG. 8 is an explanatory view of signal points on an external circle or signal points on an internal circle in 16 QAM;

| Explanation of Reference Numbers | |
|---|---|
| 1, 5, 7 | soft-input soft-output detectors |
| 2, 6, 8 | soft-input soft-output decoders |
| 3, 53, 55 | de-interleavers |
| 4, 32, 59 | interleavers |
| 11-1-11-n, 34-1-34-n, 51-1-51-n, 71-1-71-n | antennas |
| 12 | detector |
| 13, 14 | converters |
| 21 | decoder |
| 31 | encoder |
| 33 | constellation mapper |
| 52 | spatial and temporal detector |
| 54, 58 | subtractors |
| 56 | adder |
| 57, 73 | soft-input soft-output encoders |
| 61, 81 | soft-input soft-output decoders |
| 62, 82 | determiners |
| 72 | spatial-multiplexed signal detector |
| 74 | soft replica generator |
| 721 | interference canceller |
| 722 | linear filtering |

BEST MODE FOR CARRYING OUT THE INVENTION

Figure 1:
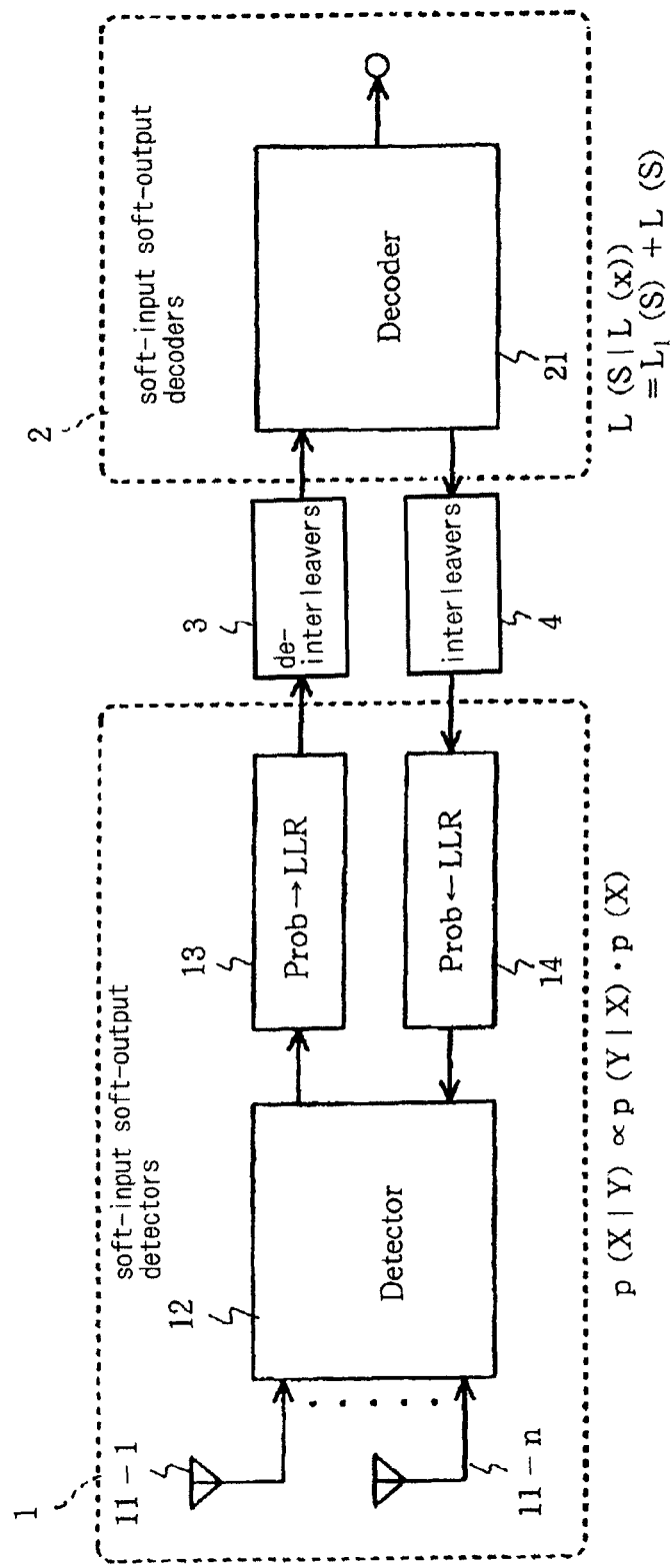
FIG. 1 is a block diagram showing the configuration of the spatial and temporal multiplexed signal separation device according to the first working example of the present invention.

Explanation next regards working examples of the present invention with reference to the accompanying figures. FIG. 1 is a block diagram showing the configuration of a spatial and temporal multiplexed signal separation device according to the first working example of the present invention. In FIG. 1, the spatial and temporal multiplexed signal separation device according to the first working example of the present invention is composed of soft-input soft-output detector 1, soft-input soft-output decoder 2, de-interleaver 3, and interleaver 4.

Soft-input soft-output detector 1 is provided with antennas 11-1-11-n, detector 12, and converters 13 and 14 and carries out spatial-multiplexed signal separation. A spatial-multiplexed signal detection method such as the method described hereinbelow is used as the processing method of soft-input soft-output detector 1. Soft-input soft-output decoder 2 is provided with decoder 21.

FIG. 2 is a block diagram showing the configuration of the transmitting-side device according to the first working example of the present invention. In FIG. 2, the transmission-side device according to the first working example of the present invention is provided with encoder 31, interleaver 32, constellation mapper 33, and antennas 34-1-34-n.

In this transmission-side device, an information sequence that is the object of transmission is first applied as input to encoder 31, and after being converted to codewords (symbol sequence) in encoder 31, is agitated by interleaver 32, and then after being mapped to each signal point and each of antennas 34-1-34-n by constellation mapper 33, is spatial-multiplexed by radio transmission path (not shown) as a transmission sequence.

In the reception side shown in FIG. 1, the signal, which is a transmission sequence that has been spatial-multiplexed as described in the foregoing explanation, is separated and extracted by soft-input soft-output detector 1, and as likelihood information of code words (symbol sequence), after being rearranged to the original arrangement by de-interleaver 3 by means of the reverse process of interleaver 32, is applied as input to soft-input soft-output decoder 2.

Soft-input soft-output decoder 2 has the function of generating extrinsic information for the code word sequence following encoding as soft output, and the extrinsic information is applied to soft-input soft-output detector 1 as a priori by way of interleaver 4 in order to match the order of the transmission sequence.

The transmission of the above-described likelihood information a plurality of times in this loop that is formed by soft-input soft-output detector 1→de-interleaver 3→soft-input soft-output decoder 2→interleaver 4→soft-input soft-output detector 1 produces a dramatic improvement in detection capability and decoding capability, this method being the turbo principle, and extrinsic information that accords with the turbo principle must be accurately extracted.

The spatial-multiplexed signal detection method according to the present working example is used in the above-described configuration, and explanation next regards this spatial-multiplexed signal detection method.

Here, X is the transmission signal vector when the transmission sequence is transmitted by $n_T$ transmission antennas, Y is the reception signal vector when this transmission sequence is received by $n_R$ receiving antennas, and in the case of MLD (Maximum likelihood Decoding):

$$p(X \mid Y) = \frac{p(Y \mid X) \cdot p(X)}{p(Y)_{const}} \propto p(Y \mid X) \cdot p(X)$$

is obtained.

Accordingly, conditional probability p(Y|X) is calculated. In this connection, p(X) on the right side of the above-described equation is the part that corresponds to a priori. Further, transmission signal vector X and reception signal vector Y are:

$$X = \begin{bmatrix} x_1 \\ x_2 \\ \vdots \\ x_{n_T} \end{bmatrix} \in C^{n_T \times 1}$$

$$Y = \begin{bmatrix} y_1 \\ y_2 \\ \vdots \\ y_{n_R} \end{bmatrix} \in C^{n_R \times 1}$$

In addition, the above-described conditional probability p(Y|X) is represented as:

$$p(Y \mid X) = p(y_1, y_2, \cdots, y_{n_R} \mid X)$$
$$= p(y_1 \mid X) \cdot p(y_2 \mid X) \cdots$$
$$= \prod_{n=1}^{n_R} p(y_n \mid X)$$
$$= \prod_{n=1}^{n_R} p(y_n \mid x_1, x_2, \cdots, x_{n_T})$$

If the number A of signal points that can be obtained from transmission signal sequence xi is:

$$A = |A|$$

then the total number of types of expressing conditional probability p(Y}X) in metric base is:

$$|A|^{n_T} \times n_R$$

Explanation next regards the second working example of the present invention. In the second working example of the present invention, the configuration of each device on the transmitting-side and receiving-side is similar to the above-described first working example of the present invention. The second working example of the present invention differs from the above-described first working example of the present invention in that QR decomposition is used as the means (factorization) for implementing factorization that can be represented as the product of the conditional probabilities. The following explanation regards the spatial-multiplexed signal detection method for a case in which this factorization is adopted to achieve a lower degree of complexity.

If the communication path matrix is assumed to be:

$$H \in C^{n_R \times n_T}$$

QR decomposition produces:

$$H = Q \cdot R$$

whereby:

$$Z \equiv Q^H \cdot Y = R \cdot X + \hat{N}$$

is obtained.

In this case, $$Q \in C^{n_R \times n_R}$$

is a unitary matrix, and $$R \in C^{n_R n_T}$$

is an upper triangular matrix, and the noise component vector:

$$\hat{N} \in C^{n_R \times 1}$$

is therefore a noise vector that has undergone unitary transformation, whereby transformation is realized that maintains the distance between signal points without reinforcing noise. In this process of QR decomposition, the vectors within the matrix can be reordered such that processing can be carried out in the order of higher SNR (Signal to Noise Ratio), and a step process can thus be realized for detecting in an order that maximizes the SNR.

Expanding the above-described equation to the element level of the matrix and rewriting yields:

$$Z = \begin{bmatrix} Z_1 \\ Z_2 \\ \vdots \\ Z_m \\ \vdots \\ Z_{n_T} \end{bmatrix}$$

$$= \begin{bmatrix} r_{11} & r_{12} & \cdots & r_{1m} & \cdots & r_{1n_T} \\ 0 & r_{22} & \cdots & r_{2m} & \cdots & r_{2n_T} \\ \vdots & \vdots & \ddots & & & \vdots \\ 0 & 0 & \cdots & r_{mm} & \cdots & r_{mn_T} \\ \vdots & \vdots & & & \ddots & \vdots \\ 0 & 0 & \cdots & 0 & \cdots & r_{n_T n_T} \end{bmatrix} \begin{bmatrix} x_1 \\ x_2 \\ \vdots \\ x_m \\ \vdots \\ x_{n_T} \end{bmatrix} + \begin{bmatrix} \hat{n}_1 \\ \hat{n}_2 \\ \vdots \\ \hat{n}_m \\ \vdots \\ \hat{n}_{n_T} \end{bmatrix}$$

$$= R \cdot X + \hat{N}$$

Here, the noise vector element after unitary transformation is:

$$\hat{n}_1, \hat{n}_2, \ldots \hat{n}_m, \ldots \hat{n}_{n_T}$$

Because this noise vector element is statistically independent, the conditional probability for received signal vector Z after unitary conversion is:

$$p(Z \mid X) = p(Z_{n_T}, \cdots, Z_m, \cdots, Z_2, Z_1 \mid X)$$

$$= p(Z_{n_T} \mid X) \cdots p(Z_2 \mid X) \cdot p(Z_1 \mid X)$$

$$= \prod_{n=1}^{n_T} p(Z_n \mid x_{n_T}, \cdots, x_2, x_1)$$

$$= p(Z_{n_T} \mid x_{n_T}) \cdots p(Z_m \mid x_{n_T}, \cdots, x_m) \cdots$$

$$p(Z_2 \mid x_{n_T}, \cdots, x_m, \cdots, x_2) \cdot p(Z_1 \mid x_{n_T}, \cdots, x_m, \cdots, x_2, x_1)$$

Factorization is thus possible that allows expression as the product of the conditional probabilities that correspond to the elements of the transmission sequence.

If the transmission signal vector realized by the subset of the transmission sequence is defined as:

$$X_{n_T:m} = \begin{bmatrix} x_m \\ x_{m+1} \\ \vdots \\ x_{n_T} \end{bmatrix}$$

the above-described conditional probabilities are:

$$p(Z \mid X) = p(Z_{n_T} \mid X_{n_T:n_T}) \cdots p(Z_m \mid X_{n_T:m}) \cdots p(Z_2 \mid X_{n_T:2}) \cdot p(Z_1 \mid X_{n_T:1})$$

$$= \prod_{m=1}^{n_T} p(Z_m \mid X_{n_T:m})$$

If A is the number of signal points that can be obtained from transmission signal sequence xi, the sum total of types that express conditional probability p(Y|X) in metric base is:

$$|A| + |A|^2 + \cdots + |A|^{n_T} = \frac{|A|^{n_T+1} - |A|}{|A| - 1} \approx \frac{|A|^{n_T+1}}{|A|} = |A|^{n_T}$$

In this case, the number A of signal points is:

$$A = |A|$$

Thus, the present working example has the effect of decreasing the degree of complexity to approximately $1/n_R$ that of the above-described MLD case while further leaving the error rate characteristic unchanged from the MLD case.

Explanation next regards a third working example of the present invention. In the third working example of the present invention, the configuration of each of the devices on the transmission side and reception side is similar to the above-described first working example of the present invention. The third working example of the present invention differs from the above-described first working example of the present invention in that tridiagonal matrices factorization is used as the means (factorization) for effecting factorization that enables expression by the product of the conditional probabilities. Explanation next regards the spatial-multiplexed signal detection method for a case in which this tridiagonal matrices factorization is adopted to achieve a lower degree of complexity in factorization.

In the case of tridiagonal matrices factorization, expansion to the element level of a matrix yields:

$$Z = \begin{bmatrix} Z_1 \\ Z_2 \\ Z_3 \\ \vdots \\ Z_m \\ \vdots \\ Z_{n_T-2} \\ Z_{n_T-1} \\ Z_{n_T} \end{bmatrix} =$$

-continued $$\begin{bmatrix} a_{11} & a_{12} & 0 & \cdots & 0 & \cdots & 0 & 0 & 0 \\ a_{21} & a_{22} & a_{23} & \vdots & & \vdots & & \vdots & \vdots \\ 0 & a_{32} & a_{33} & \ddots & 0 & & \vdots & & \vdots \\ \vdots & 0 & a_{43} & \ddots & a_{m-1,m} & & \vdots & & \vdots \\ \vdots & \vdots & & \ddots & a_{mm} & \ddots & & \vdots & \vdots \\ 0 & 0 & 0 & \cdots & a_{m+1,m} & \ddots & a_{n_T-3,n_T-2} & 0 & \vdots \\ \vdots & \vdots & \vdots & & 0 & \ddots & a_{n_T-2,n_T-2} & a_{n_T-2,n_T-1} & 0 \\ \vdots & \vdots & \vdots & & \vdots & & a_{n_T-1,n_T-2} & a_{n_T-1,n_T-1} & a_{n_T-1,n_T} \\ 0 & 0 & 0 & \cdots & 0 & \cdots & 0 & a_{n_T,n_T-1} & a_{n_T,n_T} \end{bmatrix}.$$

$$\begin{bmatrix} x_1 \\ x_2 \\ x_3 \\ \vdots \\ x_m \\ \vdots \\ x_{n_T-2} \\ x_{n_T-1} \\ x_{n_T} \end{bmatrix} + \begin{bmatrix} \hat{n}_1 \\ \hat{n}_2 \\ \hat{n}_3 \\ \vdots \\ \hat{n}_m \\ \vdots \\ \hat{n}_{n_T-2} \\ \hat{n}_{n_T-1} \\ \hat{n}_{n_T} \end{bmatrix} = A \cdot X + \hat{N}$$

The conditional probability for Z is therefore:

$$\begin{aligned} p(Z \mid X) &= p(Z_{n_T}, \cdots, Z_m, \cdots, Z_2, Z_1 \mid X) \\ &= p(Z_{n_T} \mid X) \cdots p(Z_2 \mid X) \cdot p(Z_1 \mid X) \\ &= \prod_{n=1}^{n_T} p(Z_n \mid x_{n_T}, \cdots, x_2, x_1) \\ &= p(Z_{n_T} \mid x_{n_T}, x_{n_T-1}) \cdot p(Z_{n_T-1} \mid x_{n_T}, x_{n_T-1}, x_{n_T-2}) \\ &\quad \cdot p(Z_{n_T-2} \mid x_{n_T-1}, x_{n_T-2}, x_{n_T-3}) \cdots \\ &\quad p(Z_m \mid x_{m+1}, x_m, x_{m-1}) \cdots \\ &\quad p(Z_2 \mid x_3, x_2, x_1) \cdot p(Z_1 \mid x_2, x_1) \end{aligned}$$

If A is the number of signal points that can be obtained from transmission signal sequence xi, the sum total of types by which conditional probability p(Z|X) is expressed in metric base is:

$$|A|^2 + |A|^3 + \ldots + |A|^3 + |A|^2 \approx |A|^3 \cdot n_T$$

Here, the number A of signal points is expressed as:

$$A = |A|$$

As a result, the present working example has the effect of decreasing the degree of complexity to approximately $A_0$ and $$\frac{1}{|A|^{n_R - 3}}$$

compared to the above-described case of MLD, and further, leaving the error rate characteristic unchanged from the case of MLD.

Explanation next regards a fourth working example of the present invention. In the fourth working example of the present invention, the configurations of each device of the transmission side and reception side is the same as that of the above-described first working example of the present invention. The fourth working example of the present invention differs from the above-described first working example of the present invention in that block triangularization factorization is used as the means of factorization that allows expression as the product of the conditional probabilities. Explanation regards the spatial-multiplexed signal detection method for a case in which this block triangularization factorization is employed to achieve a lower degree of complexity.

In the case of block triangularization factorization, expansion to the element level of a matrix yields:

$$Z = \begin{bmatrix} Z_1 \\ Z_2 \\ Z_3 \\ \vdots \\ Z_m \\ \vdots \\ Z_{n_T-2} \\ Z_{n_T-1} \\ Z_{n_T} \end{bmatrix} =$$

$$\begin{bmatrix} a_{11} & a_{12} & a_{13} & \cdots & a_{1,m} & \cdots & a_{1,n_T-2} & a_{1,n_T-1} & a_{1,n_T} \\ a_{21} & a_{22} & a_{23} & \vdots & & & a_{2,n_T-2} & a_{2,n_T-1} & a_{2,n_T} \\ a_{31} & a_{32} & a_{33} & \vdots & & & a_{3,n_T-2} & a_{3,n_T-1} & a_{3,n_T} \\ 0 & 0 & 0 & \ddots & a_{m-1,m} & & \vdots & \vdots & \vdots \\ \vdots & \vdots & \vdots & & a_{mm} & \ddots & \vdots & \vdots & \vdots \\ 0 & 0 & 0 & \cdots & a_{m+1,m} & \ddots & \vdots & \vdots & \vdots \\ \vdots & \vdots & \vdots & & 0 & \ddots & a_{n_T-2,n_T-2} & a_{n_T-2,n_T-1} & a_{n_T-2,n_T} \\ \vdots & -\vdots & \vdots & & \vdots & & a_{n_T-1,n_T-2} & a_{n_T-1,n_T-1} & a_{n_T-1,n_T} \\ 0 & 0 & 0 & \cdots & 0 & \cdots & a_{n_T,n_T-2} & a_{n_T,n_T-1} & a_{n_T,n_T} \end{bmatrix} \cdot$$

$$\begin{bmatrix} x_1 \\ x_2 \\ x_3 \\ \vdots \\ x_m \\ \vdots \\ x_{n_T-2} \\ x_{n_T-1} \\ x_{n_T} \end{bmatrix} + \begin{bmatrix} \hat{n}_1 \\ \hat{n}_2 \\ \hat{n}_3 \\ \vdots \\ \hat{n}_m \\ \vdots \\ \hat{n}_{n_T-2} \\ \hat{n}_{n_T-1} \\ \hat{n}_{n_T} \end{bmatrix} = A \cdot X + \hat{N}$$

Accordingly, when a cubic block is used, conditional probability for Z is:

$$\begin{aligned} p(Z \mid X) &= p(Z_{n_T}, \cdots, Z_m, \cdots, Z_2, Z_1 \mid X) \\ &= p(Z_{n_T} \mid X) \cdots p(Z_2 \mid X) \cdot p(Z_1 \mid X) \\ &= \prod_{n=1}^{n_T} p(Z_n \mid x_{n_T}, \cdots, x_2, x_1) \\ &= p(Z_{n_T}, Z_{n_T-1}, Z_{n_T-2} \mid x_{n_T}, x_{n_T-1}, x_{n_T-2}) \cdot \end{aligned}$$

-continued $$p\begin{pmatrix} Z_{n_T-3}, Z_{n_T-4}, Z_{n_T-5} \mid x_{n_T}, x_{n_T-1}, \\ x_{n_T-2}, x_{n_T-3}, x_{n_T-4}, x_{T-5} \end{pmatrix}$$

$$\cdots p(Z_3, Z_2, Z_1 \mid x_{n_T}, x_{n_T-1}, x_{n_T-2}, \cdots, x_3, x_2, x_1)$$

and the above-described conditional probability is:

$$p(Z \mid X) = \prod_{n=1}^{\frac{n_T}{3}} p(Z_{3 \cdot n}, Z_{3 \cdot n-1}, Z_{3 \cdot n-2} \mid x_{n_T}, \cdots, x_{3 \cdot n}, x_{3 \cdot n-1}, x_{3 \cdot n-2})$$

$$= \prod_{n=1}^{\frac{n_T}{3}} p(Z_{3n:3n-2} \mid X_{n_T:3n-2})$$

$$= \prod_{n=1}^{\frac{n_T}{3}} \begin{matrix} p(Z_{3 \cdot n} \mid X_{n_T:3n-2}) \cdot \\ p(Z_{3 \cdot n-1} \mid X_{n_T:3n-2}) \cdot p(Z_{3 \cdot n-2} \mid X_{n_T:3n-2}) \end{matrix}$$

$$= \prod_{n=1}^{\frac{n_T}{3}} \begin{matrix} p(Z_{3 \cdot n} \mid x_{n_T}, \cdots, x_{3 \cdot n}, x_{3 \cdot n-1}, x_{3 \cdot n-2}) \\ \cdot p(Z_{3 \cdot n-1} \mid x_{n_T}, \cdots, x_{3 \cdot n}, x_{3 \cdot n-1}, x_{3 \cdot n-2}) \cdot \\ p(Z_{3 \cdot n-2} \mid x_{n_T}, \cdots, x_{3 \cdot n}, x_{3 \cdot n-1}, x_{3 \cdot n-2}) \end{matrix}$$

If A is the number of signals that can be obtained from transmission signal sequence xi, then the sum total of types by which conditional probability p(Z|X) is expressed in metric base is:

$$|A|^3 \times 3 + |A|^6 \times 3 + \ldots + |A|^{n_T} \times 3 = \frac{|A|^{n_T+3} - |A|^3}{|A|^3 - 1} \times 3 \approx |A|^{n_T} \times 3$$

In this case, the number A of signal points is expressed as:

$$A = |A|$$

As a result, the present working example has the effect of decreasing the degree of complexity to approximately $3/n_R$ compared to the above-described case of MLD, and further, leaving the error rate characteristic unchanged from the case for MLD.

The method described above is a working example that exhibits the same error rate characteristic as the case for MLD, which is optimum detection, and that realizes a reduced degree of complexity. Explanation next regards a working example in which a lower degree of complexity is achieved by applying a "greedy" method for division as a Markov chain.

In the fifth working example of the present invention, the conditional probabilities p(Z|X) for the above-described received signal vector Z is first subjected to factorization to allow expression by the product of the conditional probabilities that correspond to the elements of a transmission sequence, and after division into a plurality of groups (factorization), the candidates that correspond to the condition in each step are limited within the groups. Although there is some variation in amount, the degree of this limiting theoretically brings with it a degradation of characteristics due to the propagation of errors between groups, but kept within a permissible range, this limiting reduces the degree of complexity.

FIG. 3 shows an example of the means for dividing groups (factorization) that uses QR decomposition according to the fifth working example of the present invention. FIG. 3 shows a process for division into three groups and processing in three steps when the above-described QR decomposition is used as the means for division (factorization).

In FIG. 3, the portions enclosed by a solid line are the portions that are processed in the first step, the portions enclosed by the heavy broken lines are the portions processed in the second step, and the portions enclosed by the fine dotted lines are the portions processed in the third step.

As previously described, in the equation shown in FIG. 3, the noise vector element after unitary transformation is:

$$\hat{n}_1, \hat{n}_2, \ldots \hat{n}_m, \hat{n}_{n_T}$$

This noise vector element is statistically independent, and as a result, the conditional probabilities for received signal vector Z after unitary transformation are:

$$p(Z \mid X) = p(Z_{n_T}, \cdots, Z_m, \cdots, Z_2, Z_1 \mid X)$$

$$= p(Z_{n_T} \mid X) \cdots p(Z_2 \mid X) \cdot p(Z_1 \mid X)$$

$$= \prod_{n=1}^{n_T} p(Z_n \mid x_{n_T}, \cdots, x_2, x_1)$$

$$p(Z_{n_T} \mid x_{n_T}) \cdots p(Z_m \mid x_{n_T}, \cdots, x_m) \cdots$$

$$p(Z_2 \mid x_{n_T}, \cdots, x_m, \cdots, x_2) \cdot p(Z_1 \mid x_{n_T}, \cdots, x_m, \cdots, x_2, x_1)$$

These are subjected to the processing of each step independently for each group shown in FIG. 3. The calculation of conditional probabilities carried out in the process of each step is as follows:

Step 1

$$p(Z_{n_T:m} \mid X_{n_T:m}) = p(Z_{n_T} \mid x_{n_T}) \ldots p(Z_m \mid x_{n_T} \ldots, x_m)$$

Step 2

The following calculation of conditional probabilities is carried out with all candidates obtained in Step 1 as the condition:

$$p(Z_{m-1:n} \mid X_{n_T:m}, X_{m-1:n}) = p(Z_{m-1} \mid x_{n_T}, \ldots, X_{m-1}) \ldots$$
$$p(Z_n \mid x_{n_T}, \ldots, x_n)$$

Step 3

The following calculation of conditional probabilities is carried out with the limited candidates obtained in Steps 1 and 2 as the condition:

$$p(Z_{n-1:1} \mid X_{n_T:m} X_{m-1:n} X_{n-1:1}) = p(Z_{n-1} \mid x_{n_T}, \ldots, x_{n-1}) \ldots$$
$$p(Z_1 \mid x_{n_T}, \ldots, x_1)$$

FIG. 4 shows an example of the means of group division (factorization) that uses tridiagonal matrices factorization according to the sixth working example of the present invention. FIG. 4 shows a process of dividing into three groups and processing in three steps when tridiagonal matrices factorization is used as the means of factorization.

In FIG. 4, the portions enclosed in solid lines are the portions processed in the first step, the portions enclosed in heavy broken lines are the portions processed in the second step, and the portions enclosed in fine dotted lines are the portions processed in the third step. The conditional probabilities for received signal vector Z are:

$$p(Z \mid X) = p(Z_{n_T}, \cdots, Z_m, \cdots, Z_2, Z_1 \mid X)$$
$$= p(Z_{n_T} \mid X) \cdots p(Z_2 \mid X) \cdot p(Z_1 \mid X)$$
$$= \prod_{n=1}^{n_T} p(Z_n \mid x_{n_T}, \cdots, x_2, x_1)$$
$$= p(Z_{n_T} \mid x_{n_T}, x_{n_T-1}) \cdot p(Z_{n_T-1} \mid x_{n_T}, x_{n_T-1}, x_{n_T-2}) \cdot$$
$$p(Z_{n_T-2} \mid x_{n_T-1}, x_{n_T-2}, x_{n_T-3}) \cdots p(Z_m \mid x_{m+1}, x_m, x_{m-1})$$
$$\cdots p(Z_2 \mid x_3, x_2, x_1) \cdot p(Z_1 \mid x_2, x_1)$$

These are subjected to the processing of each step independently for each group shown in FIG. 4. The calculation of conditional probabilities carried out in the processing of each step is as follows:

Step 1
$$p(Z_{n_T:m} \mid X_{n_T:m}) = p(Z_{n_T} \mid x_{n_T}, x_{n_T-1}) \cdot p(Z_{n_T-1} \mid x_{n_T}, x_{n_T-1}, x_{n_T-2}) \cdots p(Z_m \mid x_{m+1}, x_m, x_{m-1})$$

Step 2

The following calculation of the conditional probabilities is carried out with all candidates obtained in Step 1 as conditions:
$$p(Z_{m-1:n} \mid X_{n_T:m}, X_{m-1:n}) = p(Z_{m-1} \mid x_m, x_{m-1}, x_{m-2}) \cdots p(Z_n \mid x_{n+1}, x_n, x_{n-1})$$

Step 3

The following calculation of conditional probabilities is carried out with the limited candidates obtained in Steps 1 and 2 as conditions:
$$p(Z_{n-1:1} \mid X_{n_T:m}, X_{m-1:n}, X_{n-1:1}) = p(Z_{n-1} \mid x_n, x_{n-1}, x_{n-2}) \cdots p(Z_2 \mid x_3, x_2, x_1) \cdot p(Z_1 \mid x_2, x_1)$$

FIG. 5 shows an example of the group division means (factorization) that uses block triangularization factorization according to the seventh working example of the present invention. FIG. 5 shows a case of dividing into three groups and carrying out processing in three steps when block triangularization factorization is used as the factorization means.

In FIG. 5, portions enclosed in solid lines are the portions processed in the first step, portions enclosed in heavy broken lines are the portions processed in the second step, and portions enclosed in fine dotted lines are the portions processed in the third step. If a cubic block is used, the conditional probabilities for the received signal vector Z are:

$$p(Z \mid X) = p(Z_{n_T}, \cdots, Z_m, \cdots, Z_2, Z_1 \mid X)$$
$$= p(Z_{n_T} \mid X) \cdots p(Z_2 \mid X) \cdot p(Z_1 \mid X)$$
$$= \prod_{n=1}^{n_T} p(Z_n \mid x_{n_T}, \cdots, x_2, x_1)$$
$$= p(Z_{n_T}, Z_{n_T-1}, Z_{n_T-2} \mid x_{n_T}, x_{n_T-1}, x_{n_T-2}) \cdot$$
$$p\begin{pmatrix} Z_{n_T-3}, Z_{n_T-4}, Z_{n_T-5} \mid x_{n_T}, x_{n_T-1}, \\ x_{n_T-2}, x_{n_T-3}, x_{n_T-4}, x_{n_T-5} \end{pmatrix} \cdots$$
$$p(Z_3, Z_2, Z_1 \mid x_{n_T}, x_{n_T-1}, x_{n_T-2}, \cdots, x_3, x_2, x_1)$$

The above-described conditional probabilities are:

$$p(Z \mid X) = \prod_{n=1}^{\frac{n_T}{3}} p(Z_{3 \cdot n}, Z_{3 \cdot n-1}, Z_{3 \cdot n-2} \mid x_{n_T}, \cdots, x_{3 \cdot n}, x_{3 \cdot n-1}, x_{3 \cdot n-2})$$
$$= \prod_{n=1}^{\frac{n_T}{3}} p(Z_{3n:3n-2} \mid X_{n_T:3n-2})$$
$$= \prod_{n=1}^{\frac{n_T}{3}} p(Z_{3 \cdot n} \mid X_{n_T:3n-2}) \cdot p(Z_{3 \cdot n-1} \mid X_{n_T:3n-2}) \cdot$$
$$p(Z_{3 \cdot n-2} \mid X_{n_T:3n-2}) p(Z_{3 \cdot n} \mid x_{n_T}, \cdots, x_{3 \cdot n}, x_{3 \cdot n-1}, x_{3 \cdot n-2})$$
$$= \prod_{n=1}^{\frac{n_T}{3}} \cdot p(Z_{3 \cdot n-1} \mid x_{n_T}, \cdots, x_{3 \cdot n}, x_{3 \cdot n-1}, x_{3 \cdot n-2}) \cdot$$
$$p(Z_{3 \cdot n-2} \mid x_{n_T}, \cdots, x_{3 \cdot n}, x_{3 \cdot n-1}, x_{3 \cdot n-2})$$

These are subjected to the processing of each step independently for each group shown in FIG. 5. The calculation of conditional probabilities that is carried out in the processing of each step is as follows:

Step 1

$$p(Z_{n_T:n_T-2} \mid X_{n_T:n_T-2}) = p(Z_{n_T} \mid x_{n_T}, x_{n_T-1}, x_{n_T-2}) \cdot$$
$$p(Z_{n_T-1} \mid x_{n_T}, x_{n_T-1}, x_{n_T-2}) \cdot$$
$$p(Z_{n_T-2} x_{n_T}, x_{n_T-1}, x_{n_T-2})$$

Step 2

The following calculation of conditional probabilities is carried out with all candidates obtained in Step 1 as the conditions:

$$p(Z_{n_T-3:n_T-5} \mid X_{n_T:n_T-2}, X_{n_T-3:n_T-5}) = p(Z_{n_T-3} \mid x_{n_T}, \cdots,$$
$$x_{n_T-3}, x_{n_T-4}, x_{n_T-5}) \cdot$$
$$p(Z_{n_T-4} \mid x_{n_T}, \cdots, x_{n_T-3},$$
$$x_{n_T-4}, x_{n_T-5}) \cdot$$
$$p(Z_{n_T-5} \mid x_{n_T}, \cdots, x_{n_T-3},$$
$$x_{n_T-4}, x_{n_T-5})$$

Step 3

The following calculation of conditional probabilities is carried out with the limited candidates obtained in Steps 1 and 2 as conditions:

$$p(Z_{3:1} \mid X_{n_T:1}) = p(Z_3 \mid x_{n_T}, \cdots, x_3, x_2, x_1) \cdot$$
$$p(Z_2 \mid x_{n_T}, \cdots, x_3, x_2, x_1) \cdot$$
$$p(Z_1 \mid x_{n_T}, \cdots, x_3, x_2, x_1)$$

If it is possible to carry out division such that a step process can be carried out in the order of higher conditional probabilities of each of the groups in the process of matrices factorization that is used as the means for performing factorization that allows expression as the product of the above-described conditional probabilities, and, for example, if matrices factorization is carried out after first using mutually orthogonal pilot signals that are transmitted from each transmission antenna to rearrange the transmission signal vector elements from the bottom in the order of highest SNR on the reception end and then rearranging communication path matrix H in a corresponding form, then the conditional probabilities of the above-described Step 1 can be expected to be higher than other groups.

Alternatively, if the norm of each column vector of communication path matrix H is calculated, the transmission signal vector elements rearranged from the bottom to correspond to the order of higher norm column matrix vectors, and communication path column matrix H rearranged accordingly, the conditional probabilities of the above-described Step 1 can be expected to be higher than other groups, and the conditional probabilities can be expected to line up in the order of steps.

Probability $p(x_i|z)$ for symbol $x_i$ of the codewords (symbol sequence) must be calculated based on the limited candidates that have been obtained in this way. This probability is found by a marginalization process in Bayesian statistics and can be found as follows:

$$p(x_i \mid Z) = \sum_{x_1} \sum_{x_2} \cdots \sum_{x_{i-1}} \sum_{x_{i-1}} \cdots \sum_{x_{n_T}} p(X \mid Z)$$

$$= \sum_{x_1} \sum_{x_2} \cdots \sum_{x_{i-1}} \sum_{x_{i+1}} \cdots \sum_{x_{n_T}} p$$

$$(x_1, x_2, \cdots, x_{n_T} \mid Z_1, Z_2, \cdots, Z_{n_T})$$

The actual calculations are carried out in the metric domain, whereby multiplication is all replaced by addition, and exponential operations are unnecessary. A specific example will be described later in the embodiments.

As one form of calculation that is carried out in the metric domain, semi-rings are used in an effective method of lowering complexity. The application of semi-rings in the above-described equation yields:

$$f(x_i = a \mid Z) = \bigoplus_{x_1 \in A} \bigoplus_{x_2 \in A} \cdots \bigoplus_{x_{i-1} \in A} \bigoplus_{x_{i+1} \in A} \cdots \bigoplus_{x_{n_T} \in A}$$

$$f(x_1, x_2, \cdots, x_{i-1}, x_i = a, x_{i+1}, \cdots x_{n_T} \mid Z)$$

In this case, $f(\cdot)$ is the metric that corresponds to probability $p(\cdot)$.

To explain a method of lowering complexity that uses semi-rings, the concept of semi-rings must first be explained. Such a description is disclosed in the July 1996 issue of IEEE Transactions on Information Theory, Vol. 42, No. 4, pp. 1072-1092 (Reference Document 1).

The semi-rings are made up from a set of semi-rings in which the following two types of calculations are defined:

(semiRing, $\oplus$, $\otimes$)

and between any three elements:

(a, b, c $\in$ semiRing)

the following relations are satisfied:

(closed rules)

a $\oplus$ b $\in$ semiRing a $\otimes$ b $\in$ semiRing (connection rules)

$(a \oplus b) \oplus c = a \oplus (b \oplus c)$ $(a \otimes b) \otimes c = a \otimes (b \otimes c)$ (identity elements)

$a \oplus m = m \oplus a = a (\forall a \in \text{semiRing})$ $a \otimes \underline{1} = \underline{1} \otimes a = a (\forall a \in \text{semiRing})$ (zero element)

$a \otimes m = m \otimes a = m (\forall a \in \text{semiRing})$

In addition, in contrast to rings, semi-rings have no inverse elements.

Two representative examples of semi-rings having the above-described characteristics (Max-Log domain and Log domain), i.e., semi-rings in the (A) Max-Log domain and semi-rings in the (B) Log Domain (Max-Log Domain), are shown below.

In (A), semi-rings in the Max-Log domain can be placed in correspondence by the equation:

$$\begin{cases} a \oplus b \equiv \max\{a, b\} \\ a \otimes b \equiv a + b \end{cases}$$

In other words, an addition on a semi-ring is defined as a maximum value operation (MAX), and a product on a semi-ring is defined as normal addition. This type of operation method is further described in the above-mentioned Reference Document 1.

The "m" shown above therefore corresponds to $-\infty$ and the underlined "$\underline{1}$" corresponds to a normal zero. In this case, the portions in the equation above:

$$f(x_i = a \mid Z) = \bigoplus_{x_1 \in A} \bigoplus_{x_2 \in A} \cdots \bigoplus_{x_{i-1} \in A} \bigoplus_{x_{i+1} \in A} \cdots \bigoplus_{x_{n_T} \in A}$$

$$f(x_1, x_2, \cdots, x_{i-1}, x_i = a, x_{i+1}, \cdots x_{n_T} \mid Z)$$

can be executed simply by detection of the metric maximum value. The method described above is simple, but the calculation result is an approximation value.

In (B), a semi-ring in the Log domain can be placed in correspondence by the equation:

$$\begin{cases} a \oplus b \equiv \ln(e^a + e^b) \\ a \otimes b \equiv a + b \end{cases}$$

In this case, the initial operation can be carried out by a Jacobian Logarithm as follows:

$$a \oplus b \equiv \ln(e^a + e^b) = \max\{a, b\} + \ln(1 + e^{-|a-b|})$$

$$\max\{a, b\} + f(|a - b|)$$

In this case, correction factor $f(|*|)$ can be realized by a simple look-up table.

When this correction is carried out ideally, the marginalization process:

$$p(x_i \mid Z) = \sum_{x_1} \sum_{x_2} \cdots \sum_{x_{i-1}} \sum_{x_{i-1}} \cdots \sum_{x_{n_T}} p(X \mid Z)$$

$$= \sum_{x_1} \sum_{x_2} \cdots \sum_{x_{i-1}} \sum_{x_{i+1}} \cdots \sum_{x_{n_T}} p$$

$$(x_1, x_2, \cdots, x_{n_T} \mid Z_1, Z_2, \cdots, Z_{n_T})$$

can be carried out accurately in the metric domain by the metric operation:

$$f(x_i = a \mid Z) = \bigoplus_{x_1 \in A} \bigoplus_{x_2 \in A} \cdots \bigoplus_{x_{i-1} \in A} \bigoplus_{x_{i+1} \in A} \cdots \bigoplus_{x_{n_T} \in A}$$

$$f(x_1, x_2, \cdots, x_{i-1}, x_i = a, x_{i+1}, \cdots x_{n_T} \mid Z)$$

The eighth working example of the present invention is a case in which a method of lowered complexity realized by the above-described semi-rings is applied to a method for processing by steps in which the above-described "greedy" method is applied. The semi-rings used in the following explanation are a case of using QR decomposition as the means of factorization to enable expression as the product of conditional probabilities in the embodiment of the Max-Log domain.

Based on the equation for the use of the above-described QR decomposition, the conditional probabilities for the received signal vector Z after unitary transformation are:

$$p(Z \mid X) = p(Z_{n_T} \mid X_{n_T:n_T}) \cdots p(Z_m \mid X_{n_T:m}) \cdots p(Z_2 \mid X_{n_T:2}) \cdot p(Z_1 \mid X_{n_T:1})$$

$$= \prod_{m=1}^{n_T} p(Z_m \mid X_{n_T:m})$$

Subjecting this conditional probability to a marginalization process in Bayesian statistics yields the equation:

$$p(x_i \mid Z) = \sum_{x_1} \sum_{x_2} \cdots \sum_{x_{i-1}} \sum_{x_{i+1}} \cdots \sum_{x_{n_T}} p(Z \mid X)$$

$$= \sum_{x_1} \sum_{x_2} \cdots \sum_{x_{i-1}} \sum_{x_{i+1}} \cdots \sum_{x_{n_T}} \prod_{m=1}^{n_T} p(Z_m \mid X_{n_T:m})$$

The application of semi-rings to this equation yields:

$$f(x_i = a \mid Z) = \bigoplus_{x_1 \in A} \bigoplus_{x_2 \in A} \cdots \bigoplus_{x_{i-1} \in A} \bigoplus_{x_{i+1} \in A} \cdots \bigoplus_{x_{n_T} \in A} \bigotimes_{m=1}^{n_T} f(Z_m \mid X_{n_T:m \text{ at } x_i=a})$$

For this, independent processing is carried out for each step for each group shown in FIG. 3. The calculation of conditional probabilities carried out in the process of each step is as follows:

Step 1

$$f(x_i = a \mid Z_{n_T:m}) = \bigoplus_{x_m \in A} \cdots \bigoplus_{x_{n_T} \in A} \bigotimes_{j=m}^{n_T} f(Z_j \mid X_{n_T:j \text{ at } x_i=a})$$

In the case of a Max-Log domain embodiment, the maximum value is in the group of Step 1. When a plurality of events (transmission sequence) that have been estimated in advance by simplified estimation are used as the condition here, a plurality of corresponding calculations are carried out, but the calculation corresponding to the use of a marginalization process realizes a simplification as the maximum value of each value. This process is equivalent to a marginalization process in the group of Step 1. FIG. 6 shows an image of this process.

Step 2

Using the candidates having the maximum values obtained in Step 1 as the conditions, or using a plurality of events (transmission sequence) that has been estimated in advance by simplified estimation as the conditions, the following metric operation is carried out:

$$f(x_i = a \mid Z_{n_T:m}, Z_{m-1:n}) = \bigoplus_{x_n \in A} \cdots \bigoplus_{x_{m-1} \in A} \bigotimes_{j=n}^{m-1} f(Z_j \mid X_{n_T:j \text{ at } x_i=a})$$

The use of a plurality of events (transmission sequence) that has been estimated in advance by simplified estimation as the conditions entails a plurality of calculations, but this can be simplified to the maximum value in the group of Step 2 in the case of a Max-Log domain embodiment. This process corresponds to the marginalization process in the group of Step 2. FIG. 6 shows an image of this process.

Step 3

The following metric operation is carried out using the candidates having the maximum values obtained in Steps 1 and 2 as conditions, or using a plurality of events (transmission sequence) that have been estimated in advance by simplified estimation as conditions:

$$f(x_i = a \mid Z_{n_T:m}, Z_{m-1:n}, Z_{n-1:1}) = \bigoplus_{x_1 \in A} \cdots \bigoplus_{x_{n-1} \in A} \bigotimes_{j=1}^{n-1} f(Z_j \mid X_{n_T:j \text{ at } x_i=a})$$

Using a plurality of events (transmission sequence) that have been estimated in advance by simplified estimation as conditions entails a plurality of calculations, but in the case of the Max-Log domain embodiment, the process is abbreviated to the maximum value in the groups of Step 3. This process is equivalent to the marginalization process in the groups of Step 3. FIG. 6 shows an image of this process.

When the elements for which xi=a, which are the targets, in the same group do not occur throughout each of the above-described steps, the maximum value has no conditions in that step. Accordingly, the equation of the marginalization process in which semi-rings are applied results in:

$$f(x_i = a \mid Z) = \bigoplus_{x_1 \in A} \bigoplus_{x_2 \in A} \cdots \bigoplus_{x_{i-1} \in A} \bigoplus_{x_{i+1} \in A} \cdots$$

$$\bigoplus_{x_{n_T} \in A} \bigotimes_{j=1}^{n_T} f(Z_j \mid X_{n_T:j \text{ at } x_i=a})$$

$$= \bigoplus_{x_1 \in A} \cdots \bigoplus_{x_{n-1} \in A} \bigotimes_{j=1}^{n-1} f(Z_j \mid X_{n_T:j \text{ at } x_i=a})$$

$$\otimes \left( \bigoplus_{x_n \in A} \cdots \bigoplus_{x_{m-1} \in A} \bigotimes_{j=n}^{m-1} f(Z_j \mid X_{n_T:j \text{ at } x_i=a}) \right)$$

$$\otimes \left( \bigoplus_{x_m \in A} \cdots \bigoplus_{x_{n_T} \in A} \bigotimes_{j=m}^{n_T} f(Z_j \mid X_{n_T:j \text{ at } x_i=a}) \right)$$

The operation result of each step is here set to $\alpha$, $\beta$, and $\gamma$ as shown below:

Step 1:

$$f(x_i = a \mid Z_{n_T:m}) = \bigoplus_{x_m \in A} \cdots \bigoplus_{x_{n_T} \in A} \bigotimes_{j=m}^{n_T} f(Z_j \mid X_{n_T:j \text{ at } x_i = a}) = \alpha$$

Step 2:

$$f(x_i = a \mid Z_{n_T:m}, Z_{m-1:n}) = \bigoplus_{x_n \in A} \cdots \bigoplus_{x_{m-1} \in A} \bigotimes_{j=n}^{m-1} f(Z_j \mid X_{n_T:j \text{ at } x_i = a}) = \beta$$

Step 3:

$$f(x_i = a \mid Z_{n_T:m}, Z_{m-1:n}, Z_{n-1:1}) =$$

$$\bigoplus_{x_1 \in A} \cdots \bigoplus_{x_{n-1} \in A} \bigotimes_{j=1}^{n-1} f(Z_j \mid X_{n_T:j \text{ at } x_i = a}) = \gamma$$

The following equation is thus obtained:

$$f(x_i = a \mid Z) = \alpha \otimes \beta \otimes \gamma$$

Alternatively, using a plurality of events (transmission sequence) that have been estimated in advance by simplified estimation as the conditions, and then using "'" for the operation result or the events that correspond to any transmission sequence within this plurality results in a plurality of operation results in each step, and applying $\alpha'$, $\beta'$, and $\gamma'$ to any item yields:

Step 1:

$$f'(x_i = a \mid Z_{n_T:m}) = \bigoplus_{x_m \in A} \cdots \bigoplus_{x_{n_T} \in A} \bigotimes_{j=m}^{n_T} f(Z_j \mid X_{n_T:j \text{ at } x_i = a}) = \alpha'$$

Step 2:

$$f'(x_i = a \mid Z_{n_T:m}, Z_{m-1:n}) = \bigoplus_{x_n \in A} \cdots \bigoplus_{x_{m-1} \in A} \bigotimes_{j=n}^{m-1} f(Z_j \mid X_{n_T:j \text{ at } x_i = a}) = \beta'$$

Step 3:

$$f'(x_i = a \mid Z_{n_T:m}, Z_{m-1:n}, Z_{n-1:1}) =$$

$$\bigoplus_{x_1 \in A} \cdots \bigoplus_{x_{n-1} \in A} \bigotimes_{j=1}^{n-1} f(Z_j \mid X_{n_T:j \text{ at } x_i = a}) = \gamma'$$

The following result is thus obtained:

$$f'(x_i = a \mid Z) = \alpha' \otimes \beta' \otimes \gamma'$$

In this case, the event for which the maximum value is obtained among the results that are obtained for a plurality of events is the most certain transmission sequence.

In the case of a Max-Log domain embodiment, the sum of maximum metrics $\alpha$, $\beta$, and $\gamma$ in the groups of each step that have been calculated under the constraining conditions of the preceding stage is the $f(x_i=a|Z)$ that is sought. When a single candidate of only the maximum value is used and when the element that is the target does not occur within the group, i.e., when $x_i=a$ does not occur, the maximum value has no condition in that step, whereby commonality becomes possible with another, and a lower degree of complexity can be realized.

An embodiment realized by specific metric calculations is next described to explain the process of: carrying out factorization that allows expression by the product of the above-described conditional probabilities; dividing the conditional probabilities for which factorization is possible into a plurality of groups and carrying out the processes of each step; and making the event that indicates the maximum conditional probability of the preceding stage in the process of each step, i.e., candidate X that has the maximum metric value in the case of this embodiment, the condition of the next stage. Although a case in which a single candidate of only the maximum value is used for the sake of simplifying the explanation in this embodiment, a means similar to the above-described case can of course be devised for cases in which candidates are limited to a plurality of events (transmission sequence) by simplified estimation.

In the following embodiment, in the interest of simplifying the explanation, a case is described in which group division is the same as the division of the product of conditional probabilities for 16 QAM (Quadrature Amplitude Modulation) in which the number A of signal points that can be obtained from element $x_i$ of a transmission signal sequence is set to "16." In this case, the number A of signal points is represented by:

$$A = |A|$$

FIG. 7 shows the state of this division. In FIG. 7, the metric process that corresponds to Step 1 is carried out by the equation:

$$M_{n_T} : -|z_{n_T} - r_{n_T n_T} \cdot x_{n_T}|^2 = -(z_{n_T} - r_{n_T n_T} \cdot x_{n_T}) \cdot$$

$$(z^*_{n_T} - r^*_{n_T n_T} \cdot x^*_{n_T})$$

$$= -|z_{n_T}|^2 - |r_{n_T n_T}|^2 \cdot |x_{n_T}|^2 +$$

$$z_{n_T} \cdot r^*_{n_T n_T} \cdot x^*_{n_T} + z^*_{n_T} \cdot$$

$$r_{n_T n_T} \cdot x_{n_T}$$

$$\Rightarrow -|r_{n_T n_T}|^2 \cdot |x_{n_T}|^2 + z_{n_T} \cdot$$

$$r^*_{n_T n_T} \cdot x^*_{n_T} + z^*_{n_T} \cdot r_{n_T n_T} \cdot x_{n_T}$$

In this case, the final soft determination output of target bits is a logarithmic likelihood ratio (LLR), and in a metric base operation, this soft determination output is the difference between the metric for the target bits and the metric for their exclusive events, whereby the common term z:

$$-|z_{n_T}|^2$$

is eliminated beforehand.

An embodiment of semi-rings in the Max-Log domain is adopted in the ninth working example of the present invention, and the maximum conditional probability, i.e., the metric maximum value, of each candidate is taken as the maximum probability event.

In 16 QAM, four bits are assigned to one signal point, resulting in the expression:

$$x_{n_T} = (\alpha_{n_T} \beta_{n_T} \gamma_{n_T} \delta_{n_T})$$

In addition, as shown in FIG. 8, each signal point can be divided among: a group of outer signal points in which signal points are in an outer circle; a group of inner signal points in which signal points are on an inner circle; a group of $\pm\tan^{-1}(1/3)(\mod \pi)$ signal points in which signal points are $\pm\tan^{-1}(1/3)$ with respect to the horizontal axis; and a group of $\pm\tan^{-1}(3)$ signal points in which signal points are $\pm\tan^{-1}(3)$ with respect to the horizontal axis.

The metric calculation in each of these groups is:

$$z_{n_T} \cdot r^*_{n_T n_T} = C + jD, |r_{n_T n_T}|^2$$
$$= E \Rightarrow -|r_{n_T n_T}|^2 \cdot 18 + z_{n_T} \cdot r^*_{n_T n_T} \cdot 3 \cdot (a - jb) +$$
$$z^*_{n_T} \cdot r_{n_T n_T} \cdot 3 \cdot (a + jb)$$
$$= -|r_{n_T n_T}|^2 \cdot 18 + 6 \cdot C \cdot a + 6 \cdot D \cdot b$$
$$\Rightarrow (\pm C \pm D - 3E) \cdot 3$$

for outer signal points ($3^2+3^2=18$) where $a=\pm 1$ and $b=\pm 1$;

$$\Rightarrow -|r_{n_T n_T}|^2 \cdot 2 + z_{n_T} \cdot r^*_{n_T n_T} \cdot (a - jb) +$$
$$z^*_{n_T} \cdot r_{n_T n_T} \cdot (a + jb)$$
$$= -|r_{n_T n_T}|^2 \cdot 2 + 2 \cdot C \cdot a + 2 \cdot D \cdot b$$
$$\Rightarrow (\pm C \pm D - E)$$

for inner signal points ($1^2+1^2=2$);

$$\Rightarrow -|r_{n_T n_T}|^2 \cdot 10 + z_{n_T} \cdot r^*_{n_T n_T} \cdot (3 \cdot a - jb) + z^*_{n_T} \cdot r_{n_T n_T} \cdot (3 \cdot a + jb) =$$
$$-|r_{n_T n_T}|^2 \cdot 10 + 6 \cdot C \cdot a + 2 \cdot D \cdot b \Rightarrow (\pm 3C \pm D - 5E)$$

for $\pm\tan^{-1}(1/3)(\mod \pi)$ signal points ($3^2+1^2=10$); and $$\Rightarrow -|r_{n_T n_T}|^2 \cdot 10 + z_{n_T} \cdot r^*_{n_T n_T} \cdot (a - j3 \cdot b) + z^*_{n_T} \cdot r_{n_T n_T} \cdot (a + j3 \cdot b) =$$
$$-|r_{n_T n_T}|^2 \cdot 10 + 2 \cdot C \cdot a + 6 \cdot D \cdot b \Rightarrow (\pm C \pm 3D - 5E)$$

for $\pm\tan^{-1}(3)$ signal points ($1^2+3^2=10$).

Because an embodiment of semi-rings in the Max-Log domain is adopted, the maximum conditional probability, i.e., the metric maximum value and maximum probability event of each candidate, in other words, the transmission sequence at this time:

$$x_{n_T} = (\alpha_{n_T} \beta_{n_T} \gamma_{n_T} \delta_{n_T})$$

is selected from all sets obtained by the above metric calculation. Although explanation has regarded a case of narrowing down to a single candidate for each bit in the above-described example, a similar means can of course be devised for narrowing down to a plurality of candidates by simplified estimation.

maximum events (=maximum in below);

$$\begin{cases} \text{bit conditional maximum events; } x_{n_T} = (1, x, x, x) \\ \quad \text{maximum metrics; } L_{n_T,1}(\text{i.e.} \pm C \pm D - E) \\ \text{bit conditional maximum exlusive events; } x_{n_T} = (0, x, x, x) \\ \quad \text{maximum metrics; } L_{n_T,\bar{1}}(\text{i.e.} \pm C \pm D - E) \end{cases}$$

$$\begin{cases} \text{bit conditional maximum events; } x_{n_T} = (x, 1, x, x) \\ \quad \text{maximum metrics; } L_{n_T,2}(\text{i.e.} \pm C \pm D - E) \\ \text{bit conditional maximum exlusive events; } x_{n_T} = (x, 0, x, x) \\ \quad \text{maximum metrics; } L_{n_T,\bar{2}}(\text{i.e.} \pm C \pm D - E) \end{cases}$$

$$\begin{cases} \text{bit conditional maximum events; } x_{n_T} = (x, x, 1, x) \\ \quad \text{maximum metrics; } L_{n_T,3}(\text{i.e.} \pm 3C \pm D - 5E) \\ \text{bit conditional maximum exlusive events; } x_{n_T} = (x, x, 0, x) \\ \quad \text{maximum metrics; } L_{n_T,\bar{3}}(\text{i.e.} \pm C \pm 3D - 5E) \end{cases}$$

$$\begin{cases} \text{bit conditional maximum events; } x_{n_T} = (x, x, x, 1) \\ \quad \text{maximum metrics; } L_{n_T,4}(\text{i.e.}3(\pm C \pm D - 3E)) \\ \text{bit conditional maximum exlusive events; } x_{n_T} = (x, x, x, 0) \\ \quad \text{maximum metrics; } L_{n_T,\bar{4}}(\text{i.e.} \pm C \pm D - E) \end{cases}$$

In Step 1, the above result becomes:

$$f(x_i = a \mid Z_{n_T:m}) = \bigoplus_{x_m \in A} \ldots \bigoplus_{x_{n_T} \in A} \bigoplus_{j=m}^{n_T} f(Z_j \mid X_{n_T:j \text{ at } x_i = a})$$

However, because the division of groups and the division of the product of conditional probabilities are the same in this working example, the following equation is obtained:

$$f(x_i = a \mid Z_{n_T:n_T}) = \bigoplus_{x_{n_T} \in A} f(Z_{n_T} \mid X_{n_T:n_T \text{ at } x_i = a})$$

The characteristic point of this process is the use of only addition and subtraction to obtain all combinations, whereby a lower degree of complexity is realized.

The process of Step 2 is carried out by the metric process:

$M_{n_T-1}$:

$$-|z_{n_T-1} - r_{n_T-1,n_T-1} \cdot x_{n_T-1} - r_{n_T-1,n_T} \cdot x_{n_T}|^2 =$$
$$-\{(z_{n_T-1} - r_{n_T-1,n_T} \cdot s_{n_T}) - r_{n_T-1,n_T-1} \cdot x_{n_T-1}\} \cdot$$
$$\{(z_{n_T-1} - r_{n_T-1,n_T} \cdot s_{n_T})^* - r^*_{n_T-1,n_T-1} \cdot x^*_{n_T-1}\} =$$
$$-|z_{n_T-1} - r_{n_T-1,n_T} \cdot s_{n_T}|^2 - |r_{n_T-1,n_T-1}|^2 \cdot |x_{n_T-1}|^2 +$$
$$(z_{n_T-1} - r_{n_T-1,n_T} \cdot s_{n_T})^* - r^*_{n_T-1,n_T-1} \cdot x^*_{n_T-1} +$$
$$(z_{n_T-1} - r_{n_T-1,n_T} \cdot s_{n_T})^* - r_{n_T-1,n_T-1} \cdot x_{n_T-1} \Rightarrow$$
$$-|r_{n_T-1,n_T-1}|^2 \cdot |x_{n_T-1}|^2 + (z_{n_T-1} - r_{n_T-1,n_T} \cdot s_{n_T}) - r^*_{n_T-1,n_T-1} \cdot$$
$$x^*_{n_T-1} + (z_{n_T-1} - r_{n_T-1,n_T} \cdot s_{n_T})^* - r_{n_T-1,n_T-1} \cdot x_{n_T-1}$$

for each of the maximum probability events of the preceding stage, i.e., the bit conditional maximum event for each bit:

$$x_{n_T} = (\alpha_{n_T} \beta_{n_T} \gamma_{n_T} \delta_{n_T})$$

and the maximum exclusive events. It is of course also possible to devise a similar means when using candidates that have been limited to a plurality of events by simplified estimation.

In this case, the soft determination output of the final target bits is an LLR, and in a metric-base calculation, the soft determination output is the difference between the metrics for the target bits and the metrics for the exclusive events, and as a result, the common term z0:

$$-|z_{n_T-1} - r_{n_T-1,n_T} \cdot s_{n_T}|^2$$

is eliminated in advance.

In the tenth embodiment of the present invention, as in the above-described configuration, the embodiment of semi-rings in the Max-Log domain is adopted, and as a result, the maximum conditional probability, i.e., the metric maximum value, of each candidate is therefore taken as the maximum probability event.

In the same way, four bits for one signal point in 16 QAM are represented as:

$$x_{n_T-1} = (\alpha_{n_T-1}, \beta_{n_T-1}, \gamma_{n_T-1}, \delta_{n_T-1})$$

However, because this example takes a case of limiting to a single candidate of only the maximum value, the following representation is adopted to clarify that this is a signal point that is based on the maximum probability event of the preceding stage:

$$(x_{n_T-1}|x_{n_T}) = (\alpha_{n_T-1}, \beta_{n_T-1}, \gamma_{n_T-1}, \delta_{n_T-1}|x_{n_T})$$

In the preceding stage, the bit conditional maximum events for each bit and their maximum exclusive events are determined, and the above-described metric process is therefore carried out for each of the events. In other words, calculations are carried out for all of:

$$(\alpha_{n_T-1}, \beta_{n_T-1}, \gamma_{n_T-1}, \delta_{n_T-1}|1,x,x,x), (\alpha_{n_T-1}, \beta_{n_T-1}, \gamma_{n_T-1}, \delta_{n_T-1}|0,x,x,x)$$

$$(\alpha_{n_T-1}, \beta_{n_T-1}, \gamma_{n_T-1}, \delta_{n_T-1}|x,1,x,x), (\alpha_{n_T-1}, \beta_{n_T-1}, \gamma_{n_T-1}, \delta_{n_T-1}|x,0,x,x)$$

$$(\alpha_{n_T-1}, \beta_{n_T-1}, \gamma_{n_T-1}, \delta_{n_T-1}|x,x,1,x), (\alpha_{n_T-1}, \beta_{n_T-1}, \gamma_{n_T-1}, \delta_{n_T-1}|x,x,0,x)$$

$$(\alpha_{n_T-1}, \beta_{n_T-1}, \gamma_{n_T-1}, \delta_{n_T-1}|x,x,x,1), (\alpha_{n_T-1}, \beta_{n_T-1}, \gamma_{n_T-1}, \delta_{n_T-1}|x,x,x,0)$$

A non-conditional maximum event necessarily exists among these condition events.

As shown in FIG. 8, each signal point is divided among: a group of outer signal points in which signal points are on an outer circle; a group of inner signal points in which signal points are on an inner circle; a group of $\pm\tan^{-1}(1/3)(\mod \pi)$ signal points in which signal points are $\pm\tan^{-1}(1/3)$ with respect to the horizontal axis; and a group of $\pm\tan^{-1}(3)$ signal points in which signal points are $\pm\tan^{-1}(3)$ with respect to the horizontal axis.

The metric calculations in each of these groups are as follows:

outer signal point ($3^2 + 3^2 = 18$) $a = \pm 1, b = \pm 1$, $$(z_{n_T-1} - r_{n_T-1,n_T} \cdot s_{n_T}) \cdot r^*_{n_T-1,n_T-1} = C + jD, |r_{n_T-1,n_T-1}|^2 = E \Rightarrow -|r_{n_T-1,n_T-1}|^2 \cdot 18 + (z_{n_T-1} - r_{n_T-1,n_T} \cdot s_{n_T}) \cdot r^*_{n_T-1,n_T-1} \cdot 3 \cdot (a - jb) + (z_{n_T-1} - r_{n_T-1,n_T} \cdot s_{n_T})^* \cdot r_{n_T-1,n_T-1} \cdot 3 \cdot (a + jb) =$$

$$-|r_{n_T-1,n_T-1}|^2 \cdot 18 + 6 \cdot C \cdot a + 6 \cdot D \cdot b \Rightarrow$$

$$(\pm C \pm D - 3E) \cdot 3 \text{ inner signal point } (1^2 + 1^2 = 2) \Rightarrow$$

$$-|r_{n_T-1,n_T-1}|^2 \cdot 2 + (z_{n_T-1} - r_{n_T-1,n_T} \cdot s_{n_T}) \cdot r^*_{n_T-1,n_T-1} \cdot (a - jb) + (z_{n_T-1} - r_{n_T-1,n_T} \cdot s_{n_T})^* \cdot r_{n_T-1,n_T-1} \cdot (a + jb) =$$

$$-|r_{n_T-1,n_T-1}|^2 \cdot 2 + 2 \cdot C \cdot a + 2 \cdot D \cdot b \Rightarrow (\pm C \pm D - E) \pm$$

$$\tan^{-1}\left(\frac{1}{3}\right)(\text{mod}\pi) \text{ signal point } (3^2 + 1^2 = 10) \Rightarrow$$

$$-|r_{n_T-1,n_T-1}|^2 \cdot 10 +$$

$$(z_{n_T-1} - r_{n_T-1,n_T} \cdot s_{n_T}) \cdot r^*_{n_T-1,n_T-1} \cdot (3 \cdot a - jb) +$$

$$(z_{n_T-1} - r_{n_T-1,n_T} \cdot s_{n_T})^* \cdot r_{n_T-1,n_T-1} \cdot (3 \cdot a + jb) =$$

$$-|r_{n_T-1,n_T-1}|^2 \cdot 10 + 6 \cdot C \cdot a + 2 \cdot D \cdot b \Rightarrow$$

$$(\pm C \pm D - 5E) \pm \tan^{-1}(3)(\text{mod}\pi) \text{ signal}$$

$$\text{point } (1^2 + 3^2 = 10) \Rightarrow -|r_{n_T-1,n_T-1}|^2 \cdot 10 +$$

$$(z_{n_T-1} - r_{n_T-1,n_T} \cdot s_{n_T}) \cdot r^*_{n_T-1,n_T-1} \cdot (a - j3 \cdot b) +$$

$$(z_{n_T-1} - r_{n_T-1,n_T} \cdot s_{n_T})^* \cdot r_{n_T-1,n_T-1} \cdot (a + j3 \cdot b) =$$

$$-|r_{n_T-1,n_T-1}|^2 \cdot 10 + 2 \cdot C \cdot a + 6 \cdot D \cdot b \Rightarrow (\pm C \pm 3D - 5E)$$

Due to the adoption of the embodiment of semi-rings in the Max-Log domain, the maximum conditional probability, i.e., the metric maximum value and the maximum probability event of each candidate, or in other words, the transmission sequence at this time:

$$(x_{n_T-1}|x_{n_T}) = (\alpha_{n_T-1}, \beta_{n_T-1}, \gamma_{n_T-1}, \delta_{n_T-1}|x_{n_T})$$

is selected from all combinations obtained by the above metric calculations. Although the above explanation regards a case of narrowing down to a single candidate for each bit, a similar means can obviously be devised for a case of narrowing down to a plurality of candidates by simplified estimation.

If the non-conditional maximum event of the preceding stage in this case is assumed to be:

$$x_{n_T} = (x,1,x,x)$$

(when using candidates that have been narrowed down to plurality, each of these candidates is a condition event of the previous stage)

maximum events (=maximum in below);

$$\begin{cases} \text{bit conditional maximum events; } (x_{n_T-1}|x_{n_T}) = (1, x, x, x|x, 1, x, x) \\ \quad \text{maximum metrics; } L_{n_T-1,1,1}(\text{i.e.}(\pm C \pm D - 3E)3) \\ \text{bit conditional maximum exlusive events; } (x_{n_T-1}|x_{n_T}) = (0, x, x, x|x, 1, x, x) \\ \quad \text{maximum metrics; } L_{n_T-1,1,1}(\text{i.e.}(\pm C \pm D - 3E)3) \end{cases}$$

$$\begin{cases} \text{bit conditional maximum events; } (x_{n_T-1} \mid x_{n_T}) = (x, 1, x, x \mid x, 1, x, x) \\ \quad \text{maximum metrics; } L_{n_T-1,2}(\text{i.e.}(\pm C \pm D - 3E)3) \\ \text{bit conditional maximum exlusive events; } (x_{n_T-1} \mid x_{n_T}) = (0, x, x, x \mid x, 1, x, x) \\ \quad \text{maximum metrics; } L_{\overline{n_T-1,2}}(\text{i.e.}(\pm C \pm D - 3E)3) \end{cases}$$

$$\begin{cases} \text{bit conditional maximum events; } (x_{n_T-1} \mid x_{n_T}) = (x, x, 1, x \mid x, 1, x, x) \\ \quad \text{maximum metrics; } L_{n_T-1,3}(\text{i.e.}\pm 3C \pm D - 5E) \\ \text{bit conditional maximum exlusive events; } (x_{n_T-1} \mid x_{n_T}) = (x, x, 0, x \mid x, 1, x, x) \\ \quad \text{maximum metrics; } L_{\overline{n_T-1,3}}(\text{i.e.}\pm C \pm 3D - 5E) \end{cases}$$

$$\begin{cases} \text{bit conditional maximum events; } (x_{n_T-1} \mid x_{n_T}) = (x, x, x, 1 \mid x, 1, x, x) \\ \quad \text{maximum metrics; } L_{n_T-1,4}(\text{i.e.}3(\pm C \pm D - 3E)) \\ \text{bit conditional maximum exlusive events; } (x_{n_T-1} \mid x_{n_T}) = (x, x, x, 0 \mid x, 1, x, x) \\ \quad \text{maximum metrics; } L_{\overline{n_T-1,4}}(\text{i.e.}\pm C \pm D - E) \end{cases}$$

In addition, for events for which target bits exist in the preceding stage, the maximum metrics that take these events as conditions are selected as follows:

(x,x,x,x|1,x,x,x), (x,x,x,x|0,x,x,x)

(x,x,x,x|x,1,x,x), (x,x,x,x|x,0,x,x)

(x,x,x,x|x,x,1,x), (x,x,x,x|x,x,0,x)

(x,x,x,x|x,x,x,1), (x,x,x,x|x,x,x,0)

Figure 9:
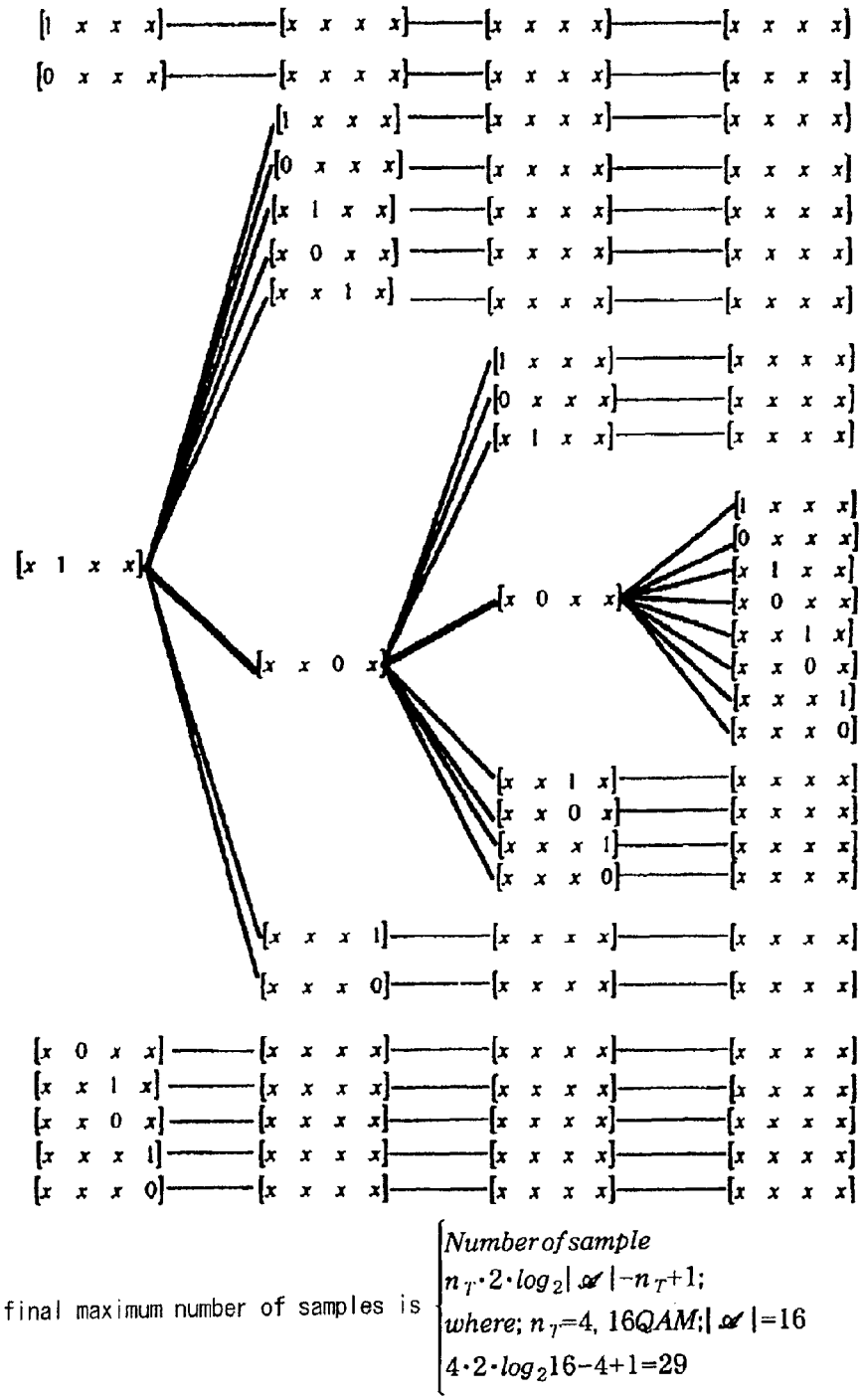
FIG. 9 shows the process of selecting a maximum conditional probability event in a "greedy" step process.

The process of selecting is shown in FIG. 9. The processes proceed from the left as Step 1, Step 2, and so on. Condition events have been abbreviated according to the convenience of depiction in FIG. 9. In this example, the non-conditional maximum events in each step take the following order:

(x,1,x,x)

(x,x,0,x)

(x,0,x,x)

(1,x,x,x)

Although the above explanation regards an example of limiting to a single candidate of only the maximum value in the interest of simplifying explanation, a similar means can obviously be designed for a case of limiting to a plurality of candidates by simplified estimation.

In Step 2, the result obtained above becomes:

$$f(x_i = a \mid Z_{n_T:m}, Z_{m-1:n}) = \bigoplus_{x_n \in A} \cdots \bigoplus_{x_{m-1} \in A} \bigoplus_{j=n}^{m-1} f(Z_j \mid X_{n_T:j\, at\, x_i=a})$$

However, because the division of groups and the division of the product of conditional probabilities in the case of this embodiment are the same:

$$f(x_i = a \mid Z_{n_T:n_T}, Z_{n_T-1:n_T-1}) = \bigoplus_{x_{n_T} \in A} f(Z_{n_T-1} \mid X_{n_T:n_T-1\, at\, x_i=a})$$

The characteristic feature of this process is the use of only addition and subtraction for obtaining all combinations and the attainment of a lower degree of complexity.

The processes of any Step "m" are next carried out for each of the maximum probability events of the preceding stage, i.e., the bit conditional maximum events $x_m = (\alpha_m, \beta_m, \gamma_m, \partial_m)$ and for the maximum exclusive events of each by the metric processes:

$M_m$:

$$-|z_m - r_{m,m} \cdot x_m - r_{m,m+1} \cdot x_{m+1} - \ldots - r_{m,n_T-1} \cdot x_{n_T-1} - r_{m,n_T} \cdot x_{n_T}|^2$$

$$= -\{(z_m - r_{m,m+1} \cdot s_{m+1} - \ldots - r_{m,n_T} \cdot s_{n_T}) - r_{m,m} \cdot x_m\} \cdot$$

$$\{(z_m - r_{m,m+1} \cdot s_{m+1} - \ldots - r_{m,n_T} \cdot s_{n_T})^* - r_{m,m}^* \cdot x_m^*\} =$$

$$-|z_m - r_{m,m+1} \cdot s_{m+1} - \ldots - r_{m,n_T} \cdot s_{n_T}|^2 - |r_{m,m}|^2 \cdot |x_m|^2 +$$

$$(z_m - r_{m,m+1} \cdot s_{m+1} - \ldots - r_{m,n_T} \cdot s_{n_T}) \cdot r_{m,m}^* \cdot x_m^* +$$

$$(z_m - r_{m,m+1} \cdot s_{m+1} - \ldots - r_{m,n_T} \cdot s_{n_T})^* \cdot r_{m,m} \cdot x_m \Rightarrow$$

$$-|r_{m,m}|^2 \cdot |x_m|^2 + (z_m - r_{m,m+1} \cdot s_{m+1} - \ldots - r_{m,n_T} \cdot s_{n_T}) \cdot$$

$$r_{m,m}^* \cdot x_m^* + (z_m - r_{m,m+1} \cdot s_{m+1} - \ldots - r_{m,n_T} \cdot s_{n_T})^* \cdot r_{m,m} \cdot x_m$$

A similar means can of course be devised when using candidates that have been limited to a plurality of events by simplified estimation.

In this case, the soft determination output of final target bits is LLR, and the soft determination output in a metric-base operation is the difference between the metrics for target bits and metrics for the exclusive events of these target bits. The common term:

$$-|z_m - r_{m,m+1} \cdot s_{m+1} - \ldots - r_{m,n_T} \cdot s_{n_T}|^2$$

is eliminated in advance.

The eleventh working example of the present invention adopts the embodiment of the semi-rings in the Max-Log domain as described above, and the maximum conditional probabilities of each candidate, i.e., the metric maximum values, are taken as the maximum probability events.

In addition, as described in the foregoing explanation, the four bits for one signal point in 16 QAM are represented as $xm = (\alpha_m, \beta_m, \gamma_m, \partial_m)$, but because this explanation takes a case of limiting to a single candidate of only the maximum value, the following representation is adopted to clarify that this is a signal point based on the maximum probability event of the preceding stage:

ti $(x_m|X_{n_T:m+1}) = (\alpha_m, \beta_m, \gamma_m, \delta_m | X_{n_T:m+1})$

During the interval up to the preceding stage, the bit conditional maximum event for each bit and the maximum exclusive event for these bits are determined, and the above-described metric process is therefore carried out for each of the events. In other words, taking the state of Step 3 as an example, calculations are carried out for all of:

$(\alpha_{n_T-2},\beta_{n_T-2},\gamma_{n_T-2},\delta_{n_T-2}|1,x,x,x, x,x,x,x), (\alpha_{n_T-2},\beta_{n_T-2}, \gamma_{n_T-2},\delta_{n_T-2}|0,x,x,x, x,x,x,x)$ $(\alpha_{n_T-2},\beta_{n_T-2},\gamma_{n_T-2},\delta_{n_T-2}|x,1,x,x, x,x,x,x), (\alpha_{n_T-2},\beta_{n_T-2}, \gamma_{n_T-2},\delta_{n_T-2}|x,0,x,x, x,x,x,x)$ $(\alpha_{n_T-2},\beta_{n_T-2},\gamma_{n_T-2},\delta_{n_T-2}|x,x,1,x, x,x,x,x), (\alpha_{n_T-2},\beta_{n_T-2}, \gamma_{n_T-2},\delta_{n_T-2}|x,x,0,x, x,x,x,x)$ $(\alpha_{n_T-2},\beta_{n_T-2},\gamma_{n_T-2},\delta_{n_T-2}|x,x,x,1, x,x,x,x), (\alpha_{n_T-2},\beta_{n_T-2}, \gamma_{n_T-2},\delta_{n_T-2}|x,x,x,0, x,x,x,x)$ In addition, a non-conditional maximum event necessarily exists among these condition events.

As shown in FIG. 8, each signal point is divided among: a group of outer signal points having signal points on an outer circle; a group of inner signal points having signal points on an inner circle; a group of $\pm\tan^{-1}(1/3)(\bmod \pi)$ signal points in which signal points are $\pm\tan^{-1}(1/3)$ with respect to the horizontal axis, and a group of $\pm\tan^{-1}(3)$ signal points in which signal points are $\pm\tan^{-1}(3)$ with respect to the horizontal axis.

The metric calculations in each of the groups are:

outer signal point $(3^2 + 3^2 = 18)$ $a = \pm 1, b = \pm 1$, $$(z_m - r_{m,m+1} \cdot s_{m+1} - \ldots - r_{m,n_T} \cdot s_{n_T}) \cdot r^*_{m,m} = C + jD,$$

$$|r_{m,n}|^2 = E \Rightarrow -|r_{m,n}|^2 \cdot 18 +$$

$$(z_m - r_{m,m+1} \cdot s_{m+1} - \ldots - r_{m,n_T} \cdot s_{n_T}) \cdot r^*_{m,m} \cdot 3 \cdot (a - jb) +$$

$$(z_m - r_{m,m+1} \cdot s_{m+1} - \ldots - r_{m,n_T} \cdot s_{n_T})^* \cdot r_{m,m} \cdot 3 \cdot (a + jb) =$$

$$-|r_{m,n}| \cdot 18 + 6 \cdot C \cdot a + 6 \cdot D \cdot b \Rightarrow (\pm C \pm D - 3E) \cdot 3$$

inner signal point $(1^2 + 1^2 = 2) \Rightarrow -|r_{m,n}|^2 \cdot 2 +$ $$(z_m - r_{m,m+1} \cdot s_{m+1} - \ldots - r_{m,n_T} \cdot s_{n_T}) \cdot r^*_{m,m} \cdot (a - jb) +$$

$$(z_m - r_{m,m+1} \cdot s_{m+1} - \ldots - r_{m,n_T} \cdot s_{n_T})^* \cdot r_{m,m} \cdot (a + jb) =$$

$$-|r_{m,m}|^2 \cdot 2 + 2 \cdot C \cdot a + 2 \cdot D \cdot b \Rightarrow (\pm 3C \pm D - E) \pm \tan^{-1}\left(\frac{1}{3}\right)$$

-continued $(\bmod \pi)$ signal point $(3^2 + 1^2 = 10) \Rightarrow -|r_{m,n}|^2 \cdot 10 +$ $$(z_m - r_{m,m+1} \cdot s_{m+1} - \ldots - r_{m,n_T} \cdot s_{n_T}) \cdot r^*_{m,m} \cdot (3 \cdot a - jb) +$$

$$(z_m - r_{m,m+1} \cdot s_{m+1} - \ldots - r_{m,n_T} \cdot s_{n_T})^* \cdot r_{m,m} \cdot (3 \cdot a + jb) =$$

$$-|r_{m,m}|^2 \cdot 10 + 6 \cdot C \cdot a + 2 \cdot D \cdot b \Rightarrow (\pm C \pm D - 5E) \pm \tan^{-1}(3)$$

$(\bmod \pi)$ signal point $(1^2 + 3^2 = 10) \Rightarrow -|r_{m,n}|^2 \cdot 10 +$ $$(z_m - r_{m,m+1} \cdot s_{m+1} - \ldots - r_{m,n_T} \cdot s_{n_T}) \cdot r^*_{m,m} \cdot (a - j3b) +$$

$$(z_m - r_{m,m+1} \cdot s_{m+1} - \ldots - r_{m,n_T} \cdot s_{n_T})^* \cdot r_{m,m} \cdot (a + j3b) =$$

$$-|r_{m,m}|^2 \cdot 10 + 2 \cdot C \cdot a + 6 \cdot D \cdot b \Rightarrow (\pm C \pm 3D - 5E)$$

Due to the adoption of an embodiment of semi-rings in the Max-Log domain, the maximum conditional probability, i.e., the metric maximum value and maximum probability event of each candidate, in other words, the transmission sequence at this time:

$$(x_m|X_{n_T:m+1}) = (\alpha_m, \beta_m, \gamma_m, \delta_m|X_{n_T:m+1})$$

is selected from all combinations obtained by the above metric calculations. Although the foregoing explanation regards a case of narrowing down to a single candidate for each bit, a similar means can of course be devised when narrowing down to a plurality of candidates by means of simplified estimation.

If, for the convenience of explanation, this is described as the state of Step 3, the non-conditional maximum event up to the preceding stage is assumed to be:

$$x_{n_T} = (x, 1, x, x),$$

$$x_{n_T-1} = (x, x, x, 0, x)$$

Then, (when using candidates that have been narrowed down to a plurality, each of these candidates are condition events of the preceding stage):

maximum events( = maximum in below);

$\begin{cases} \text{bit conditional maximum events; } (x_{n_T-2} | X_{n_T:n_T-1}) = (1, x, x, x | x, 1, x, x, x, 0.x) \\ \qquad \text{maximum metrics; } L_{n_T-1,1}(\text{i.e.}(\pm C \pm D - 3E)3) \\ \text{bit conditional maximum exclusive events; } (x_{n_T-2} | X_{n_T:n_T-1}) = \\ \qquad (0, x, x, x | x, 1, x, x, x, 0.x) \\ \qquad \text{maximum metrics; } L_{n_T-1,\overline{1}}(\text{i.e.}(\pm C \pm D - 3E)3) \end{cases}$ $\begin{cases} \text{bit conditional maximum events; } (x_{n_T-2} | X_{n_T:n_T-1}) = (x, 1, x, x | x, 1, x, x, x, 0.x) \\ \qquad \text{maximum metrics; } L_{n_T-1,2}(\text{i.e.}(\pm C \pm D - 3E)3) \\ \text{bit conditional maximum exclusive events; } (x_{n_T-2} | X_{n_T:n_T-1}) = (x, 0, x, x | x, 1, x, x, x, 0.x) \\ \qquad \text{maximum metrics; } L_{n_T-1,\overline{2}}(\text{i.e.}(\pm C \pm D - 3E)3) \end{cases}$ $\begin{cases} \text{bit conditional maximum events; } (x_{n_T-2} | X_{n_T:n_T-1}) = (x, x, 1, x | x, 1, x, x, x, 0.x) \\ \qquad \text{maximum metrics; } L_{n_T-1,3}(\text{i.e.} \pm 3C \pm D - 5E) \\ \text{bit conditional maximum exclusive events; } (x_{n_T-2} | X_{n_T:n_T-1}) = (x, x, 0, x | x, 1, x, x, x, 0.x) \\ \qquad \text{maximum metrics; } L_{n_T-1,\overline{3}}(\text{i.e.} \pm C \pm 3D - 5E) \end{cases}$ $$\begin{cases} \text{bit conditional maximum events;} (x_{n_T-2} \mid X_{n_T:n_T-1}) = (x, x, x, 1 \mid x, 1, x, x\ x, x, 0.x) \\ \text{maximum metrics;} L_{n_T-1,4} (\text{i.e. } 3(\pm C \pm D - 3E)) \\ \text{bit conditional maximum exclusive events;} (x_{n_T-2} \mid X_{n_T:n_T-1}) = (x, x, x, 0 \mid x, 1, x, x\ x, x, 0.x) \\ \text{maximum metrics;} L_{n_T-1,\overline{4}} (\text{i.e. } \pm C \pm D - E) \end{cases}$$

In addition, for events for which target bits exist in the preceding stage, maximum metrics that take these events as conditions are selected as follows:

(x,x,x,x|1,x,x,x, x,x,x,x), (x,x,x,x|0,x,x,x, x,x,x,x)

(x,x,x,x|x,1,x,x, x,x,x,x), (x,x,x,x|x,0,x,x, x,x,x,x)

(x,x,x,x|x,x,1,x, x,x,x,x), (x,x,x,x|x,x,0,x, x,x,x,x)

(x,x,x,x|x,x,x,1, x,x,x,x), (x,x,x,x|x,x,x,0, x,x,x,x)

(x,x,x,x|x,x,x,x, 1,x,x,x), (x,x,x,x|x,x,x,x, 0,x,x,x)

(x,x,x,x|x,x,x,x, x,1,x,x), (x,x,x,x|x,x,x,x, x,0,x,x)

(x,x,x,x|x,x,x,x, x,x,1,x), (x,x,x,x|x,x,x,x, x,x,0,x)

(x,x,x,x|x,x,x,x, x,x,x,1), (x,x,x,x|x,x,x,x, x,x,x,0)

The process of selection is shown in FIG. 9. In the processes of Step 1, Step 2, Step 3, and so on from the left, the above example is the third case. In FIG. 9, some condition events are omitted according to the convenience of depiction. The non-conditional maximum events in each step of this example are:

(x,1,x,x)

(x,x,0,x)

(x,0,x,x)

(1,x,x,x)

Although the example here explained uses a single candidate of only the maximum value in the interest of simplifying the explanation, a similar means can of course be devised when using candidates that have been narrowed down to a plurality of events (transmission sequence) by means of simplified estimation.

In any Step m, and in Step 3 in this example, the results obtained by the foregoing process are:

$$f(x_i = a \mid Z_{n_T:m}, Z_{m-1:n}, Z_{n-1:1}) = \bigoplus_{x_1 \in A} \cdots \bigoplus_{x_{n-1} \in A} \bigoplus_{j=1}^{n-1} f(Z_j \mid X_{n_T:j \, at \, x_i = a})$$

However, because the division of groups and the division of the product of the conditional probabilities are the same in this example, the result is:

$$f(x_i = a \mid Z_{n_T:n_T}, Z_{n_T-1:n_T-1}, Z_{n_T-2:n_T-2}) = \bigoplus_{x_{n_T} \in A} f(Z_{n_T-2} \mid X_{n_T:n_T-2 \, at \, x_i = a})$$

The feature of this process is the use of only addition and subtraction for obtaining all of the combinations, and the lower degree of complexity thus achieved.

In the twelfth working example of the present invention, the LLR of target bits in spatial-multiplexed signal detection are found based on the bit conditional maximum metrics in the groups of each step that are obtained in this way. For example, in the case of a configuration that is completed up to Step 3, when finding LLR that is the soft determination output for:

$x_{n_T} = (1,x,x,x)$ based on the relation:

$f(x_i = a \mid Z) = \alpha \otimes \beta \otimes \gamma$ results in:

$f(x_{n_T} = (1, x, x, x) \mid Z) =$ $L_{n_T,1} \oplus L(x, x, x, x \mid 1, x, x, x) \oplus L(x, x, x, x \mid 1, x, x, x, x, x, x, x)$ In this case, $L(x, x, x, x \mid 1, x, x, x)$ is the maximum metric that takes as condition: the maximum probability event of the preceding stage in Step 2:

$x_{n_T} = (1,x,x,x)$ and $L(x, x, x, x \mid 1, x, x, x, x, x, x)$ is the maximum metric that takes as conditions: the maximum probability event in the stage before the preceding stage in Step 3:

$x_{n_T} = (1,x,x,x)$ and the maximum probability event in Step 3 that takes this as a condition:

$x_{n_T-1} = (x,x,x,x \mid 1,x,x,x)$

In the case of an embodiment of the Max-Log domain, the sum of maximum metrics α, β, and γ in groups of each step that has been calculated under the constraining conditions of the preceding stage is the $f(x_i = a \mid Z)$ that is sought, and thus can be calculated as:

$f(x_{n_T} = (1, x, x, x) \mid Z) =$ $L_{n_T,1} + L(x, x, x, x \mid 1, x, x, x) + L(x, x, x, x \mid 1, x, x, x, x, x, x, x)$ Next, for the exclusive event, which is:

$x_{n_T} = (0,x,x,x)$ yields:

$f(x_{n_T} = (0, x, x, x) \mid Z) = L_{n_T,\overline{1}} \oplus$ $L(x, x, x, x \mid 0, x, x, x) \oplus L(x, x, x, x \mid 0, x, x, x, x, x, x, x)$ Accordingly, $f(x_{n_T} = (0, x, x, x) \mid Z) =$ $L_{n_T,\overline{1}} + L(x, x, x, x \mid 0, x, x, x) + L(x, x, x, x \mid 0, x, x, x, x, x, x, x)$ As a result, the LLR that is the soft determination output for:

$$x_{n_T}=(1,x,x,x)$$

is obtained from:

$$f(x_{n_T} = (0, x, x, x) | Z) - f(x_{n_T} = (0, x, x, x) | Z) =$$
$$(L_{n_T,1} + L(x, x, x, x | 1, x, x, x) + L(x, x, x, x | 1, x, x, x, x, x, x, x)) -$$
$$(L_{n_T,\overline{1}} + L(x, x, x, x | 0, x, x, x) + L(x, x, x, x | 0, x, x, x, x, x, x, x)) =$$
$$(L_{n_T,1} - L_{n_T,\overline{1}}) + (L(x, x, x, x | 1, x, x, x) - L(x, x, x, x | 0, x, x, x)) +$$
$$(L(x, x, x, x | 1, x, x, x, x, x, x) - L(x, x, x, x | 0, x, x, x, x, x, x))$$

In other words, by a step process in groups in which target bits exist, the target bits, the maximum conditional probabilities that take as conditions the maximum probability events up to the preceding stage, the exclusive events of these target bits, and the maximum conditional probabilities that take as conditions the maximum probability events up to the preceding stage are subjected to metric-base subtraction; and moreover, in groups that follow the groups in which target bits exist, the maximum conditional probabilities that take as conditions the maximum probability events that contain target bits up to the preceding stage and the maximum conditional probabilities that take as conditions the maximum probability events that contain exclusive events of these target bits are subjected to metric-base subtraction; and the sum total of these values is taken as the LLR that is the soft determination output of the target bits. In the case of this example, moreover, the inclusion of target bits in the process of Step 1 eliminates the need to take maximum probability events up to the preceding stage as conditions in groups in which target bits exist.

Alternatively, when a plurality of events (transmission sequence) that have been narrowed down in advance by simplified estimation are taken as conditions, in the case of a configuration that is completed by Step 3, as in the above-described case, when seeking the LLR that is the soft determination output for:

$$x_{n_T}=(1,x,x,x)$$

the relation:

$$f(x_i=a|Z)=\alpha \otimes \beta \otimes \gamma$$

yields the following:

$$f(x_{n_T-1} = (x, x, 1, x) | Z) =$$
$$L_{n_T-1,3} \otimes L(x, x, x, x | x, 1, x, x, x, x, 1, x)$$

In this case, "'" indicates results obtained based on the plurality of events (transmission sequence) that have been estimated in advance by simplified estimation, and L(x', x', x', x'|1, x', x', x') is the metric that takes as condition the probability events of the preceding stage in Step 2:

$$x'_{n_T}=(1,x',x',x')$$

and L(x', x', x', x'|1, x', x', x', x', x', x', x') is the metric that takes as conditions: the probability events of the preceding stage in Step 3:

$$x'_{n_T}=(1,x',x',x')$$

and the probability events of the preceding stage in Step 3 that takes this as conditions:

$$x'_{n_T-1}=(x',x',x',x'|1,x',x',x')$$

In the case of an embodiment of the Max-Log domain, the sum of maximum metrics α, β, and γ in groups of each step that has been calculated under the constraining conditions of the preceding stage is the f(xi=a|Z) that is sought, and can therefore be calculated as:

$$f\begin{pmatrix} x'_{n_T-1} = \\ (1, x'x'x') | Z \end{pmatrix} = L'_{n_T,1} + L(x', x', x', x' | 1, x', x', x') +$$
$$L(x', x', x', x' | 1, x', x', x', x', x', x')$$

Next, for the exclusive event, which is:

$$x'_{n_T}=(0,x',x',x')$$

the calculation is:

$$f\begin{pmatrix} x'_{n_T} = \\ (0, x'x'x') | Z \end{pmatrix} = L'_{n_T,\overline{1}} \otimes L(x', x', x', x' | 0, x', x', x') \otimes$$
$$L(x', x', x', x' | 0, x', x', x', x', x', x')$$

As a result, the following calculation is obtained:

$$f\begin{pmatrix} x'_{n_T} = \\ (0, x'x'x') | Z \end{pmatrix} = L'_{n_T,\overline{1}} + L(x', x', x', x' | 0, x', x', x') +$$
$$L(x', x', x', x' | 0, x', x', x', x', x', x')$$

Consequently, the LLR of the soft determination output for:

$$x'_{n_T}=(1,x',x',x')$$

is obtained from:

$$f(x'_{n_T} = (1, x'x'x') | Z) - f(x'_{n_T} = (0, x'x'x') | Z) =$$
$$(L'_{n_T,1} + L(x', x', x', x' | 1, x', x',$$
$$x' + L(x', x', x', x' | 1, x', x', x', x, x, 1, x)) -$$
$$(L'_{n_T,\overline{1}} + L(x', x', x', x' | 0, x', x', x') + L(x', x', x', x' | 0, x', x', x'),$$
$$x', x', x', x')) = (L'_{n_T,1} - L'_{n_T,\overline{1}}) +$$
$$(L(x', x', x', x' | 1, x', x', x') - L(x', x', x', x' | 0, x', x', x'))$$
$$(L(x', x', x', x' | 1, x', x', x', x', x', x', x') -$$
$$L(x', x', x', x' | 0, x', x', x', x', x', x', x'))$$

In other words, in a step process in groups in which target bits exist, the conditional probabilities that take as conditions probability events that have been obtained based on target bits and a plurality of events (transmission sequence) that have been estimated in advance by simplified estimation up to the preceding stage, and the conditional probabilities that take as conditions probability events that have been obtained based on the exclusive events and the plurality of events (transmission sequence) that have been estimated in advance by simplified estimation up to the preceding stage are subjected to metric-base subtraction; and in groups that follow groups in which target bits exist as well, the conditional probabilities that take as conditions the probability events that have been obtained based on the plurality of events (transmission sequence) that have been estimated in advance by simplified estimation up to the preceding stage, and conditional probabilities that take as conditions the probability events that contain the exclusive events are subjected to metric-base subtraction; and the sum totals of these are then taken as the LLR of the soft determination output of the target bits.

The thirteenth working example of the present invention shows a case in which target bits are contained in the groups of Step 2. For example, in the case of a configuration that is completed by Step 3, when seeking the LLR that is the soft determination output for:

$$x_{n_T}=(x,x,1,x)$$

the relation:

$$f(x_i=a|Z)=\alpha \otimes \beta \otimes \gamma$$

yields:

$$f(x_{n_T-1}=(x,x,1,x)|Z)=L_{n_T-1,3} \otimes L(x,x,x,x|x,1,x,x,x,x,1,x)$$

In this case, α in:

$$f(x_i=a|Z)=\alpha \otimes \beta \otimes \gamma$$

is common with the exclusive event, and is therefore eliminated in advance. In addition:

$$L_{n_T-1,3}$$

is the maximum metric in the bit conditional maximum event in Step 2:

$$(x_{n_T-1}|x_{n_T})=(x,x,1,x|x,1,x,x)$$

and the condition of the preceding stage:

$$x_{n_T}=(x,1,x,x)$$

is the non-conditional maximum probability event in Step 1. In addition, L(x, x, x, x|x, 1, x, x, x, 1, x) is the non-conditional maximum metric that takes as conditions: the non-conditional maximum probability events in the stage before the preceding stage in Step 3:

$$x_{n_T}=(x,1,x,x)$$

and the bit conditional maximum probability event of Step 2 that takes this as the condition:

$$x_{n_T-1}=(x,x,1,x|x,1,x,x)$$

In the case of an embodiment of the Max-Log domain, the sum of the maximum metrics α, β, and γ in the groups of each step that have been calculated under the constraining conditions of the preceding stage (in this case, this is the sum of β and γ because α is a common term and can therefore be eliminated) is f(xi=a|Z) that is sought, and as a result, can be calculated as:

$$f(x_{n_T-1}=(x,x,1,x)|Z)=L_{n_T-1,3}+L(x,x,x,x|x,1,x,x,x,x,1,x)$$

Next, for the exclusive event, which is:

$$x_{n_T-1}=(x,x,0,x)$$

the following result is obtained:

$$f(x_{n_T-1}=(x,x,0,x)|Z)=L_{n_T-1,3} \otimes L(x,x,x,x|x,1,x,x,x,x,0,x)$$

Accordingly:

$$f(x_{n_T-1}=(x,x,0,x)|Z)=L_{n_T-1,3}+L(x,x,x,x|x,1,x,x,x,x,0,x)$$

As a result, the LLR that is the soft determination output for:

$$x_{n_T-1}=(x,x,1,x)$$

is obtained by:

$$f(x_{n_T-1}=(x,x,1,x)|Z) - f(x'_{n_T}=(x,x,0,x)|Z) =$$
$$(L_{n_T-1,3} + L(x,x,x,x|x,1,x,x,x,x,1,x)) -$$
$$(L_{n_T-1,3} + L(x,x,x,x|x,1,x,x,x,x,0,x)) = (L_{n_T,1,3} - L'_{n_T-1,3}) +$$
$$(L(x,x,x,x|x,1,x,x,x,x,1,x) - L(x,x,x,x|x,1,x,x,x,x,0,x))$$

In other words, in the step process in groups in which target bits exist, the maximum conditional probabilities that take as conditions the target bits and the maximum probability events up to the preceding stage, the maximum conditional probabilities that take as conditions the exclusive events, and the maximum probability events up to the preceding stage are subjected to metric-base subtraction; and in groups that follow the groups in which target bits exist as well, the maximum conditional probabilities that take as conditions the maximum probability events that contain target bits up to the preceding stage, and maximum conditional probabilities that take as conditions the maximum probability events that contain the exclusive events are subjected to metric-base subtraction; and the sum total of each of these is taken as the LLR that is the soft determination output of the target bits.

Alternatively, when the plurality of events (transmission sequence) that have been narrowed down in advance by simplified estimation are taken as the conditions, in a configuration that is completed by Step 3 as in the above case with "'" indicating the results that have been obtained based on the plurality of events that have been estimated in advance by simplified estimation, when seeking the LLR that is the soft determination output for:

$$x'_{n_T}=(x',x',1,x')$$

the relation:

$$f(x_i=a|Z)=\alpha \otimes \beta \otimes \gamma$$

yields the following:

$$f\left(\begin{array}{c} x'_{n_T-1} = \\ (x', x', 1, x') | Z \end{array}\right) = L(x', x', x', x') \otimes$$
$$L'_{n_T-1,3} \otimes$$
$$L(x', x', x', x' | x', 1, x', x', x', x', 1, x')$$

In this case, the value:

$$L'_{n_T-1,3}$$

is the metric in the bit conditional event in Step 2:

$$(x'_{n_T-1}|x'_{n_T})=(x',x',1,x'|x',1,x',x')$$

and the condition of the preceding stage:

$$x'_{n_T-1}=(x',x',x',x')$$

is the probability event obtained based on the plurality of events (transmission sequence) estimated in advance by simplified estimation in Step 1. In addition, L(x', x', x', x'|x', x', x', x', x', x', 1, x') is the metric that takes as conditions: the probability event of the preceding stage in Step 3:

$$x'_{n_T}=(x',x',x',x')$$

and the bit conditional probability event in Step 2 that takes this a condition:

$$x'_{n_T-1}=(x',x',1,x'|x',x',x',x')$$

In the case of an embodiment of the Max-Log domain, the sum of the maximum metrics α, β, and γ in groups of each step that have been calculated under the constraining conditions of the preceding stage is f(xi=a|Z) that is sought, and therefore can be calculated as:

$$f\left(\begin{array}{c} x'_{n_T-1} = \\ (x', x', 1, x') \mid Z \end{array}\right) = L(x', x', x', x') +$$

$$L'_{n_T-1,3} +$$

$$L(x', x', x', x' \mid x', x', x', x', x', x', 1, x')$$

Next, for the exclusive event:

$$x'_{n_T-1} = (x', x', 0, x')$$

the following result is obtained:

$$f\left(\begin{array}{c} x'_{n_T-1} = \\ (x', x', 0, x') \mid Z \end{array}\right) = L(x', x', x', x') \otimes$$

$$L'_{n_T-1,3} \otimes$$

$$L(x', x', x', x' \mid x', x', x', x', x', x', 0, x')$$

Accordingly:

$$f\left(\begin{array}{c} x'_{n_T-1} = \\ (x', x', 0, x') \mid Z \end{array}\right) = L(x', x', x', x') \otimes$$

$$L'_{n_T-1,3} +$$

$$L(x', x', x', x' \mid x', x', x', x', x', x', 0, x')$$

As a result, the LLR that is the soft determination output for:

$$x'_{n_T-1} = (x', x', 1, x')$$

is obtained as:

$$f(x'_{n_T-1} = (x', x', 1, x') \mid Z) - f(x'_{n_T} = (x', x', 0, x') \mid Z) =$$

$$(L(x', x', x', x') + L'_{n_T-1,3} + L(x', x', x', x' \mid x', x', x',$$

$$x', x', x', 1, x')) - (L(x', x', x'x') + L'_{n_T-1,3} +$$

$$L(x', x', x', x' \mid x', x', x', x', x', x', 0, x')) =$$

$$(L(x', x', x', x') - L(x', x', x'x')) + (L'_{n_T-1,3} - L'_{n_T-1,3}) +$$

$$(L(x', x', x', x' \mid x', x', x', x', x', x', 1x') -$$

$$L(x', x', x', x' \mid x', x', x', x', x', x', 0, x'))$$

Here, the first term of the above equation:

(L(x',x',x',x')−L(x',x',x',x)')

is the difference between:

L(x',x',x',x')

that is used in finding:

$$f(x'_{n_T-1} = (x', x', 1, x') \mid Z)$$

and:

L(x',x',x',x')

that is used when finding:

$$f(x'_{n_T-1} = (x', x', 0, x') \mid Z)$$

In other words, in a step process in groups in which target bits exist: target bits, conditional probabilities that are obtained based on the plurality of events (transmission sequence) that have been narrowed down in advance by means of simplified estimation up to the preceding stage, the exclusive events of the target bits, and conditional probabilities that have been obtained based on the plurality of events (transmission sequence) that similarly have been narrowed down in advance by means of simplified estimation up to the preceding stage are subjected to metric-base subtraction; and in groups following groups in which target bits exist as well, conditional probabilities that take as conditions probability events that contain target bits up to the preceding stage, and conditional probabilities that take as conditions probability events that contain the exclusive events are subjected to metric-base subtraction; and the sum total of these values is then taken as the LLR that is the soft determination output of the target bits.

In the interest of simplifying the explanation of the above-described embodiment, the group division has been made equivalent to the division of the product of the conditional probabilities, but the embodiment can be similarly applied even when grouped by the product of a plurality of conditional probabilities.

Figure 10:
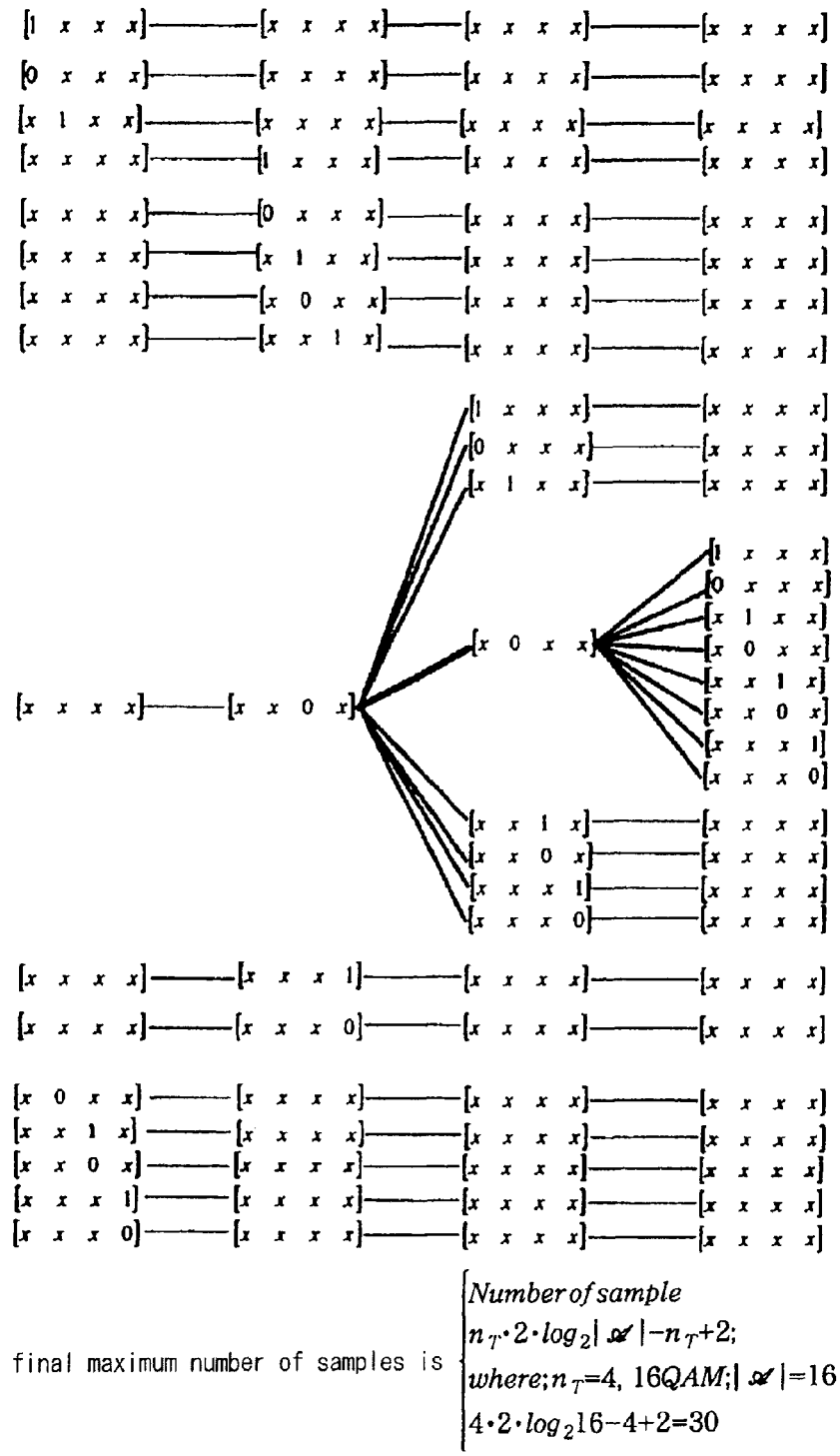
FIG. 10 shows the process of selecting a maximum conditional probability event when a group is composed of the product of a plurality of conditional probabilities in a "greedy" step process.

The fourteenth working example of the present invention is an example in which the product of the plurality of conditional probabilities shown in FIG. 10 is used in the initial stage. In the interest of simplifying the explanation of this example, a case is described of narrowing down candidates to the maximum value, but it goes without saying that a similar means can also be devised for a case of narrowing down to a plurality of candidates by means of simplified estimation. Describing the events of the initial stage according to the above-described notational system results in the following case:

Four bits are used for a single signal point in 16 QAM, and in the example shown in FIG. 10, two signal points are used as the process of Step 1, and this can be represented as:

$$(x_{n_T}, x_{n_T-1}) = ([\alpha_{n_T}, \beta_{n_T}, \gamma_{n_T}, \delta_{n_T}][\alpha_{n_T-1}, \beta_{n_T-1}, \gamma_{n_T-1}, \delta_{n_T-1}])$$

Accordingly, when target bits are contained within the next stage, the target of selection is:

(x,x,x,x|1,x,x,x, x,x,x,x), (x,x,x,x|0,x,x,x, x,x,x,x)

(x,x,x,x|x,1,x,x, x,x,x,x), (x,x,x,x|x,0,x,x, x,x,x,x)

(x,x,x,x|x,x,1,x, x,x,x,x), (x,x,x,x|x,x,0,x, x,x,x,x)

(x,x,x,x|x,x,x,1, x,x,x,x), (x,x,x,x|x,x,x,0, x,x,x,x)

(x,x,x,x|x,x,x,x, 1,x,x,x), (x,x,x,x|x,x,x,x, 0,x,x,x)

(x,x,x,x|x,x,x,x, x,1,x,x), (x,x,x,x|x,x,x,x, x,0,x,x)

(x,x,x,x|x,x,x,x, x,x,1,x), (x,x,x,x|x,x,x,x, x,x,0,x)

(x,x,x,x|x,x,x,x, x,x,x,1), (x,x,x,x|x,x,x,x, x,x,x,0)

and calculations are carried out for all of these targets of selection. A non-conditional maximum event necessarily exists among these condition events. This process is the same as the process of Step 3 when the above-described group division is made the same as the division of the product of conditional probabilities.

The process of selection of FIG. 10 is the processes of Step 1, Step 2, Step 3 from the left, and the above-described example is the process of Step 2 of the third column. In accordance with the constraints of the figure, FIG. 10 is shown with condition events omitted. The non-conditional maximum events in each step of this example are:

(x,1,x,x)

(x,x,0,x)

(x,0,x,x)

(1,x,x,x)

In addition, due to degeneracy, the number of samples is a number less than in the figure.

In the case of the fifteenth working example of the present invention, processing a plurality of antennas is carried out simultaneously in the initial stage, and to this extent, diversity gain is obtained, whereby the effect of error propagation upon the next and succeeding stages can be ameliorated.

If the above processes are summarized, the following points can be made:

(1) Groups in which there are bits that are target bits: In these groups in which there are bits that become the targets of estimation, i.e., target bits: target-bit conditional maximum conditional probabilities that take as conditions target bits and maximum probability events up to the preceding stage are detected in metric base, and exclusive-bit condition maximum conditional probabilities that take as conditions exclusive events for these target bits and the maximum probability events up to the preceding stage are detected in metric base.

(2) Succeeding groups: In succeeding groups, non-conditional bit maximum conditional probabilities that take as conditions the maximum probability events of preceding stages that contain target bits are detected in metric base, and further, non-conditional bit maximum conditional probabilities that take as conditions maximum probability events of preceding stages that contain exclusive events for target bits are detected in metric base.

(3) Similarly, in groups in stages that follow groups in which there are bits that are targets: Non-conditional bit maximum conditional probabilities that take as conditions maximum probability events up to the preceding stage are detected in metric base, and further, non-conditional bit maximum conditional probabilities that take as conditions maximum probability events of (1) that contain exclusive events for target bits and maximum probability events up to the preceding stage that are detected together with these maximum probability events of (1) are detected in metric base.

(4) Groups in stages that follow: A means for subsequently repeating (3) up to the groups of the final stage.

(5) After (3) and (4) are completed, the LLR of target bits is detected by first subjecting to metric-base subtraction: target bits in (1), maximum conditional probabilities that take as conditions the maximum probability events up to the preceding stage, exclusive events for the target bits, and maximum conditional probabilities that take as conditions the maximum probability events up to the preceding stage; then, in groups of stages that follow groups in which bits exist that are the targets of (2) to (4) as well, subjecting to metric-base subtraction: maximum conditional probabilities that take as conditions the maximum probability events up to the preceding stage, and maximum conditional probabilities that take as conditions maximum probability events up to the preceding stage that contains exclusive events for the target bits; and finally, taking the sum totals of these values as the LLR of the soft determination output of target bits.

In addition, although all values are subjected to metric calculations in groups that precede and succeed groups in which target bits exist in the above-described examples, a lower degree of complexity can be achieved by terminating within a suitable range, and such a form of use is also possible.

The spatial-multiplexed detection method of the present invention is also effective for achieving a lower degree of complexity when an iterative process is not used, and such a form of use can of course be suitably applied. Alternatively, if the above-described processes are summarized for a case of using as conditions a plurality of events (transmission sequence) that have been estimated in advance by simplified estimation:

(1) Groups in which there are bits that become targets: In groups in which bits exist that become targets exist as the targets of estimation based on a plurality of events (transmission sequence) that are narrowed down in advance by a simplified estimation, target bits and target-bit conditional probabilities that take as conditions probability events up to the preceding stage are detected in metric base, and further, the exclusive events for these target bits and exclusive-bit conditional probabilities that take as conditions the probability events up to the preceding stage are detected in metric base.

(2) Groups of succeeding stages: based on a plurality of events (transmission sequence) that have been narrowed down in advance by simplified estimation, in groups of succeeding stages, the non-conditional bit conditional probabilities that take as conditions probability events of preceding stages that contain target bits are detected in metric base, and further, conditional probabilities that take as conditions probability events of preceding stages that contain exclusive events for these target bits are detected in metric base.

(3) Similarly, based on a plurality of events (transmission sequence) that are narrowed down in advance by simplified estimation, in groups in stages that follow groups in which there are bits that become targets, conditional probabilities that take as conditions probability events up to the preceding stage are detected in metric base, and further, probability events of (1) that contain exclusive events for target bits and conditional probabilities that take as conditions probability events up to the preceding stage that are detected together with these probability events of (1) are detected in metric base.

(4) Groups of following stages: A means for, based on a plurality of events (transmission sequence) that have been narrowed down in advance by simplified estimation, repeating (3) up to groups of the subsequent final stage.

(5) After completion of (4), the LLR of target bits is detected by first subjecting to metric-base subtraction: the target bits in (1), the conditional probabilities that take as conditions the probability events up to the preceding stage, the exclusive events for these target bits, and the conditional probabilities that take as conditions probability events up to the preceding stage; then, in groups of stages that follow groups in which there are bits that are the targets of (2) to (4) as well, subjecting to metric-base subtraction: the conditional probabilities that take as conditions probability events up to the preceding stage, and conditional probabilities that take as conditions probability events up to the preceding stage that contains exclusive events for the target bits; and finally, taking sum totals of these values as the LLR that is the soft determination output of the target bits.

In addition, although all values in the above-described example were subjected to metric calculations in groups preceding and succeeding groups in which there are target bits, a lower degree of complexity can be achieved by terminating within a suitable range, and such a form of use is also possible.

Although the preceding explanation regards a method of lowering the degree of complexity that uses semi-rings that are used in the metric domain, when narrowing down to a single candidate for maximum values, resampling can also be used to achieve a further improvement in characteristics.

This resampling aims at a reduction of the propagation of errors that occur due to step processes by means of a greedy method, and as a result, obtains a set of bits that are the final targets of estimation and the above-described metric-base conditional probabilities that contain the exclusive events of these bits, and is realized by reselecting the bit-conditional maximum metrics from among this set.

The sixteenth working example of the present invention is a form for detecting LLR that is the soft determination output of target bits by a method similar to the above-described method for employing items selected as described above for exclusive events and using the difference of the two metrics. For example, in the case shown in FIG. 9, if the final degeneracy is ignored, a number of samples equal to:

$$n_T \cdot 2 \cdot \log_2 |A| - n_T + 1$$

can be obtained. In the same example, substituting:

$$n_T = 4, 16QAM; |A| = 16$$

yields the following number of samples:

$$4 \cdot 2 \cdot \log_2 16 - 4 + 1 = 29$$

and the maximum metric in the above-described conditions is resampled from this set.

In the seventeenth working example of the present invention, processing for a portion of the plurality of antennas is carried out simultaneously in the initial stage as described above and the effect of the propagation of error upon stages following the stage at which diversity gain is obtained is ameliorated. In FIG. 10, if final degeneracy is ignored, the number of samples that can be obtained is:

$$n_T \cdot 2 \cdot \log_2 |A| - n_T + 2$$

As described hereinabove, the substitution of:

$$n_T = 4, 16QAM; |A| = 16$$

results in the following number of samples:

$$4 \cdot 2 \cdot \log_2 16 - 4 + 2 = 30$$

Maximum metrics in the above-described conditions are resampled from this set.

A soft-input soft-output detection method that uses the spatial-multiplexed signal detection method of the present invention has been explained above. Explanation next regards a spatial and temporal iterative decoder that uses a soft-input soft-output detector and a soft-input soft-output decoder in spatial and temporal multiplexed signal separation.

Figure 11:
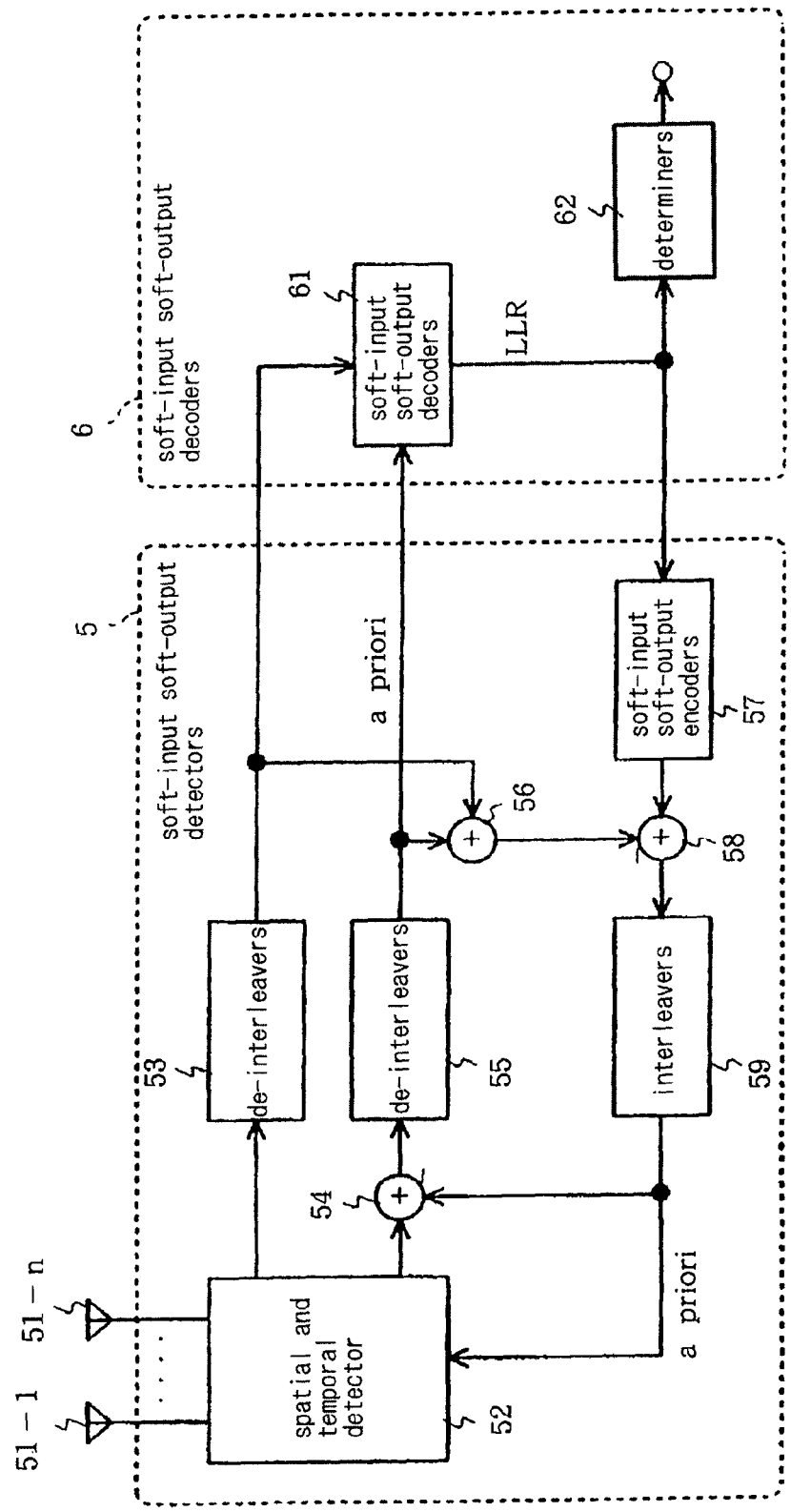
FIG. 11 is a block diagram showing the configuration of a spatial and temporal iterative decoder according to the $18^{th}$ working example of the present invention.

FIG. 11 is a block diagram showing the configuration of a spatial and temporal iterative decoder according to the eighteenth working example of the present invention. In FIG. 11, the spatial and temporal iterative decoder according to the eighteenth working example of the present invention is composed of soft-input soft-output detection unit 5 and soft-input soft-output decoding unit 6.

Soft-input soft-output detection unit 5 is composed of: antennas 51-1-51-n, spatial and temporal detector 52, de-interleavers 53 and 55, subtractors 54 and 58, adder 56, soft-input soft-output encoder 57, and interleaver 59; and soft-input soft-output decoding unit 6 is provided with soft-input soft-output decoder 61 and determiner 62.

Soft-input soft-output decoding unit 6 supplies as output the LLR for information bit sequences before encoding. Soft-input soft-output encoder 57 that is in soft-input soft-output decoding unit 5 receives this LLR as input and supplies as output LLR for the codeword sequences after encoding. Based on the LLR for these codewords after encoding, soft-input soft-output decoding unit 5 generates a priori information for spatial-multiplexed signal detection, and based on this a priori information, iterative decoding is executed between soft-input soft-output detection unit 5 and soft-input soft-output decoding unit 6 based on turbo principles.

Soft-input soft-output decoding unit 6 is a configuration that includes soft-input soft-output decoder 61, and the a priori input to soft-input soft-output decoder 61 effects subtraction upon the soft determination output of soft-input soft-output encoder 57 by means of subtractor 58 to form the a priori input to spatial and temporal detector 52 in soft-input soft-output detection unit 5. At this time, the intrinsic information effects subtraction by means of subtractor 58 and by way of adder 56.

In addition, the a priori input to spatial and temporal detector 52 acts in the form of subtraction upon the soft determination output of spatial and temporal detector 52 by means of subtractor 54 and forms the a priori input to soft-input soft-output decoder 61.

As shown in FIG. 2, interleaver 32 is between encoder 31 and constellation mapper 33 on the transmission side, and these components serve the important role of iterative decoding based on the turbo principle. In other words, as shown in FIG. 1, de-interleaver 3, which performs the reverse process of this interleaver 32 and interleaver 4, is inserted on the reception side, and by making the soft-input soft-output detection process and soft-input soft-output decoding process statistically independent, and making this extrinsic information and a priori, achieves a dramatic improvement in detection performance and decoding performance. This is a method that uses the so-called turbo principle, de-interleavers 53 and 55 and interleaver 59 shown in FIG. 11 performing this role.

In the case of the example shown in FIG. 11, the intrinsic information and a priori information are transferred separately from soft-input soft-output detection unit 5 to soft-input soft-output decoding unit 6, and de-interleavers 53 and 55 are therefore provided as two units. The LLR result that is finally obtained by means of the iterative process is subjected to hard determination by determiner 62 in soft-input soft-output decoding unit 6 and then supplied as data output.

Figure 12:
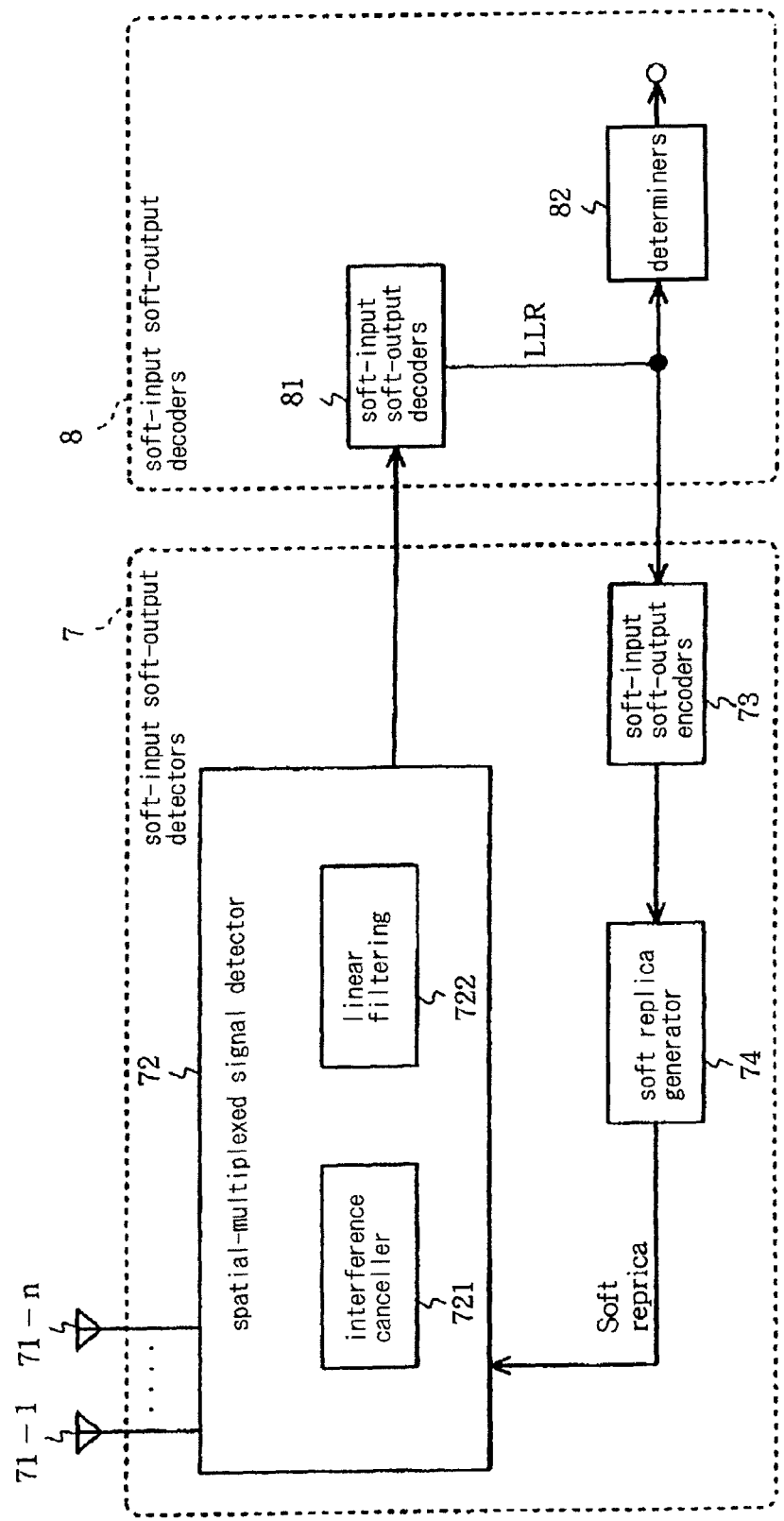
FIG. 12 is a block diagram showing the configuration of a spatial and temporal iterative decoder according to the $19^{th}$ working example of the present invention.

FIG. 12 is a block diagram showing the configuration of the spatial and temporal iterative decoder according to the nineteenth working example of the present invention. The spatial and temporal iterative decoder according to the nineteenth working example of the present invention is a spatial and temporal iterative decoder realized by a soft canceller and is of a configuration based on interference nulling by means of an interference canceller and linear filtering by means of soft replica instead of iterative decoding based on the turbo principle.

In FIG. 12, the spatial and temporal iterative decoder according to the nineteenth working example of the present invention is composed of soft-input soft-output detection unit 7 and soft-input soft-output decoding unit 8. Soft-input soft-output detection unit 7 is composed of antennas 71-1-71-n, spatial-multiplexed signal detector 72, soft-input soft-output encoder 73, and soft replica generator 74; interference canceller 721 and linear filtering 722 being provided in spatial-multiplexed signal detector 72. In addition, soft-input soft-output decoding unit 8 is provided with soft-input soft-output decoder 81 and determiner 82.

The present working example is not based on the original turbo principle for exchanging extrinsic information and therefore suffers from the problem that the improvement in characteristics realized by the iterative process is saturated by the number of iterations. Nevertheless, the present working example still has the advantage of enabling easy realization.

The spatial and temporal multiplexed signal separation in FIG. 12 is composed of: soft-input soft-output detection unit 7 that includes spatial-multiplexed signal detector (soft-input soft-output detector) 72, and soft-input soft-output decoding unit 8 that includes soft-input soft-output encoder 81.

Soft-input soft-output encoder 81 supplies LLR as output for information bit sequences before encoding. Soft-input soft-output encoder 73 is in soft-input soft-output detection unit 7, receives this LLR as input, and supplies as output LLR for the code word sequences after encoding.

Soft replica generator 74 generates soft replicas based on the LLR for the code word sequences and sends these soft replicas to spatial-multiplexed signal detector 72. Spatial-multiplexed signal detector 72 carries out canceling by interference canceller 721 based on the soft replicas that have been sent in, and carries out nulling by linear filtering 722 to separate the spatial-multiplexed signals.

Soft replica generator 74 converts the LLR for the codeword sequences from soft-input soft-output encoder 73 to soft replicas, and in the case of BPSK (Binary Phase Shift Keying), can realize this conversion from the relation:

$$E[xi]=(+1)\cdot p(xi=+1|y)+(-1)p(xi=-1|y)$$

In this case, placing the LLR for the codeword sequence at L(xi), obtains:

$$L(x_i) = \ln\frac{p(x_i = +1 \mid y)}{p(x_i = -1 \mid y)}$$

$$\exp[L(x_i)] = \frac{p(x_i = +1 \mid y)}{p(x_i = -1 \mid y)} = \frac{p(x_i = +1 \mid y)}{1 - p(x_i = +1 \mid y)}$$

$$\therefore p(x_i = +1 \mid y) = \frac{\exp[L(x_i)]}{1 + \exp[L(x_i)]}$$

Similarly:

$$\exp[L(x_i)] = \frac{p(x_i = +1 \mid y)}{p(x_i = -1 \mid y)} = \frac{1 - p(x_i = -1 \mid y)}{p(x_i = -1 \mid y)}$$

$$\therefore p(x_i = -1 \mid y) = \frac{1}{1 + \exp[L(x_i)]}$$

is obtained. Accordingly:

$$E[x_i] = (+1) \cdot p(x_i = +1 \mid y) + (-1) \cdot p(x_i = -1 \mid y)$$

$$= \frac{\exp[L(x_i)]}{1 + \exp[L(x_i)]} - \frac{1}{1 + \exp[L(x_i)]}$$

$$= \frac{\exp[L(x_i)] - 1}{\exp[L(x_i)] + 1}$$

Further, the soft replica E[xi] can be found from LLR [L(xi)] for the codeword sequence:

$$E[x_i] = \frac{\exp[L(x_i)] - 1}{\exp[L(x_i)] + 1}$$

$$= \frac{\exp\left[\frac{L(x_i)}{2}\right] - \exp\left[-\frac{L(x_i)}{2}\right]}{\exp\left[\frac{L(x_i)}{2}\right] + \exp\left[-\frac{L(x_i)}{2}\right]}$$

$$= \tanh\left(\frac{L(x_i)}{2}\right)$$

The above-described process is for a case of BPSK, but in the case of QPSK (Quadrature Phase Shift Keying), the use of E[a2i] and E[a2i+1] in a 2-bit structure results in the symbol replica:

$$E[xi]=E[a2i]+jE[a2i+1]$$

Alternatively, in the case of 16 QAM, the use of E[a4i], E[a4i+1], E[a4i+2], and E[a4i+3] in a 4-bit structure results in, for example, the mapping:

$$E[xi]=E[a4i]\cdot(2-E[a4i+2])+jE[a4i+1]\cdot(2-E[a4i+3])$$

whereby symbol replica E[xi] can be constructed.

By means of the above iterative canceling process, the LLR result that is finally obtained is subjected to hard determination by determiner 82 in soft-input soft-output decoding unit 8 and then supplied as data output.

Explanation next regards an example of the configuration of soft-input soft-output encoder that has been used in the above-described process.

The soft-input soft-output encoder is applied to soft determination data and is of the same structure as a transmission-side encoder such as encoder 31 shown in FIG. 2, and is therefore a device for executing addition that takes the constituent element q as modulo, i.e., a device that executes by LLR the calculation a1+a2 (mod q).

Figure 13:
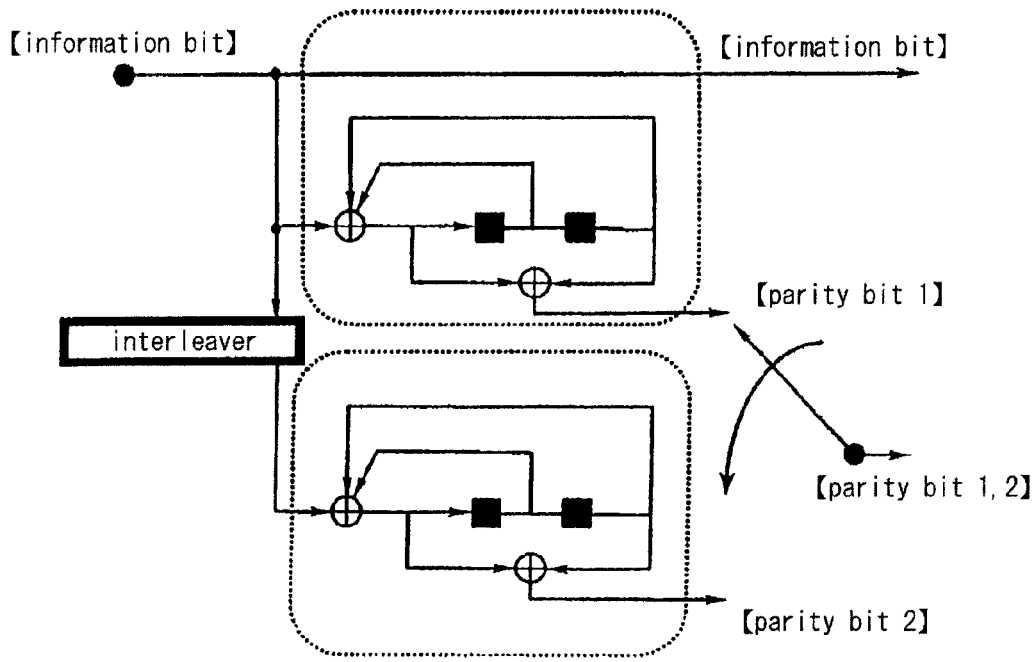
FIG. 13 shows an example of the configuration of the encoder according to the $20^{th}$ working example of the present invention.

FIG. 13 shows an example of the configuration of an encoder according to the twentieth working example of the present invention. In FIG. 13, an example of an encoder used on the transmission side is shown, and a method is shown for parallel connection by recursive systematic convolution that is used in turbo code.

In FIG. 13, one-bit signals are used, and the employed adder carries out addition with 2 as modulo and performs the calculation a1+a2 (mod 2). In other words, the encoder according to this working example can be easily realized by an EXCLUSIVE-OR operation.

Figure 14:
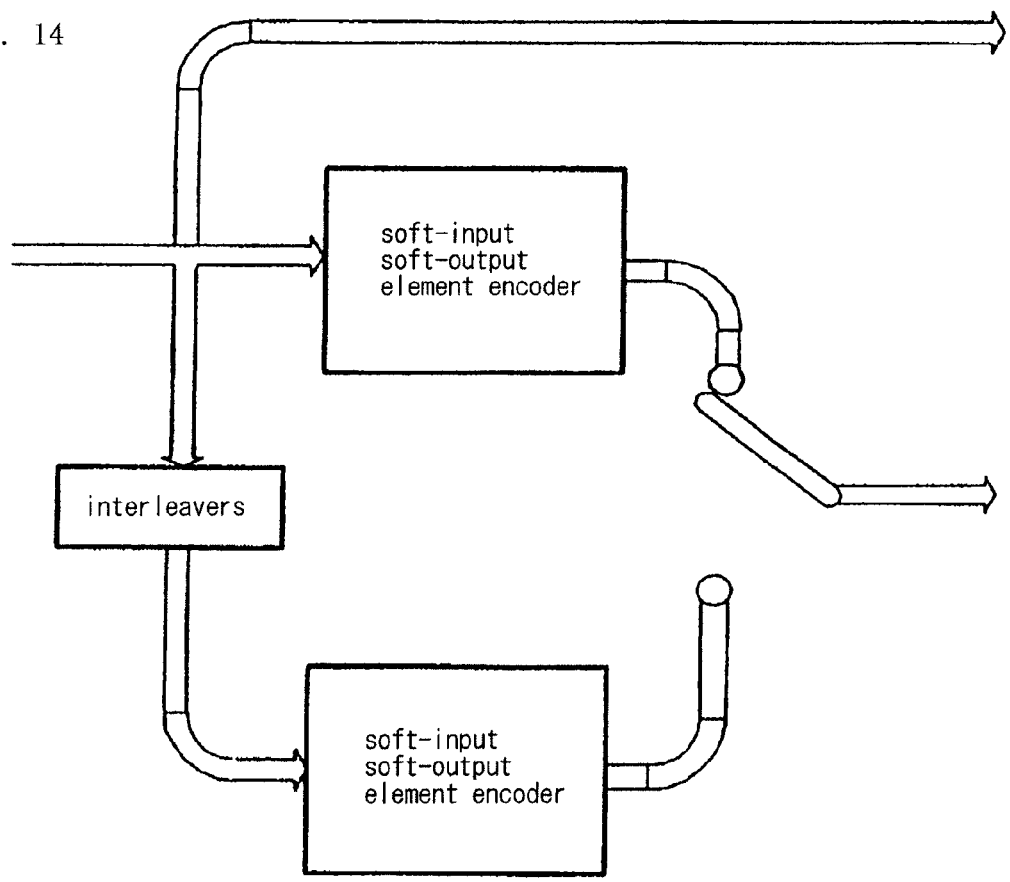
FIG. 14 shows an example of the configuration of the encoder according to the $21^{st}$ working example of the present invention.

FIG. 14 shows an example of the configuration of an encoder according to the 21$^{st}$ working example of the present invention. In FIG. 14, the same configuration as the above-described encoder shown in FIG. 13 is applied to soft determination data.

Figure 15:
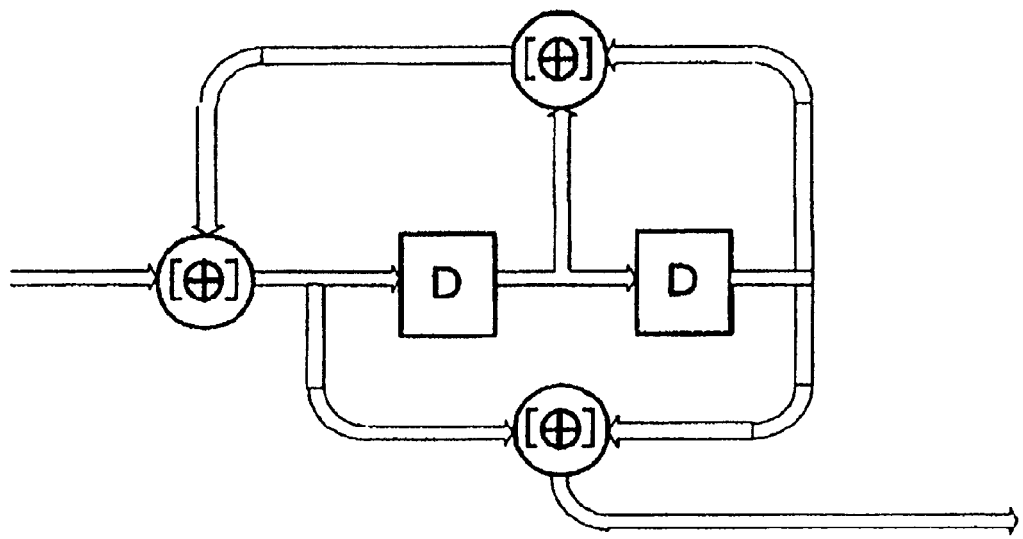
FIG. 15 shows the content of the soft-input soft-output element encoder used in FIG. 14.

FIG. 15 shows the content of the soft-input soft-output element encoder that is used in FIG. 14. The configuration of this soft-input soft-output element encoder is the same as that of the encoder used on the transmission side shown in FIG. 13, but the signal employed is soft determination data of a plurality of bits and is executed by LLR by means of an adder that takes 2 as modulo.

Explanation next regards the calculation method when executing additions by LLR, these additions taking 2 as modulo. In this case, LLR is defined by the equation:

$$L(d) = \log\left[\frac{P(d = +1)}{P(d = -1)}\right] = \log\left[\frac{P(d = \text{``}0\text{''})}{P(d = \text{``}1\text{''})}\right]$$

$$\text{where}\begin{cases} d = +1 \text{ means logically ``}0\text{''} \\ d = -1 \text{ means logically ``}1\text{''} \end{cases}$$

The following is thus obtained:

$$L(d) = \log\left[\frac{P(d = +1)}{P(d = -1)}\right] = \log\left[\frac{1 - P(d = -1)}{P(d = -1)}\right]$$

$$\therefore P(d = -1) = \frac{1}{e^{L(d)} + 1}$$

As a result:

$$P(d = +1) = 1 - P(d = -1) = 1 - \frac{1}{e^{L(d)} + 1} = \frac{e^{L(d)}}{e^{L(d)} + 1}$$

Based on this relation:

$$L(d_1 \oplus d_2) =$$

$$\log\left[\frac{P(d_1 = +1) \cdot P(d_2 = +1) + \{1 - P(d_1 = +1)\} \cdot \{1 - P(d_2 = +1)\}}{P(d_1 = +1) \cdot P(d_2 = -1) + \{1 - P(d_1 = +1)\} \cdot \{1 - P(d_2 = -1)\}}\right] =$$

-continued $$\log\left[\frac{\left\{\frac{e^{L(d_1)}}{e^{L(d_1)}+1}\right\}\cdot\left\{\frac{e^{L(d_2)}}{e^{L(d_2)}+1}\right\}+\left\{\frac{1}{e^{L(d_1)}+1}\right\}\cdot\left\{\frac{1}{e^{L(d_2)}+1}\right\}}{\left\{\frac{e^{L(d_1)}}{e^{L(d_1)}+1}\right\}\cdot\left\{\frac{1}{e^{L(d_2)}+1}\right\}+\left\{\frac{1}{e^{L(d_1)}+1}\right\}\cdot\left\{\frac{e^{L(d_2)}}{e^{L(d_2)}+1}\right\}}\right] =$$

$$\log\left[\frac{e^{L(d_1)}\cdot e^{L(d_2)}+1}{e^{L(d_1)}+e^{L(d_2)}}\right]$$

$$\therefore e^{L[d_1 \oplus d_2]} = \frac{e^{L(d_1)}\cdot e^{L(d_2)}+1}{e^{L(d_1)}+e^{L(d_2)}}$$

$$\log\left[\frac{(e^{L(d_1)}+1)\cdot(e^{L(d_2)}+1)+(e^{L(d_1)}-1)\cdot(e^{L(d_2)}-1)}{(e^{L(d_1)}+1)\cdot(e^{L(d_2)}+1)-(e^{L(d_1)}-1)\cdot(e^{L(d_2)}-1)}\right]$$

the denominator and numerator are divided by:

$(e^{L(d_1)}+1)\cdot(e^{L(d_2)}+1)$ to obtain:

$$L[d_1 \oplus d_2] = \log\left[\frac{1+\frac{(e^{L(d_1)}-1)(e^{L(d_2)}-1)}{(e^{L(d_1)}+1)(e^{L(d_2)}+1)}}{1-\frac{(e^{L(d_1)}-1)(e^{L(d_2)}-1)}{(e^{L(d_1)}+1)(e^{L(d_2)}+1)}}\right]$$

In this case:

$$\frac{(e^{L(d_j)}-1)}{(e^{L(d_j)}+1)} = \frac{\left(e^{\frac{L(d_j)}{2}} - e^{-\frac{L(d_j)}{2}}\right)}{\left(e^{\frac{L(d_j)}{2}} + e^{-\frac{L(d_j)}{2}}\right)} = \tanh\left(\frac{L(d_j)}{2}\right)$$

and as a result:

$$L[d_1 \oplus d_2] = \log\left[\frac{1+\tanh\left(\frac{L(d_1)}{2}\right)\cdot\tanh\left(\frac{L(d_2)}{2}\right)}{1-\tanh\left(\frac{L(d_1)}{2}\right)\cdot\tanh\left(\frac{L(d_2)}{2}\right)}\right]$$

and further:

$$e^{L[d_1 \oplus d_2]} - e^{L[d_1 \oplus d_2]}\cdot\tanh\left(\frac{L(d_1)}{2}\right)\cdot\tanh\left(\frac{L(d_2)}{2}\right) =$$

$$1 + \tanh\left(\frac{L(d_1)}{2}\right)\cdot\tanh\left(\frac{L(d_2)}{2}\right)$$

As a result, rearrangement yields:

$$\tanh\left(\frac{L(d_1)}{2}\right)\cdot\tanh\left(\frac{L(d_2)}{2}\right) = \frac{e^{L[d_1 \oplus d_2]}-1}{e^{L[d_1 \oplus d_2]}+1}$$

$$= \frac{e^{\frac{L[d_1 \oplus d_2]}{2}} - e^{-\frac{L[d_1 \oplus d_2]}{2}}}{e^{\frac{L[d_1 \oplus d_2]}{2}} + e^{-\frac{L[d_1 \oplus d_2]}{2}}}$$

$$= \tanh\left(\frac{L[d_1 \oplus d_2]}{2}\right)$$

As a result of the relation:

$$L[d_1 \oplus d_2] = 2\cdot\tanh^{-1}\left(\tanh\left(\frac{L(d_1)}{2}\right)\cdot\tanh\left(\frac{L(d_2)}{2}\right)\right)$$

rewriting yields:

$$LLR = 2\cdot\tanh^{-1}\left[\tanh\left(\frac{LLR_1}{2}\right)\cdot\tanh\left(\frac{LLR_2}{2}\right)\right]$$

As a result, addition that takes 2 as modulo can be realized by LLR.

Although this operation may be implemented using a table, but can also be calculated using approximation as follows:

$$L[d_1 \oplus d_2] = \log\left[\frac{e^{L(d_1)}\cdot e^{L(d_2)}+1}{e^{L(d_1)}+e^{L(d_2)}}\right]$$

$$\approx \text{sign}[L(d_1)]\cdot\text{sign}[L(d_2)]\cdot\min[|L(d_1)|, |L(d_2)|]$$

Figure 16:
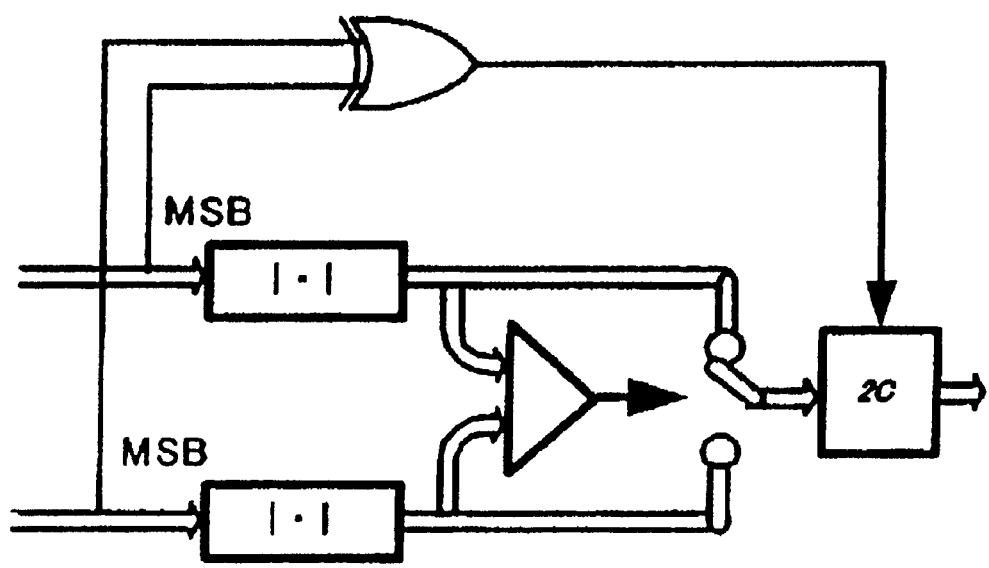
FIG. 16 shows an approximation circuit for executing addition by LLR that takes as modulo 2 that is used in the soft-input soft-output element encoder.

Alternatively, rewriting yields:

$LLR \approx \text{sign}[LLR_1]\cdot\text{sign}[LLR_2]\cdot\min[|LLR_1|,|LLR_2|]$ In other words, the operation can be carried out based on a comparison of the two logarithmic likelihood ratios $LLR_1$ and $LLR_2$ using absolute values of the two LLR, selecting the LLR having the lower value, and adding the polarization of the selection result by addition that takes 2 as modulo to the MSB (Most Significant Bits) of the two logarithmic likelihood ratios $LLR_1$ and $LLR_2$. FIG. 16 shows an example of the configuration of the actual circuit.

Although the foregoing explanation relates to a reception-side soft-input soft-output element encoder, which is the 21$^{st}$ working example of the present invention, for a case in which the encoder used on the transmission side shown in FIG. 13 as a specific example is of a configuration for parallel connection realized by recursive systematic convolution that is used in turbo code; it will be clear that the present invention is not limited to this turbo code and can also be similarly used in, for example, LDPC (Low Density Parity Check).

Figure 17:
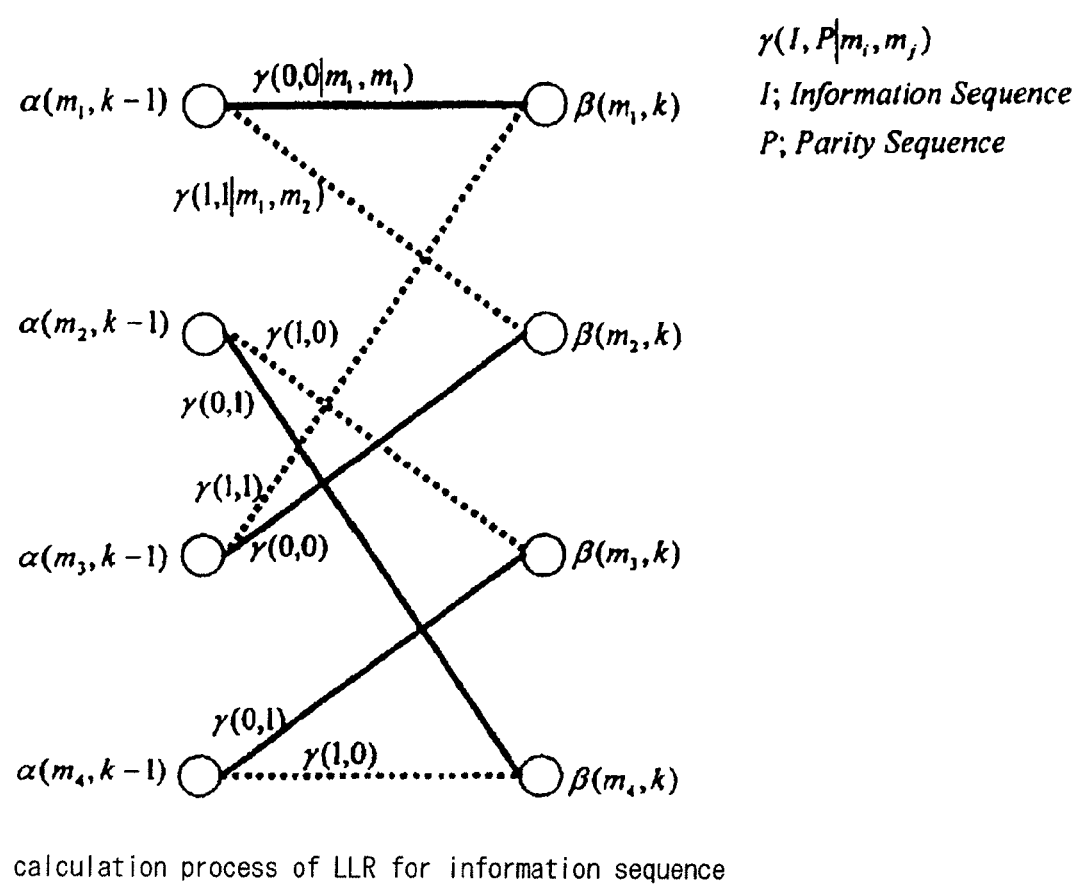
FIG. 17 is a trellis line figure showing the process of calculating LLR for information sequence (I) before encoding in normal turbo decoding.

Explanation next regards the method of calculating LLR for a code word sequence that is normally implemented to clarify the meaning of the soft-input soft-output encoder of the present invention. FIG. 17 is a trellis line chart showing the calculation process of LLR for information sequence (I) before encoding in normal turbo decoding. LLR (I) for the information sequence in FIG. 17 is calculated as follows:

$$LLR(I) = \left[\bigoplus_{(m_i,m_j)\in(I=0)}\{\alpha(m_i,k-1)\otimes\gamma(I,P\mid m_i,m_j)\otimes\beta(m_j,k)\}\right] - \left[\bigoplus_{(m_i,m_j)\in(I=1)}\{\alpha(m_i,k-1)\otimes\gamma(I,P\mid m_i,m_j)\otimes\beta(m_j,k)\}\right]$$

The points in the above equation that correspond to the condition equation:

$(m_i, m_j)\epsilon(I=0)$ are shown by solid lines in FIG. 17, and the points that correspond to the condition equation:

$(m_i, m_j)\epsilon(I=1)$ are shown by the dotted lines in FIG. 17.

Figure 18:
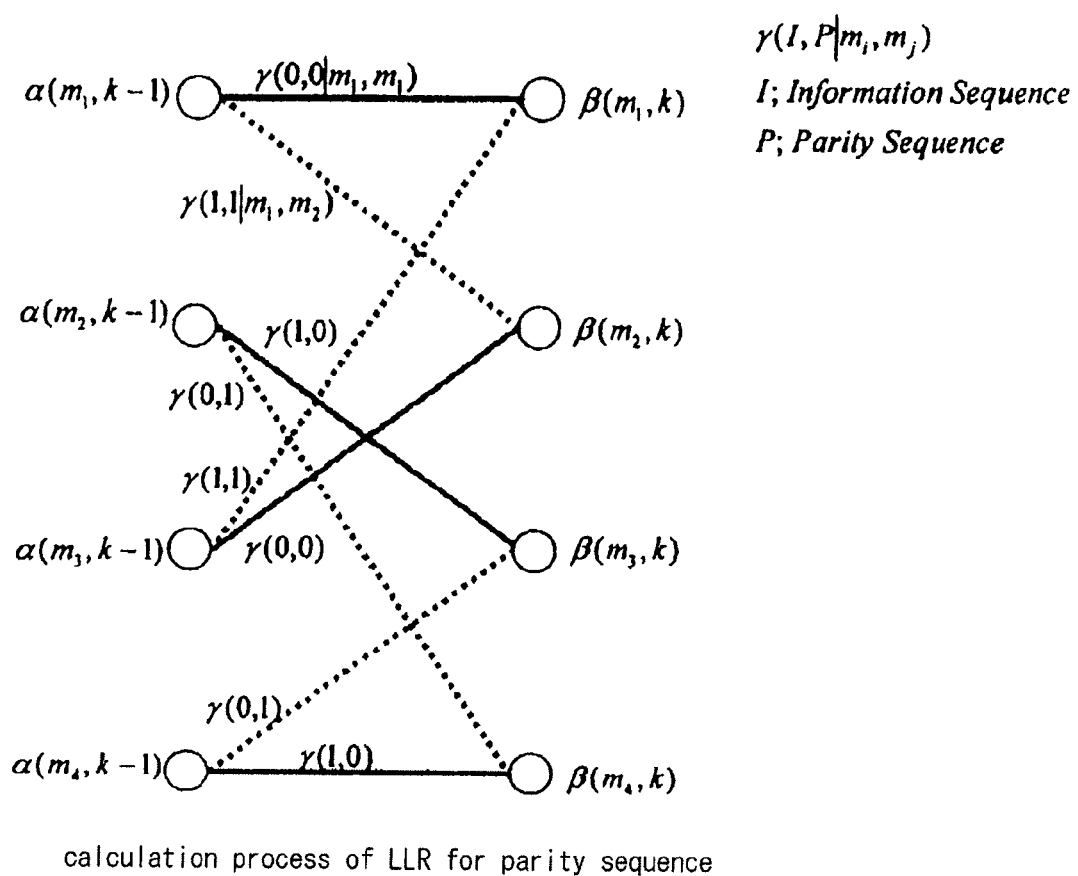
FIG. 18 is a trellis line figure showing the process of calculating LLR for parity sequence (P) following encoding in turbo decoding.

FIG. 18 is a trellis line chart showing the process of calculation of LLR for parity sequence (P) following encoding. In FIG. 18, LLR(P) for the parity sequence is calculated as follows:

$$LLR(P) = \left[ \bigoplus_{(m_i,m_j)\in(P=0)} \left\{ \begin{array}{c} \alpha(m_i, k-1) \otimes \\ \gamma(I, P|m_i, m_j) \otimes \\ \beta(m_j, k) \end{array} \right\} \right] - \left[ \begin{array}{c} \bigoplus_{(m_i,m_j)\in(P=1)} \\ \left\{ \begin{array}{c} \alpha(m_i, k-1) \otimes \\ \gamma(I, P|m_i, m_j) \otimes \\ \beta(m_j, k) \end{array} \right\} \end{array} \right]$$

The points in the above equation that correspond to the condition equation:

$(m_i, m_j) \in (P=0)$ are shown be solid lines in FIG. 18, and the points that correspond to the condition equation:

$(m_i, m_j) \in (P=1)$ are shown by dotted lines in FIG. 18.

When the above operation by means of semi-rings is carried out by semi-rings in the log domain, LLR is a logical value. Although calculation by semi-rings in the Max-Log domain only produces an approximation, this process involves a small amount of calculation. LLR(I) and LLR(P) that have been obtained in this way are the LLR of a code word sequence after encoding.

Nevertheless, the calculation based on these trellis line charts is carried out in core blocks in which transition probability propagation on a trellis is operated in a soft-input soft-output decoder. Accordingly, an already produced core block must inevitably be altered to add functions.

When semi-rings of the Max-Log domain are used, the LLR values tend to be higher than the Log domain. However, although not specially shown in the figure, the extrinsic information is weighted and returned to original form for a priori input to the next stage. At this time, due to the ease of implementation, weighting is realized by shift addition.

The weighting that is carried out in the case of the present invention is ½+¼=0.75. Because ½ can be carried out by a 1-bit shift and ¼ can be carried out by a 2-bit shift, weighting can be realized without using a multiplier.

In the foregoing explanation, the explanation omitted a priori to avoid complex equations. In operations on semi-rings, a priori is added to the metrics of target bits in the form of products. The operations on semi-rings are described with a priori included in each metric, particularly when there are no provisos.

Thus, the present invention is directed toward obtaining the maximum effect by means of the minimum necessary number of samples in a spatial-multiplexed signal detection method through the use of the above-described spatial-multiplexed signal detection method and spatial and temporal iterative decoder. The small number of samples enables a corresponding decrease in the degree of complexity of the next stage that has been divided into groups according to conditional probabilities.

In this case, even when the number of samples is limited as described above, the maximum conditional probabilities for target bits and the maximum conditional probabilities for the exclusive events of the target bits are subjected to metric-base operations, and LLR that accords with log likelihood algebra can therefore be provided as the soft determination output. In other words, when a soft-input soft-output detector for performing spatial-multiplexed signal separation and a soft-input soft-output decoder such as a turbo decoder or LDPC are connected, the transfer of extrinsic information can be realized, but the provision of correct LLR that is the basis of this extrinsic information improves the characteristics of a spatial and temporal iterative decoder that is based on the turbo principle.

Essentially, the present invention can realize higher performance that approaches MLD, which is optimum detection, at a lower degree of complexity by employing a metric operation method that uses semi-rings in the estimation of transmission sequences for maximizing likelihood in a soft-input soft-output detector in spatial-multiplexed signal separation.

Further, in the present invention, as the metric operation method that uses semi-rings that are used for estimating transmission sequences for maximizing likelihood, when operations for the maximum value of sums (MAX) and normal addition for products are carried out as:

$a \oplus b = \max\{a,b\}$ $a \otimes b = a+b$ (semi-rings in Max-Log domain), the soft determination output of target bits can be represented as the sum total of: the metric-base difference between maximum conditional probabilities that contain target bits for maximum conditional probability events in the preceding stage and the maximum conditional probabilities that contain the exclusive events of these target bits among each of the groups of conditional probabilities that have been divided into a plurality of groups, and the metric-base difference between similar maximum conditional probabilities that follow; and as a result, a configuration can be realized with a lower degree of complexity even when the number of antennas is increased to cope with the necessary system throughput. Alternatively, even when a plurality of events (transmission sequence) that have been estimated in advance by simplified estimation are used as conditions, the soft determination output of the target bits can be represented as the sum total of the metric-base difference between conditional probabilities that contain target bits and conditional probabilities that contain the exclusive events of these target bits based on these conditions and the metric-base difference between conditional probabilities that follow.

In the present invention, moreover, when connecting the soft-input soft-output detector in spatial-multiplexed signal detection and a soft-input soft-output decoder such as a turbo decoder or LDPC, the transfer of extrinsic information is carried out, but in a soft-input soft-output decoder equivalent to a decoder for outside code that is carried out in the prior art, the present invention effectively realizes an improvement in the characteristics by means of the number of iterations based on the turbo principle, and further, solves the problem of the prior art that, due to the difficulty of extracting extrinsic information, extrinsic information that still contains intrinsic information was used as is, or that only a portion of the extrinsic information was used.

In the present invention, moreover, when an already manufactured soft-input soft-output decoder is used, logarithmic likelihood ratios are supplied as output for information bit sequences, and LLR are frequently not supplied for code words (symbol sequences).

On the other hand, a soft-input soft-output detector operates whenever practicable as MLD detection for code words, and extrinsic information is necessary for the codewords as extrinsic information from a soft-input soft-output decoder to a soft-input soft-output detector. As a result, the location of operations upon transition probability propagation on a trellis in the soft-input soft-output decoder must be altered, raising the problem of the necessity for altering already manufactured core blocks. In response to this problem, the present invention employs a spatial and temporal iterative decoder that uses a soft-input soft-output encoder, whereby spatial and temporal iterative decoding can be realized based on the turbo principle without altering already manufactured core blocks.

Summarizing the foregoing explanation, in the present invention, for the purpose of lowering the degree of complexity and improving characteristics, conditional probability in a soft-input soft-output detector for spatial-multiplexed signal separation can be divided into groups in the form of the product of a plurality of conditional probabilities, and processing can be ordered among each group. As a result, the degree of complexity can be reduced and, by arranging the order among the groups in the order of higher conditional probability, a lower degree of complexity and improved characteristics can be achieved (factorization and ordering).

In addition, in the present invention: the lower degree of complexity that is achieved by means of metric operation method that employs semi-rings for estimating a transmission sequence; the detection of maximum conditional probabilities in groups in which there are target bits that take into consideration maximum events up to the preceding stage as the semi-rings in the Max-Log domain; and, taking the metric-base difference of the maximum conditional probabilities for succeeding stages as well as the maximum conditional probabilities that contain exclusive events of the target bits and then taking the sum totals of the differences of each stage; the LLR operation can thus be calculated in metric base, whereby an LLR that accords with log likelihood algebra can be provided as the soft determination output.

What is claimed is:

1. A spatial-multiplexed signal detection method wherein, in a soft-input soft-output detection method in spatial and temporal multiplexed signal separation, a process (factorization) is included for implementing factorization of conditional probability referred to as "likelihood" that is obtained for a signal sequence that is received when a spatial-multiplexed transmission sequence is assumed to have been transmitted such that the conditional probability can be represented as the product of a plurality of conditional probabilities; the conditional probabilities for which factorization is possible are divided into a plurality of groups; when calculating the likelihoods, an ordering can be established among said groups for which probabilities are calculated such that the groups that include events that are the conditions of the conditional probabilities in said groups are processed earlier; and when calculating probabilities in the groups, a metric operation method is used that uses semi-rings for estimating transmission sequences by means of the ratio of the likelihoods of two exclusive events.

2. A spatial-multiplexed signal detection method according to claim 1, wherein in the process (factorization) for implementing factorization that allows representation by the product of said plurality of conditional probabilities and in the process for dividing said conditional probabilities for which factorization is possible into a plurality of groups, a process (ordering) is included for the simplified estimation of conditional probabilities of groups that contain events that are the conditions of the conditional probabilities of each group, wherein, by means of the simplified estimation process, groups are divided to produce an ordering among said groups to enable processing in the order of higher conditional probabilities of each group.

3. A spatial-multiplexed signal detection method according to claim 1, wherein QR decomposition is used as the process of factorization that allows representation by the product of said plurality of conditional probabilities.

4. A spatial-multiplexed signal detection method according to claim 1, wherein block triangularization decomposition is used as the process of factorization that allows representation by the product of said plurality of conditional probabilities.

5. A spatial-multiplexed signal detection method according to claim 1, wherein a tridiagonal method is used as the process of factorization that allows representation by the product of said plurality of conditional probabilities.

6. A spatial-multiplexed signal detection method according to claim 1, wherein the metric operation method that uses semi-rings for estimating transmission sequences by means of the ratio of likelihoods of said two exclusive events uses semi-rings in the Max-Log domain as said semi-rings, and the maximum value operation (MAX) of sums and the normal addition of products are carried out as follows:

$$a \oplus b \equiv \max\{a, b\}$$
$$a \otimes b \equiv a + b.$$

7. A spatial-multiplexed signal detection method according to claim 1, wherein the metric operation method that uses semi-rings for estimating transmission sequences by means of the ratio of likelihood of said two exclusive events uses semi-rings in the Log domain as said semi-rings, and the operation based on Jacobian logarithms of sums and the normal addition of products are carried out according to:

$$\begin{cases} a \oplus b \equiv \ln(e^a + e^b) \\ a \otimes b \equiv a + b \end{cases}$$

wherein:

$$\begin{cases} a \oplus b \equiv \ln(e^a + e^b) = \max\{a, b\} + \ln(1 + e^{-|a-b|}) \\ \qquad\qquad = \max\{a, b\} + f(|a-b|) \end{cases}.$$

8. A spatial-multiplexed signal detection method wherein, in a soft-input soft-output detection method in spatial and temporal multiplexed signal separation: a process (factorization) is included for implementing the factorization of a conditional probability referred to as "likelihood" that is obtained for a signal sequence that is received when a spatial-multiplexed transmission sequence is assumed to have been transmitted such that the conditional probability can be represented as the product of a plurality of conditional probabilities; the conditional probabilities for which factorization is possible are divided into a plurality of groups; when calculating the likelihoods, an ordering can be established among said groups for which probabilities are calculated such that said groups that include events that are the conditions of the conditional probabilities in said groups are processed earlier; when calculating conditional probabilities in each group: either a transmission sequence that indicates the maximum conditional probability in said group that contains an event that is the condition of the conditional probability in its own group is calculated as the condition of the conditional probability, or a plurality of calculations are carried out of a plurality of events (transmission sequence) that have been estimated in advance by simplified estimation as conditions; and a process is included for calculating, based on a transmission sequence that indicates the maximum conditional probability of the preceding stage, the conditional probability in each group in accordance with the ordering among said groups; and wherein the bit likelihood of the transmission sequence, which is the soft determination output, is calculated using semi-rings according to claim 6 using processes of:

(1) in groups in which bits that are targets exist as targets of estimation: detecting, in metric base, target bits and maximum probability events up to the preceding stage, or a plurality of conditional probabilities that take as conditions the plurality of events (transmission sequence) that have been estimated in advance by simplified estimation; and detecting, in a metric base, either exclusive events for the target bits and the maximum probability events up to the preceding stage, or a plurality of conditional probabilities that take as conditions the plurality of events (transmission sequence) that have been estimated in advance by simplified estimation;

(2) in groups of succeeding stages: detecting, in metric base, the maximum probability events of the preceding stage that contains target bits, or the plurality of conditional probabilities that take as conditions the plurality of events (transmission sequence) that have been estimated in advance by simplified estimation; and detecting, in metric base, the maximum probability events of the preceding stage that contains exclusive events for the target bits, or the plurality of conditional probabilities that take as conditions the plurality of events (transmission sequence) that have been estimated in advance by simplified estimation;

(3) similarly, in groups in stages that follow groups in which bits exist that are targets: detecting, in metric base, the maximum probability events up to the preceding stage, or the plurality of conditional probabilities that take as conditions the plurality of events (transmission sequence) that have been estimated in advance by simplified estimation; and detecting, in metric base, the maximum probability events of (1) that contains exclusive events for target bits, or the plurality of events (transmission sequence) that have been estimated in advance by simplified estimation and the maximum probability events up the preceding stage that are detected together with this plurality of events, or the plurality of maximum conditional probabilities that take as conditions the plurality of events (transmission sequence) that have been estimated in advance by simplified estimation;

(4) repeating (3) until the group of the succeeding final stage; and (5) after completing (4), first subjecting to metric-base subtraction: target bits and the maximum probability events up to the preceding stage in said (1); or the plurality of conditional probabilities that take as conditions the plurality of events (transmission sequence) that have been estimated in advance by simplified estimation, the exclusive events for the target bits, and the maximum probability events up to the preceding stage; or the plurality of conditional probabilities that take as conditions the plurality of events (transmission sequence) that have been estimated in advance by simplified estimation; and further, in groups of stages following groups in which bits exist that are the targets of (2) to (4), subjecting to metric-base subtraction:

the maximum probability events up to the preceding stage; or the plurality of conditional probabilities that take as conditions the plurality of events (transmission sequence) that have been estimated in advance by simplified estimation and the maximum probability events up to the preceding stage that contains exclusive events for the target bits; or the plurality of conditional probabilities that take as conditions the plurality of events (transmission sequence) that have been estimated in advance by simplified estimation; and finally, taking the sum total and detecting the logarithmic likelihood ratio of the target bits as the logarithmic likelihood ratio that is the soft determination output of the target bits.

9. A spatial-multiplexed signal detection method wherein, in a soft-input soft-output detection method in spatial and temporal multiplexed signal separation, a process (factorization) is included for implementing factorization of conditional probability referred to as "likelihood" that is obtained for a signal sequence that is received when a spatial-multiplexed transmission sequence is assumed to have been transmitted such that the conditional probability can be represented as the product of a plurality of conditional probabilities; the conditional probabilities for which factorization is possible are divided into a plurality of groups; when calculating the likelihoods, an order can be established among said groups for which probabilities are calculated such that said groups that include events that are the conditions of conditional probabilities in said groups are processed earlier; when calculating conditional probabilities in each group, a process is included for calculating, as the condition of the conditional probability, a transmission sequence that indicates the maximum conditional probability in said group that contains an event that is the condition of the conditional probability in its own group, and for calculating, based on the transmission sequence that indicates the maximum conditional probability of the preceding stage, the conditional probability in each group in accordance with said ordering among the groups; and a metric operation method is used that uses semi-rings for estimating a transmission sequence that maximizes said likelihood; and further, as resampling after completion of processing in the final stage, processes are included for selecting the metric-base maximum likelihood from a set of combinations of said conditional probabilities in which bits that are targets have been calculated as targets of estimation, and moreover, selecting the metric-base maximum likelihood from the set of combinations of said conditional probabilities in which exclusive events for the target bits have been calculated as the targets of estimation; and a process is included for taking the difference between the two metrics as the soft determination output of the target bits.

10. A spatial and temporal iterative decoder in spatial and temporal multiplexed signal separation that includes a soft-input soft-output detector and a soft-input soft-output decoder; wherein:

the soft-input soft-output decoder supplies as output logarithmic likelihood ratios (hereinbelow abbreviated as "LLR") for information bit sequences before encoding;

a soft-input soft-output encoder is included that takes these logarithmic likelihood ratios as input and supplies as output logarithmic likelihood ratios for the code word sequence after encoding; and a priori input of said soft-input soft-output detector is produced based on the output of the soft-input soft-output encoder.

11. A spatial and temporal iterative decoder according to claim 10, wherein, in a spatial and temporal multiplexed signal separation device that is of a configuration composed of a spatial and temporal detection unit and decoding unit, said spatial and temporal detection unit is of a configuration that includes said soft-input soft-output detector and said soft-input soft-output encoder, and said decoding unit contains said soft-input soft-output decoder; wherein the a priori input to said soft-input soft-output decoder acts upon the output of said soft-input soft-output encoder in the form of subtraction to form a priori input to said soft-input soft-output detector; and the a priori input to said soft-input soft-output detection unit acts upon the output of said soft-input soft-output detector in the form of subtraction to form the a priori input to said soft-input soft-output decoder.

12. A spatial and temporal iterative decoder in spatial and temporal multiplexed signal separation that includes a soft-input soft-output detector and a soft-input soft-output decoder, wherein:

said soft-input soft-output decoder supplies as output logarithmic likelihood ratio (hereinbelow abbreviated as "LLR") for information bit sequences before encoding;

a soft-input soft-output encoder is included that takes these logarithmic likelihood ratios as input and supplies as output logarithmic likelihood ratio for codeword sequences after encoding; and soft replica input of said soft-input soft-output detector is produced based on the output of the soft-input soft-output encoder.

13. A spatial and temporal iterative decoder according to claim 10, wherein said soft-input soft-output encoder is a configuration identical to that of the transmission-side encoder for handling soft determination data; and is of a configuration for supplying as output the LLR that holds in a posterior value the addition result [=a1+a2(mod q)] that takes as modulo q for logarithmic likelihood ratio LLR1 for posterior value a1 and logarithmic likelihood ratio LLR2 for posterior value a2 in place of the addition that takes as modulo said q, which is a constituent element.

14. A spatial and temporal iterative decoder according to claim 13, wherein said soft-input soft-output encoder is of a configuration identical to that of the transmission-side encoder for handling soft determination data; and takes the form of a means for supplying as output, in place of addition that takes as the modulo 2, which is a constituent element:

for logarithmic likelihood ratio LLR1 for posterior value a1 and logarithmic likelihood ratio LLR2 for posterior value a2, or takes the form of a means for supplying as output a value that approximates this value.

15. A spatial and temporal iterative decoder according to claim 14, wherein:

said soft-input soft-output encoder is of a configuration identical to that of the transmission-side encoder for handling soft determination data;

that includes means for carrying out, instead of addition that takes as modulo 2, which is a constituent element, a comparison of logarithmic likelihood ratio LLR1 for posterior value a1 and logarithmic likelihood ratio LLR2 for posterior value a2 with the absolute values of these values, and selecting the smaller value;

and that carries out the polarization of the result of this selection based on the result of addition that takes as modulo 2 for the MSB (Most Significant Bits) of logarithmic likelihood ratio LLR1 and logarithmic likelihood ratio LLR2.

16. A spatial and temporal iterative decoder in spatial and temporal multiplexed signal separation having a soft-input soft-output detector and a soft-input soft-output decoder, wherein said soft-input soft-output detector: is a spatial-multiplexed detector that uses semi-rings in the Max-Log domain of claim 6, performs weighting of the logarithmic likelihood ratios for the soft output, and uses the result as a priori input for the next stage.

17. A spatial and temporal iterative decoder according to claim 16, wherein said spatial and temporal iterative decoder uses 0.75 as said weighting.

18. A spatial and temporal iterative decoder according to claim 17, wherein said spatial and temporal iterative decoder realizes said weighting of 0.75 by shift addition.

* * * * *